United States Patent [19]

Okutsu et al.

[11] Patent Number: 5,322,268
[45] Date of Patent: Jun. 21, 1994

[54] METHOD OF AND APPARATUS FOR SUPPLYING PHOTOSENSITIVE LITHOGRAPHIC PRINTING PLATES

[75] Inventors: Hirokazu Okutsu; Naoki Watanabe; Katunori Hakuta, all of Kanagawa, Japan

[73] Assignee: Fuji Photo Film Co., Ltd., Kanagawa, Japan

[21] Appl. No.: 975,483

[22] Filed: Nov. 12, 1992

[30] Foreign Application Priority Data

Nov. 12, 1991 [JP] Japan .................. 3-295879
Nov. 12, 1991 [JP] Japan .................. 3-295883
Mar. 5, 1992 [JP] Japan .................. 4-048808

[51] Int. Cl.$^5$ ............................................ B65H 5/08
[52] U.S. Cl. .................................. 271/11; 271/30.1; 271/93; 271/98; 271/106; 355/312
[58] Field of Search .............. 355/200, 308, 309, 312; 271/90, 93, 105, 106, 11, 30.1, 98

[56] References Cited

U.S. PATENT DOCUMENTS

| | | |
|---|---|---|
| 3,586,314 | 6/1971 | Samoggia . |
| 4,178,097 | 12/1979 | Sara .................. 355/100 |
| 4,334,472 | 6/1982 | Back et al. .................. 101/382 |
| 4,358,195 | 11/1982 | Kuehnle et al. .................. 355/327 |
| 4,402,592 | 9/1983 | Schon et al. .................. 355/312 |
| 4,462,678 | 7/1984 | Back .................. 355/309 |
| 4,521,101 | 6/1985 | Suzuki et al. .................. 355/256 |
| 4,537,496 | 8/1985 | Ohba et al. .................. 355/256 X |
| 4,556,309 | 12/1985 | Weber et al. .................. 355/271 |
| 4,848,764 | 7/1989 | Tajima et al. .................. 271/90 |
| 5,152,521 | 10/1992 | Itakura .................. 271/106 X |

FOREIGN PATENT DOCUMENTS 2-19952 5/1990 Japan .
2-23861 5/1990 Japan .

Primary Examiner—Fred L. Braun
Attorney, Agent, or Firm—Sughrue, Mion, Zinn, Macpeak & Seas

[57] ABSTRACT

A photosensitive lithographic printing plate supplying apparatus includes a first suction device, which sucks an upper surface of an uppermost photosensitive lithographic printing plate of photosensitive lithographic printing plates stacked such that respective photosensitive surfaces thereof face downward and which raises the uppermost photosensitive lithographic printing plate, a second suction device, which sucks the upper surface of the raised uppermost photosensitive lithographic printing plate so as to support the photosensitive lithographic printing plate at one end thereof, and a rotating device which rotates the photosensitive lithographic printing plate supported on one end by the second suction device so that a photosensitive surface of the photosensitive lithographic printing plate faces upward. Accordingly, the photosensitive lithographic printing plates are supplied to an exposure device without the photosensitive surfaces thereof being contacted.

18 Claims, 32 Drawing Sheets

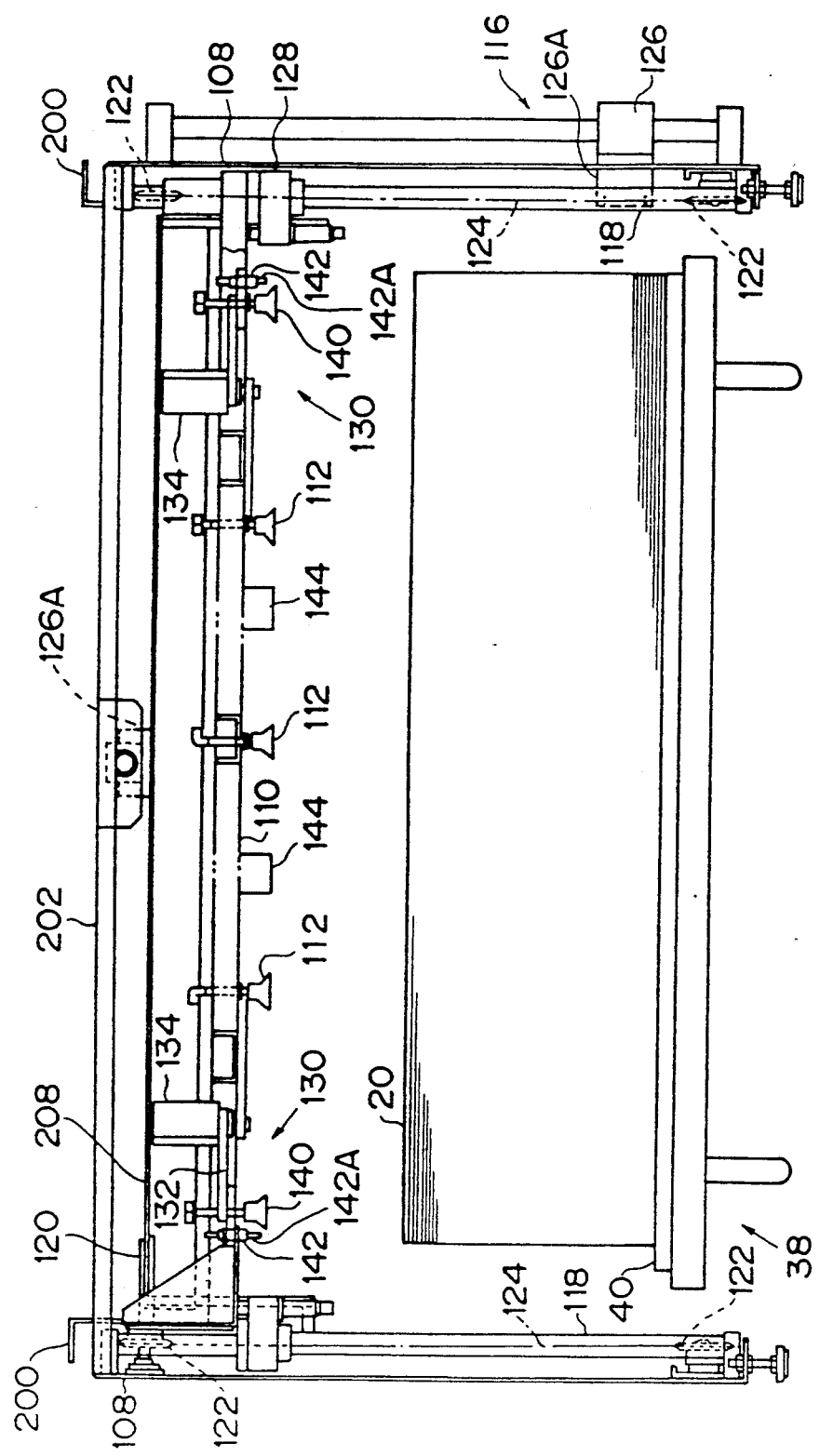

METHOD OF AND APPARATUS FOR SUPPLYING PHOTOSENSITIVE LITHOGRAPHIC PRINTING PLATES

BACKGROUND OF THE INVENTION

1. Field of the Invention

The present invention relates to a method of and an apparatus for supplying photosensitive lithographic printing plates to an exposure device which exposes the photosensitive lithographic printing plates.

2. Background Information

For photosensitive lithographic printing plates (hereinafter, "printing plates") used in an offset rotary press for newspapers, there is a direct reproduction recording system using an OPC (organic photo conductor) photosensitive material. The OPC photosensitive material is formed by an organic photo-semiconductor being applied to a conductive supporting body such as aluminum or the like, so as to form a photoconductive photosensitive layer. In this type of a direct plate manufacturing system, the photosensitive layer is charged before exposure. As a result, after exposure, when the photosensitive layer contacts a conductive member, such as metal or the like, the electrostatic image formed by exposure is disturbed. Therefore, great care must be taken in handling the OPC photosensitive material.

Generally, a plurality of printing plates are stored or transported in a state in which they are stacked on a holding stand. When the printing plates are supplied to an exposure device, they are loaded together with the holding stand onto a supplying device which is provided adjacent to the exposure device. The printing plates stacked on the holding stand are supplied by the supplying device to the exposure device successively from the topmost plate.

A surface plate is provided in the exposure device. The printing plate is placed on the surface plate such that the photosensitive surface of the printing plate faces upward. The printing plate positioned on the surface plate is electrostatically charged, and is exposed by a laser beam or the like which is modulated in accordance with an original image. An electrostatic latent image is thereby formed. The printing plate on which the electrostatic image has been formed is removed from the surface plate and is conveyed into a developing portion.

In order to load the printing plate by the supplying device on the surface plate such that the photosensitive surface of the printing plate faces upward, the printing plates have been set in advance on the holding stand with their photosensitive surfaces facing upward. These printing plates are usually transported from the holding stand to the exposure station one by one with the upper surface thereof being sucked by suction cups or by nip rollers. Examples are illustrated in Japanese Patent Unexamined Publication No. 2-23861 and Japanese Patent Unexamined Publication No. 2-19952.

However, when the printing plates, especially the OPC photosensitive materials, are sucked by the suction cups or contact the rollers, traces of the suction cups or rollers remain on the printing plates even after exposure. A drawbacks arises in that this effects the image formed on the photosensitive surface of the printing plate.

SUMMARY OF THE INVENTION

The first aspect of the present invention is a method of supplying photosensitive lithographic printing plates for supplying unexposed photosensitive lithographic printing plates to an exposure device, comprising the steps of: (a) sucking an uppermost photosensitive lithographic printing plate at its upper surface from a stack of the photosensitive lithographic printing plates which are stacked such that respective photosensitive surfaces thereof face downward; (b) raising the sucked photosensitive lithographic printing plate; and (c) rotating the photosensitive lithographic printing plate so that the photosensitive surface thereof faces upward.

According to this aspect of the present invention, the upper surface of an uppermost photosensitive lithographic printing plate of a stack of photosensitive lithographic printing plates, which are stacked so that the respective photosensitive surfaces thereof face upward, is sucked (i.e., the surface opposite to the photosensitive surface is sucked and raised). The photosensitive lithographic printing plate is rotated so that the photosensitive surface thereof faces upward. Accordingly, the photosensitive lithographic printing plate is supplied to the exposure device with the photosensitive surface thereof facing upward without the photosensitive surface being contacted.

The photosensitive lithographic printing plates are stacked so that the surfaces opposite the photosensitive surfaces face upward. Further, the photosensitive lithographic printing plates may be stacked, for example, horizontally or at an incline.

The second aspect of the present invention is a photosensitive lithographic printing plate supplying apparatus, comprising first suction means, disposed above a holding stand on which the photosensitive lithographic printing plates are stacked with photosensitive surfaces thereof facing downward, for sucking an upper surface of the photosensitive lithographic printing plate which the first suction means opposes and raising the photosensitive lithographic printing plate; second suction means for sucking the upper surface of the photosensitive lithographic printing plate raised by the first suction means, so as to support the photosensitive lithographic printing plate at one end thereof, and for receiving the photosensitive lithographic printing plate from the first suction means while holding said photosensitive lithographic printing plate raised; and reversing means for rotating the photosensitive lithographic printing plate so that the photosensitive surface thereof faces upward.

According to the present aspect, with the photosensitive surface facing downward, the surface opposite to the photosensitive surface is sucked and held by the first suction means. Next, the photosensitive lithographic printing plate is sucked by the second suction means and transferred thereto from the first suction means. The second suction means holds the photosensitive lithographic printing plate at one end thereof, and the photosensitive lithographic printing plate is reversed by rotating the second suction means. As a result, the rear surface of the photosensitive lithographic printing plate, i.e., the surface opposite to the photosensitive surface, can be supported, and the photosensitive lithographic printing plate can be easily transferred and conveyed without the photosensitive surface thereof being contacted.

The third aspect of the present invention is a printing plate conveying device comprising: a lift stand on which a photosensitive lithographic printing plate is loaded such that a photosensitive surface thereof faces upward; a supporting means which is provided out of locus of the photosensitive lithographic printing plate when lifted by the lift stand and which is movable under the photosensitive lithographic printing plate which is lifted by the lift stand, the supporting means engaging end portions of the photosensitive material, such that the photosensitive lithographic printing plate is horizontally supported, due to relative movement between the supporting means and the lift stand when the supporting means is positioned under the photosensitive lithographic printing plate; operating means for moving the supporting means under the photosensitive lithographic printing plate; and moving means for moving the supporting means horizontally while the photosensitive lithographic printing plate is supported by the supporting means, in order to send the photosensitive lithographic printing plate to an exposure portion.

This aspect of the present invention is provided with a supporting means and an operating means which operates the supporting means. The portions of the supporting means are inserted under the photosensitive lithographic printing plate which is loaded on the lift stand with the photosensitive surface thereof facing upward. With the portions of the supporting means positioned under the photosensitive lithographic printing plate, by lowering the lift stand or by raising the supporting means, the bottom surfaces of the end portions of the photosensitive lithographic printing plate are supported by the supporting means while the photosensitive surface faces upward. Moreover, a moving means is provided in the present aspect. The moving means moves the photosensitive lithographic printing plate horizontally by the supporting means. Accordingly, in the printing plate conveying device, the photosensitive lithographic printing plate can be conveyed without contacting the upper surface thereof, i.e., the photosensitive surface.

When the photosensitive lithographic printing plate is conveyed to the exposure device and loaded on a surface plate of the exposure device, the supporting means may be withdrawn to the outer sides of the photosensitive lithographic printing plate. In this way, the supporting of the photosensitive lithographic printing plate by the supporting means is canceled, and the photosensitive lithographic printing plate is loaded onto the surface plate.

In the above-described third aspect, the supporting means may be structured so as to include claw portions protruding horizontally, ends of the claw portions being moved under the photosensitive lithographic printing plate by operation of the operating means and supporting the photosensitive lithographic printing plate.

The claw portion can have a simple structure formed as, for example, a substantial L-shape. The end portion of each claw portion can be inserted under the photosensitive lithographic printing plate by, for example, the operation of an air cylinder serving as an operating means and provided above the end portion. The end portions of the claw portions can support the bottom surfaces of end portions of the photosensitive lithographic printing plate.

Further, in the third aspect, the supporting means may be structured so as to include a regulating member abuttable on an end surface of the photosensitive lithographic printing plate, the regulating member regulating movement of the photosensitive lithographic printing plate supported by the claw portions.

The photosensitive lithographic printing plate is supported by the supporting means, and the regulating member is made to abut the end surface of the photosensitive lithographic printing plate. In this way, the photosensitive lithographic printing plate supported by the supporting means does not slip out of place and drop down while being conveyed. Further, by withdrawing the supporting means from under the photosensitive lithographic printing plate while the end surface thereof is abutted against the regulating member, the photosensitive lithographic printing plate is loaded at a predetermined position on the surface plate without being shifted when the supporting means is withdrawn.

The photosensitive lithographic printing plate can include a photoconductive, photosensitive layer and a conductive supporting base. In this case, in the printing plate conveying device of the present aspect, the photosensitive surface faces upward, and the bottom surfaces of the end portions of the photosensitive lithographic printing plate are supported by the supporting means. When the regulating member is provided, the regulating member abuts the end surface of the photosensitive lithographic printing plate. As a result, the printing plate conveying device conveys the photosensitive lithographic printing plate without contacting the photosensitive surface thereof, and traces of contact are not left on the photosensitive surface by suction cups, rollers, and the like.

The fourth aspect of the present invention is a photosensitive lithographic printing plate reversing device comprising: supporting means for supporting one side end of a photosensitive lithographic printing plate whose photosensitive surface faces downward; rotating means for rotating the supporting means and the photosensitive lithographic printing plate, one side end of which is supported by the supporting means, around a vicinity of the one side end; a lift stand able to be raised and lowered so as to pass through a range of movement of the photosensitive lithographic printing plate when the supporting means and the photosensitive lithographic printing plate are rotated around the vicinity of the one side end; driving means for raising and lowering the lift stand; detecting means for detecting whether the lift stand has reached a predetermined height; and control means for controlling the rotating means to rotate and reverse the photosensitive lithographic printing plate so that the photosensitive surface of the photosensitive lithographic printing plate faces upward, and for controlling the driving means to raise the lift stand from a position beneath the range of movement and controlling the supporting means to cancel the supporting of the photosensitive lithographic printing plate by the supporting means when the detecting means detects that the lift stand has reached a predetermined height.

In the present aspect, with one side end of the photosensitive lithographic printing plate supported by the supporting means, the supporting means and the photosensitive lithographic printing plate are rotated by the rotating means around a vicinity of the one side end and are reversed. The lift stand is raised by the driving means from a position beneath the range of movement of the photosensitive lithographic printing plate. In this way, the photosensitive lithographic printing plate and the supporting means are rotated around the one side end of the photosensitive lithographic printing plate, and, with the photosensitive lithographic printing plate substantially reversed, the other side end of the photosensitive lithographic printing plate contacts and is supported by the lift stand. When the detecting means detects that the lift stand has reached a predetermined height, the supporting of the photosensitive lithographic printing plate is canceled by the control means.

In this way, the photosensitive lithographic printing plate separates from the supporting means such that substantially the entire surface thereof is loaded on the lift stand. If the predetermined height detected by the detection means is a height at which the photosensitive lithographic printing plate is substantially horizontal, even if the speed at which the lift stand is raised is increased in order to smoothly reverse the photosensitive lithographic printing plate, the supporting of the photosensitive lithographic printing plate can be canceled at an appropriate time, i.e., when the photosensitive lithographic printing plate is substantially horizontal. Because there is no shock to the photosensitive printing plate when the supporting thereof is released, the photosensitive lithographic printing plate can be loaded at a substantially constant position on the lift stand.

BRIEF DESCRIPTION OF THE DRAWINGS

FIG. 7 is a side view of main portions of the sucking/raising device.

FIGS. 8A, 8B and 8C are side views of main portions and illustrate respective states of operation of the sucking/raising device, wherein FIG. 8A illustrates a state in which the sucking/raising device contacts stacked printing plates, FIG. 8B illustrates a state in which a lifting portion is operated, and FIG. 8C illustrates a state in which a printing plate is sucked and held by the sucking/raising device.

DESCRIPTION OF THE PREFERRED EMBODIMENT

A summary of a direct printing plate apparatus 10 related to the present embodiment will be described with reference to FIGS. 1 through 3.

A printing plate 20 used in the present embodiment is a rectangular OPC direct printing plate which is formed of a 0.3 mm thick aluminum plate which serves as a conductive supporting body, an anodic oxidized layer which makes one of the surfaces of the aluminum plate a photosensitive surface, and a several micron thick OPC layer which is coated on the top surface of the anodic oxidized layer and whose main component is an OPC alkali soluble polymer. Further, the dimensions of the conductive supporting body, i.e., the dimensions of the printing plate 20, are 398 mm by 1120 mm, which is the size of a printing plate to be used for printing two pages of newspaper. The dimensions of the printing plate 20 may be, for example, 398 mm by 560 mm (the size of one newspaper page). Other dimensions are also applicable.

In each of the figures, the direction of arrow A corresponds to the transverse direction of the printing plate 20. The direction of arrow B corresponds to the longitudinal direction of the printing plate 20. In the direct printing plate apparatus 10, when the printing plate 20 is conveyed to an adjacent processing portion, the printing plate 20 is moved parallel along the transverse direction or the longitudinal direction thereof.

Figure 1:
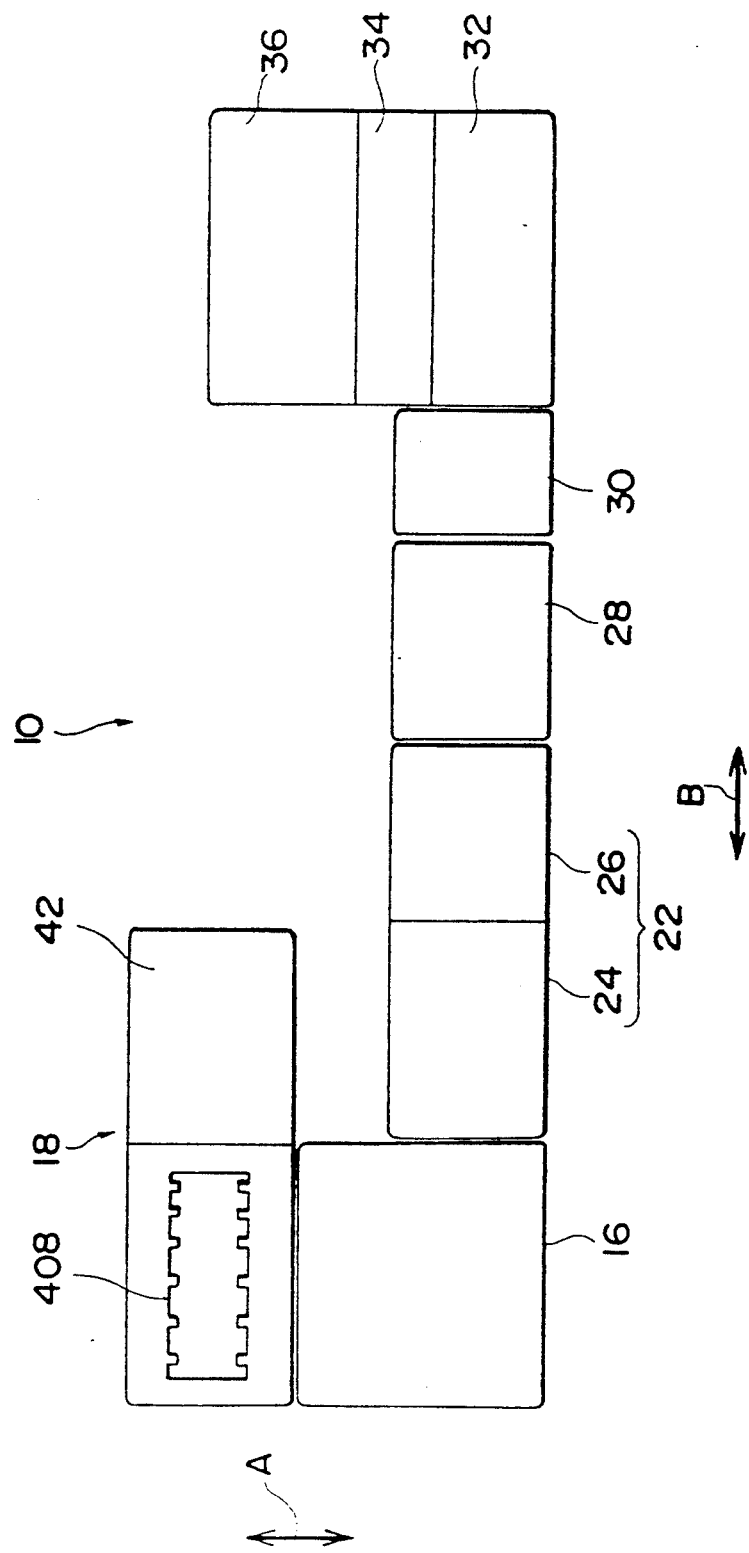
FIG. 1 is a schematic plan view of a direct printing plate apparatus relating to the present embodiment.
Figure 2:
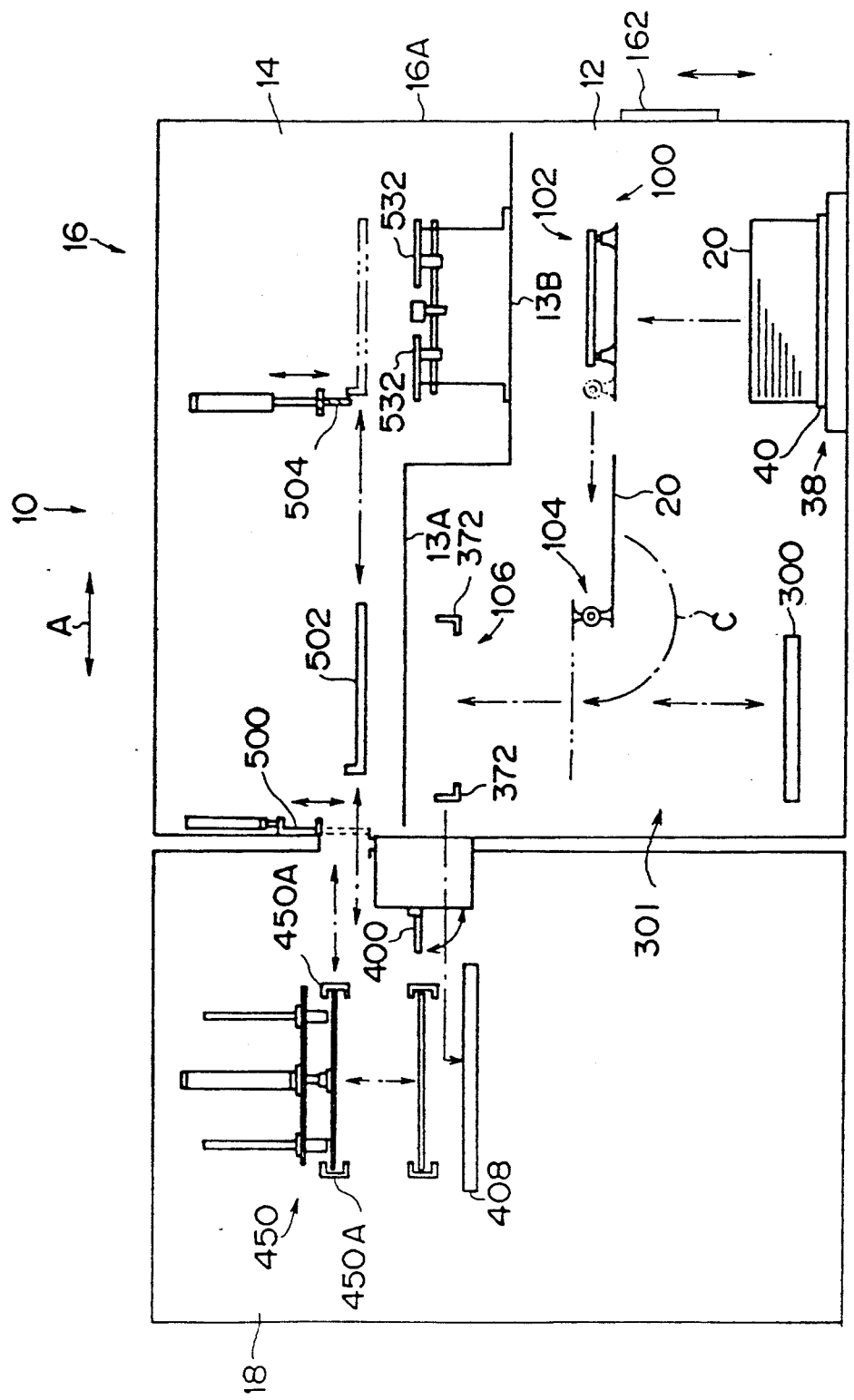
FIG. 2 is a schematic plan view of the direct printing plate apparatus relating to the present embodiment.
Figure 3:
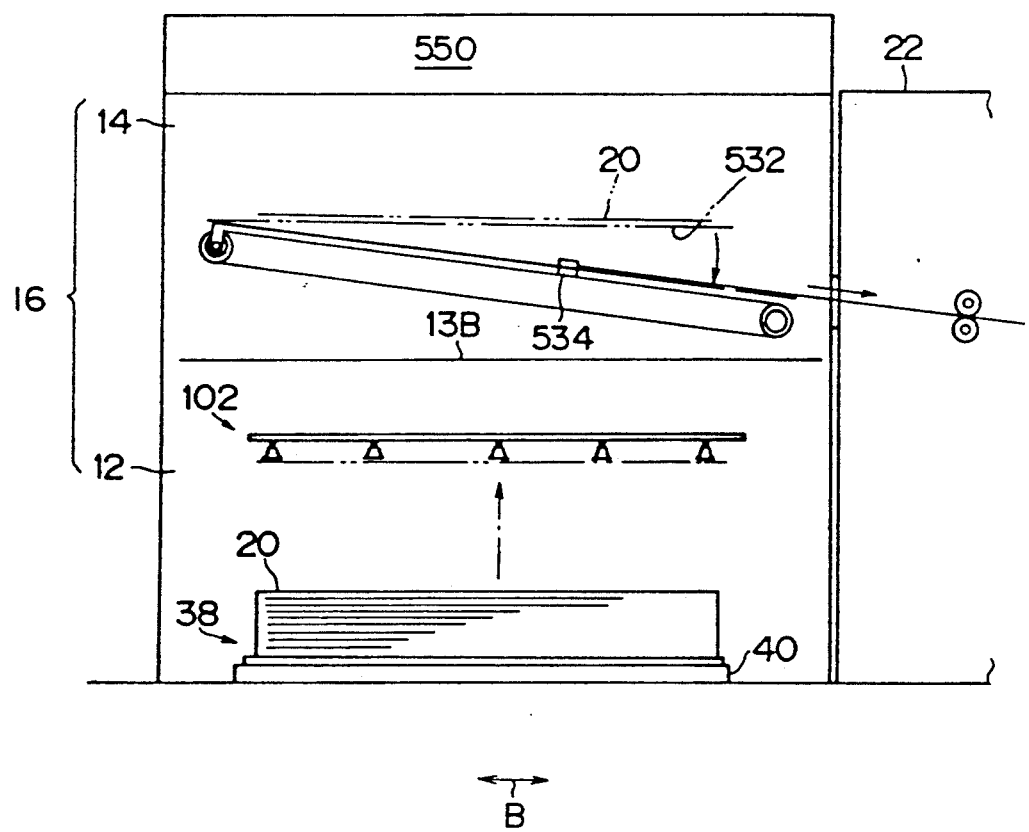
FIG. 3 is a side view of main portions of the direct printing plate apparatus relating to the present embodiment.

As shown in FIGS. 1 through 3, the direct printing plate apparatus 10 is provided with a plate supplying/discharging portion 16 formed of a plate supplying portion 12, which supplies the printing plates 20 to a drawing portion 18 serving as an exposure means, and a plate discharging portion 14 which discharges the printing plates 20 from the drawing portion 18. The plate supplying/discharging portion 16 is divided from the outside by and shaded by a casing 16A (see FIG. 2). The interior of the plate supplying/discharging portion 16 shaded and is divided into three sections by partition walls 13A, 13B. A skid 38 on which the printing plates 20 are stacked is loaded at the plate supplying portion 12. On the skid 38, the printing plates 20 are stacked and loaded on a loading stand 40 which is substantially parallel to the floor. The printing plates 20 are stacked so that the photosensitive surfaces thereof face downward. The printing plates 20 are positioned with respect to the plate supplying portion 12 by loading the skid 38 at a predetermined position in the plate supplying portion 12.

Figure 4:
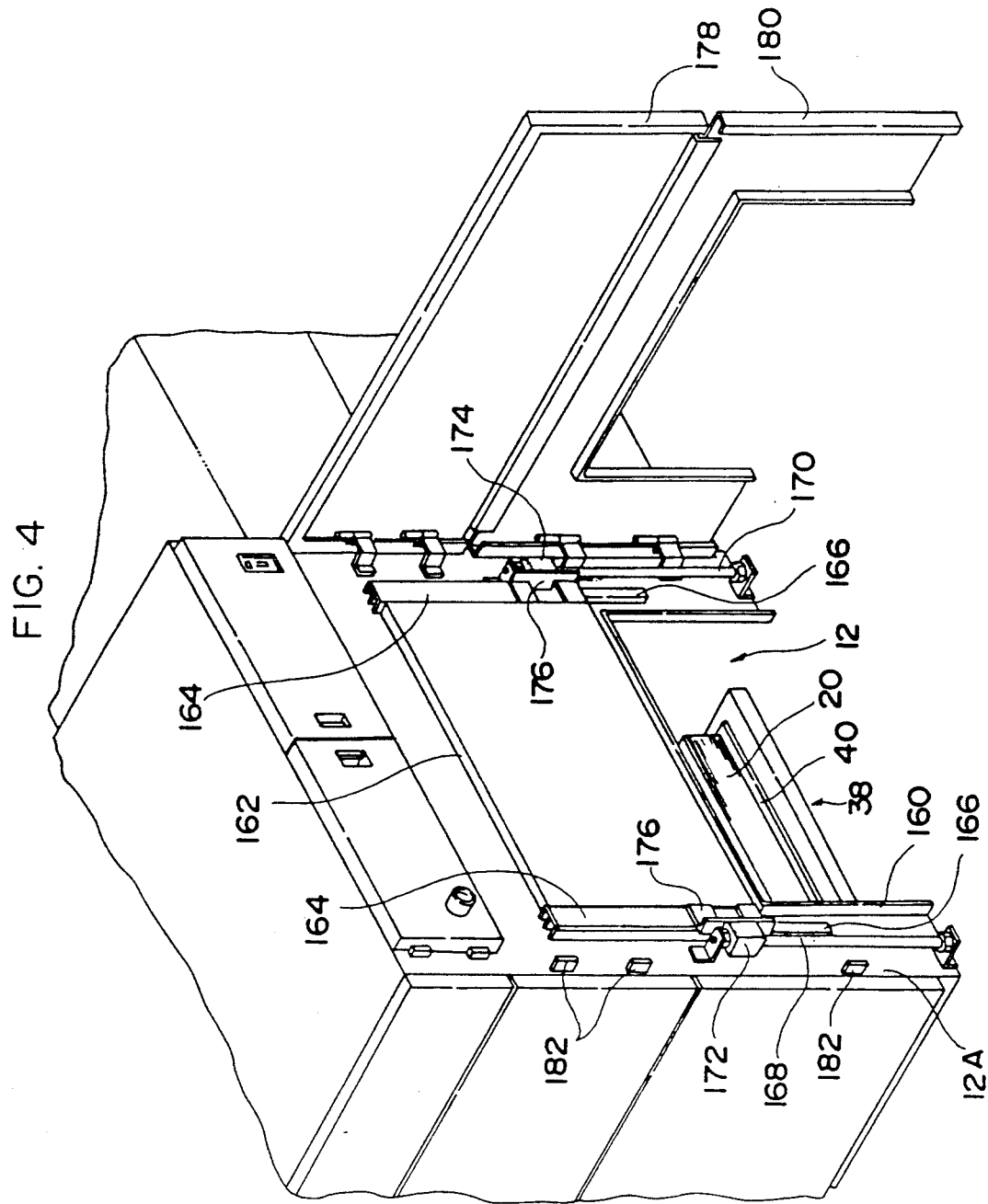
FIG. 4 is a perspective view illustrating a vicinity of a shutter of a plate supplying portion.

As illustrated in FIG. 4, a side of the plate supplying portion 12 is separated from the outside by a side wall 12A. A rectangular opening 160, which communicates the plate supplying portion 12 with the outside, is formed in the side wall 12A. The skid 38 is loaded into the plate supplying portion 12 via the opening 160. The opening 160 is opened and closed by a shutter 162. Brackets 164 are provided respectively at both transverse direction ends of the shutter 162. A pair of guide rails 166 which run vertically is provided at sides of the opening 160 so as to correspond to the brackets 164. The brackets 164 engage with the guide rails 166. Accordingly, the shutter 162 is guided by the guide rails 166 and can be moved in directions of being raised and lowered.

Rodless cylinders 168, 170 are disposed respectively at both side ends of the opening 160 along the vertical direction. Both end portions of the rodless cylinders 168, 170 are fixed to the side wall 12A. Moving blocks 172, 174, which are moved vertically by the driving of the respective rodless cylinders 168, 170, are attached to the rodless cylinders 168, 170, respectively.

The moving blocks 172, 174 are fixed to the side end portions of the shutter 162 via brackets 176. Accordingly, when the rodless cylinders 168, 170 are driven by an air supplying means 190 (see FIG. 11), a moving force is applied to the shutter 162 via the moving blocks 172, 174 so that the shutter 162 is guided by the guide rails 166 and is moved either upward or downward while remaining parallel to the opening 160. When the shutter 162 reaches its uppermost position, the opening 160 is open. When the shutter 162 reaches its lowest position, the opening 160 is closed. Usually, the opening 160 is closed by the shutter 162 and the interior of the plate supplying portion 12 is shaded. When the shutter 162 moves and the opening 160 is opened, the interior and exterior of the plate supplying portion 12 are communicated, and the skid 38 can be removed from and placed into the plate supplying portion 12.

Covers 178, 180 are attached to the side wall 12A so as to be pivotable. Stoppers 182 are provided on the side wall 12A so as to engage with the covers 178, 180. When the stoppers 182 are engaged with the covers 178, 180, the driving mechanism and the like of the shutter 162 are covered by the covers 178, 180.

The loading and removal of the skid 38 from the plate supplying portion 12 is effected through the shutter 162 provided on the casing 16A. Usually, this shutter is closed so that the interior of the plate supplying portion 12 is shaded. The skid 38 may be moved by a forklift or the like, or may be made movable by providing casters or the like on the bottom portion thereof.

A sucking/raising device 102 and a reversing device 104 are provided in the plate supplying portion 12. The upper surface of the printing plate 20 loaded on the skid 38 is sucked and held by the sucking/raising device 102. The printing plate 20 is then raised and transferred to the reversing device 104. The reversing device 104 sucks and holds one end portion of the printing plate 20 in the transverse direction thereof, and rotates the printing plate 20. In this way, the printing plate 20 is reversed so that the photosensitive surface thereof faces upward.

Further, a lift stand 300 and a horizontally conveying device 106 are provided in the plate supplying portion 12. The printing plate 20 reversed by the reversing device 104 is placed on the lift stand 300. After the printing plate 20 placed on the lift stand 300 is positioned with respect to the lift stand 300, the printing plate 20 is transferred to the horizontally conveying device 106. The bottom surface of the printing plate 20 is supported by a plurality of claw portions of the horizontally conveying device 106. The printing plate 20 is then conveyed onto a surface plate 408 of a drawing portion 18 provided adjacent to the plate supplying portion 12.

After the printing plate 20 loaded on the surface plate 408 of the drawing portion 18 has been charged, an electrostatic latent image is formed on the photosensitive surface of the printing plate 20 by a drawing device. The printing plate 20 on which an electrostatic image has been formed is moved by a removing device 450 from the top of the surface plate 408 towards the plate discharging portion 14 which is provided adjacent to the drawing portion 18 and above the plate supplying portion 12. A conveying stage 502 is provided within the plate discharging portion 14 and is moved within the plate discharging portion 14 towards the drawing portion 18. The printing plate 20 raised by the removing device 450 is placed on the conveying stage 502.

The conveying stage 502 on which the printing plate 20 is placed is moved towards insertion stages 532 which are provided in the plate discharging portion 14 and are adjacent to a developing portion 22. The printing plate 20 is transferred from the conveying stage 502 onto the insertion stages 532. As illustrated in FIG. 3, when the printing plate 20 is placed on the insertion stages 532, the insertion stages 532 are inclined at predetermined angles towards the developing portion 22. Thereafter, the printing plate 20 loaded on the insertion stages 532 is delivered towards the developing portion 22. The angle of inclination of the insertion stage 532 is equal to the angle of inclination of the printing plate 20 which is conveyed at a vicinity of the insertion opening of the developing portion 22.

As shown in FIG. 1, the developing portion 22 is connected to the plate supplying/discharging portion 16. The developing portion 22 is formed by a developing processing portion 24, which effects developing processing of the printing plate 20 on which an electrostatic latent image is formed, and a fixing processing section 26, which effects fixing processing of the printing plate 20 which has undergone developing processing. After a toner, which is a developing liquid, is applied to the printing plate 20 in the developing processing portion 24, the unnecessary toner is squeezed out from the printing plate 20, and the printing plate 20 is dried. The developing system of the developing processing portion 24 is a reversal developing system wherein a toner having positive charges is applied to the surface of the printing plate 20 which has been charged positive in the drawing portion 18. Further, when toner particles are applied in the developing processing portion 24, the printing plate 20 is transported in a state in which it is inclined at a predetermined angle so that the toner particles can flow over the surface of the printing plate 20 evenly. In the fixing processing portion 26 of the developing portion 22, after the printing plate 20 has been heated by a fixing lamp, the printing plate 20 is cooled. The heated toner particles are filmized and are fixed to the surface of the printing plate 20.

An eluting portion 28 is disposed downstream of the developing portion 22. In the eluting portion 28, alkali solution is applied to the printing plate 20 upon which a toner image is formed so as to effect etching processing. In this way, the non-image portions of the printing plate 20, i.e., portions of the OPC layer other than those on which the toner image is formed, are eluted. Thereafter, the alkali solution and the OPC layer are washed off of the printing plate 20, and a gum solution is applied in order to protect the surface of the plate. After the printing plate 20, on which the gum solution has been applied, is dried in a drying portion 30, the printing plate 20 is sent to a punching portion 32 and a plate bending portion 34 which are downstream of the drying portion 30.

In the punching portion 32, the printing plate 20 is positioned on an unillustrated surface plate. Notches and circular holes, which are used to position the printing plate 20 at a plate cylinder of a rotary press when the printing plate 20 is loaded thereat, are formed in the end portions of the printing plate 20. In the plate bending portion 34, both end portions of the printing plate 20 in the longitudinal direction thereof are bent into predetermined configurations. In this way, the printing plate 20 can be positioned and loaded at the plate cylinder of the rotary press.

The printing plate 20, for which plate bending has been completed, is discharged from the plate bending portion 34 and is stored.

Next, the plate supplying/discharging portion 16 which is applied to the present invention will be described in detail with reference to the drawings.

As illustrated in FIGS. 1 and 2, the plate supplying portion 12 is disposed at the lower section of the plate supplying/discharging portion 16, and the plate discharging portion 14 is disposed at the upper section thereof. The drawing portion 18 is adjacent to the plate supplying/discharging portion 16. The plate supplying portion 12 and the plate discharging portion 14 are shaded by the casing 16A and are separated from each other by the partition wall 13B (only a portion of which is shown in FIG. 1).

Plate Supplying Portion: Sucking/Raising Device

Figure 5:
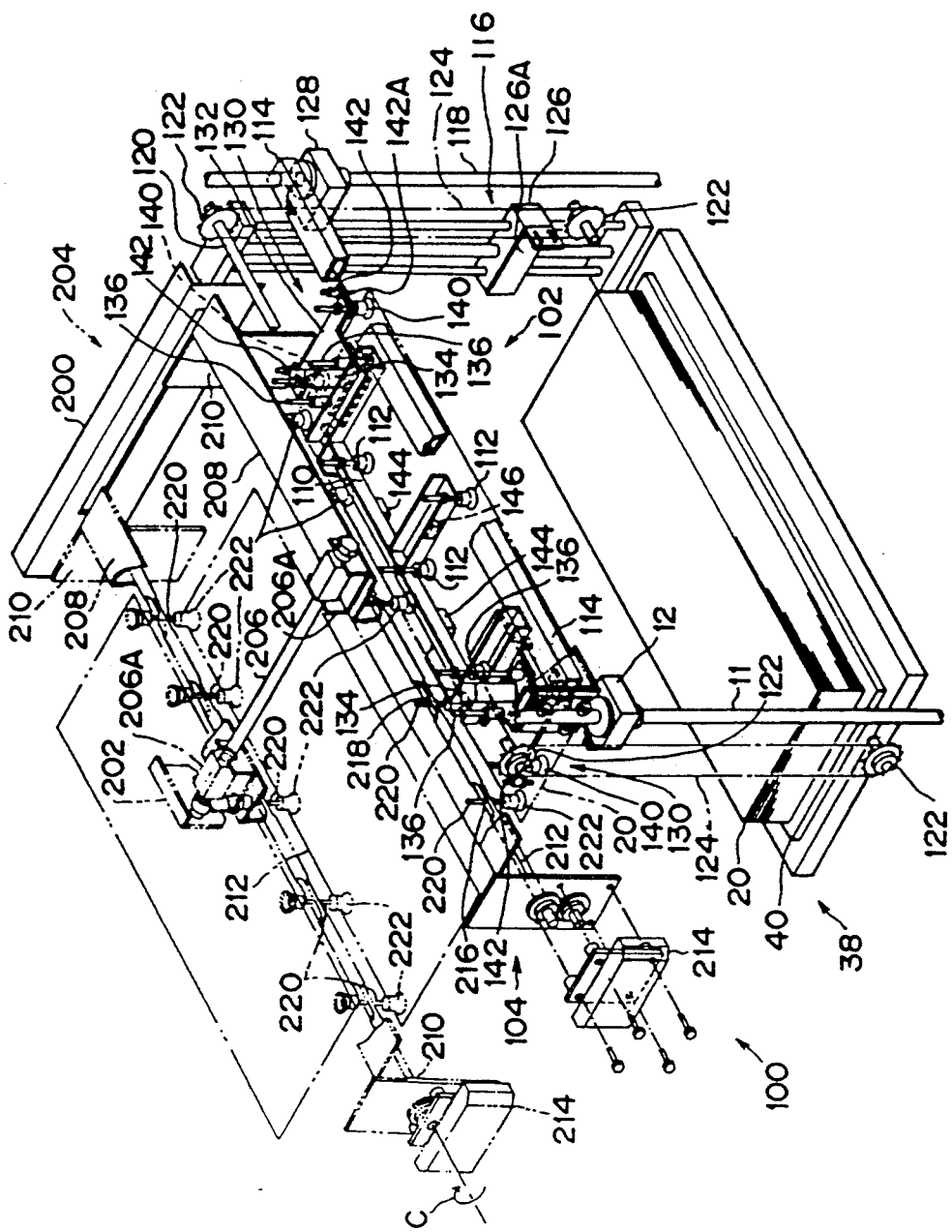
FIG. 5 is a perspective view of main portions of a sucking/raising device.
Figure 6:
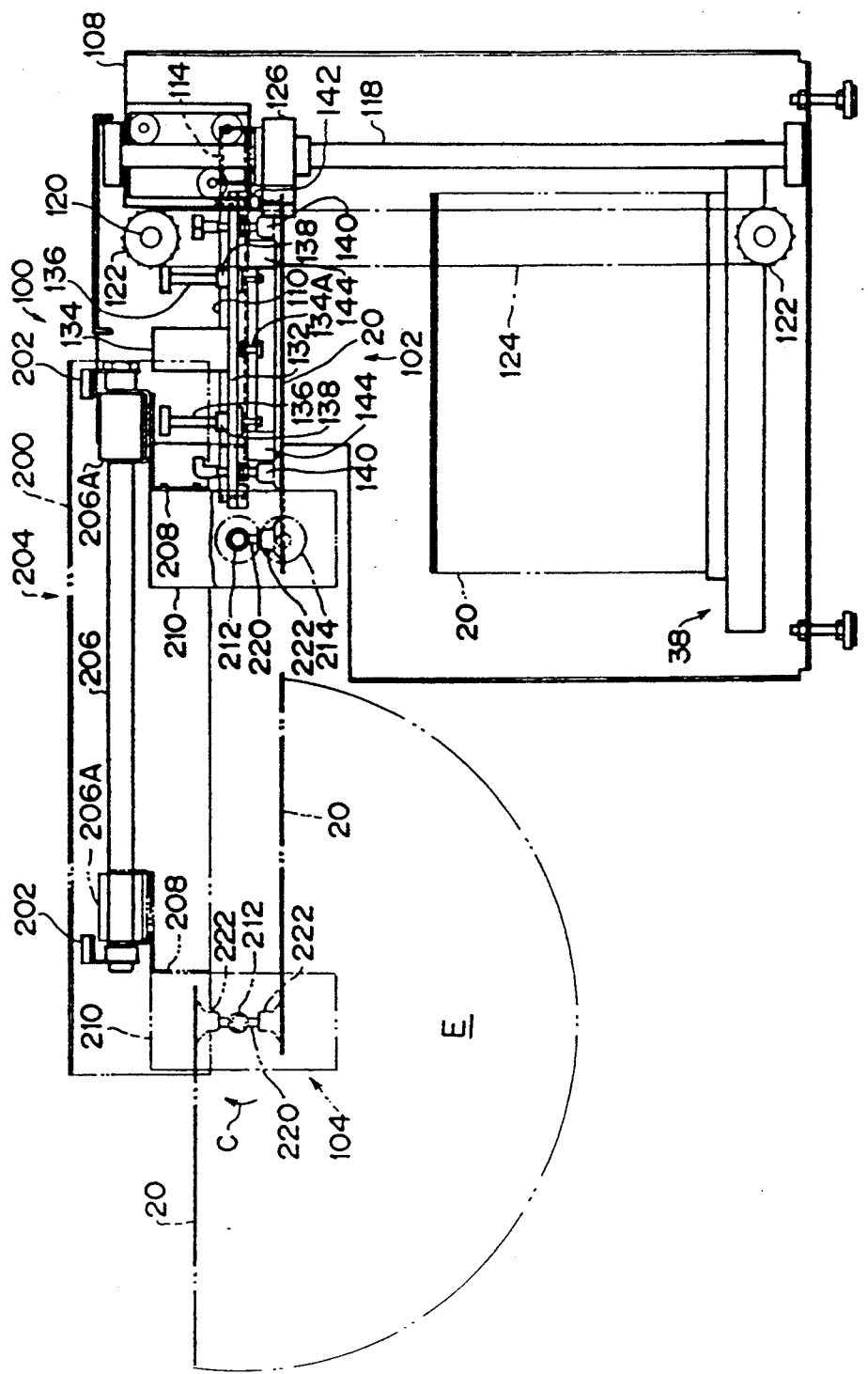
FIG. 6 is a front view of main portions of the sucking/raising device.

As shown in FIG. 2 and FIGS. 5 through 7, the skid 38, upon which a plurality of the printing plates 20 is held, is loaded in the plate supplying section 12. The sucking/raising device 102, which serves as a supplying device 100, and the reversing device 104 are provided above the skid 38. As illustrated in FIGS. 6 and 7, the sucking/raising device 102 is mounted to a frame 108. The reversing device 104 is provided at the drawing portion 18 side of the sucking/raising device 102. As shown in FIG. 2, in the plate supplying portion 12, the horizontally conveying device 106 is adjacent to the supplying device 100 on the drawing portion 18 side. The horizontally conveying device 106 conveys to the drawing portion 18 the printing plates 20 supplied from the skid 38 by the supplying device 100.

Figure 11:
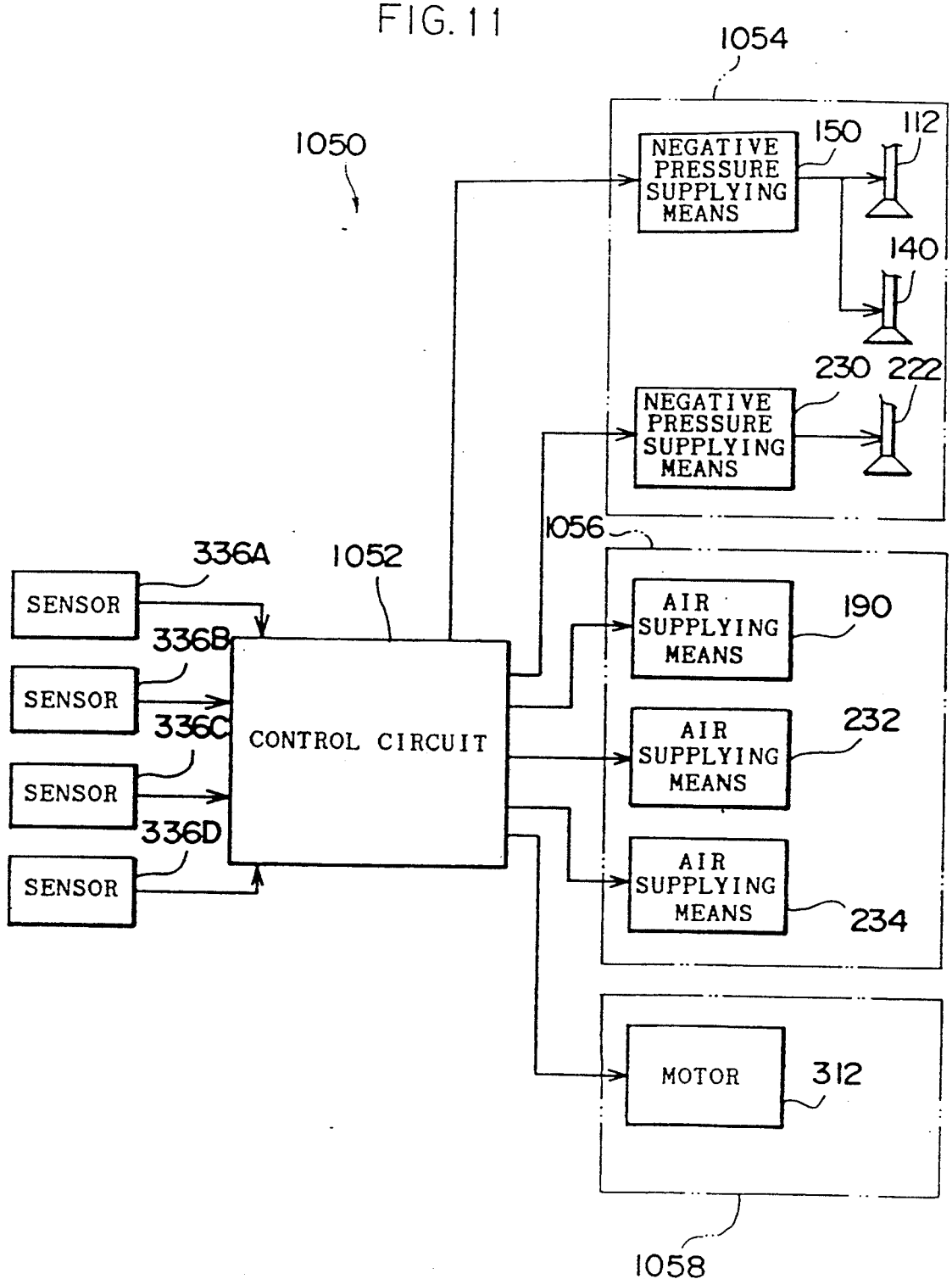
FIG. 11 is a block diagram illustrating a schematic structure of a control portion.

As illustrated in FIGS. 5 and 7, in the sucking/raising device 102, a plurality of suction cups 112, which are connected to a negative pressure supplying means 150 shown in FIG. 11, and blocks 144 are disposed so as to face downward on a supporting frame 110, which is substantially rectangular and is disposed substantially horizontally. The suction cups 112 oppose a vicinity of a central portion of the surface of the topmost printing plate 20 held on the skid 38. The blocks 144 maintain the space between the supporting frame 110 and the printing plate 20 so that the suction cups 112 contact the printing plate 20 in an optimal state. When negative pressure is supplied to the suction cups 112 by the negative pressure supplying means 150, the printing plate 20 is sucked.

A support bar 114 is connected to the supporting frame 110 at an end portion of the supporting frame 110 on the side opposite the reversing device 104. The support bar 114 extends in the longitudinal direction of the printing plate 20. The support bar 114 is supported by the frame 108 of the plate supplying portion 12 so as to be movable in vertical directions.

A pair of guide rods 118 are provided respectively at both end portions, in the longitudinal direction of the printing plate 20, of the frame 108 (which is not shown in FIG. 5).

A shaft 120 is suspended in the vicinity of an upper end portion (the upper side of FIGS. 5 and 7) of the guide rod 118 in the axial direction thereof. The shaft 120 is supported by the frame 108 so as to be pivotable. A sprocket 122 is attached to the shaft 120, and another sprocket 122 is pivotably supported by the frame 108 at a vicinity of the lower end portion of the guide rod 118. A chain 124, which is disposed along the axial direction of the guide rod 118, is trained around the sprockets 122.

A driving block 126, which is moved in vertical directions by the driving of a rodless cylinder 116, is provided at the rodless cylinder 116. The driving block 126 is connected to the chain 124 by a bracket 126A. Each guide rod 118 is inserted through a block 128 such that the block 128 is movable along the axial direction of the guide rod 118. The block 128 is connected to the chain 124 which is in the vicinity of the guide rod 118. Accordingly, when the rodless cylinder 116 is driven by the air supplying means 190 illustrated in FIG. 11, the driving block 126 is moved, and the chains 124 and the shaft 120 rotate so that the pair of blocks 128 on the respective guide rods 118 are moved in the same direction. Further, the longitudinal end portions of the support bar 114 of the supporting frame 110 are movably supported by the respective guide rods 118 and abut the upper surfaces of the blocks 128 so that the support bar 114 is supported in a horizontal state. Accordingly, when the rodless cylinder 116 is driven, the supporting frame 110 is moved parallel to the printing plates 20 in a horizontal state in vertical directions.

As shown in FIGS. 5 and 6, lifting portions 130 are provided respectively at both ends, in the longitudinal direction of the printing plate 20, of the supporting frame 110 of the sucking/raising device 102. In the lifting portion 130, an air cylinder 134 and a pair of guide rods 136 are provided on a substantially rectangular base plate 132. The air cylinder 134 and the pair of guide rods 136 are disposed parallel to each other and such that the axial directions thereof run along the vertical direction. A driving shaft 134A of the air cylinder 134 penetrates through the base plate 132, and the end of the driving shaft 134A is connected to the supporting frame 110. Respective intermediate portions of the guide rods 136 are inserted through slide bearings 138 which are attached to the base plate 132. The lower ends of the guide rods 136 are inserted through the base plate 132 and are connected to the supporting frame 110. Accordingly, when the air cylinder 134 is driven by air supplied from an unillustrated air supplying means, the base plate 132 is moved parallel to the supporting frame 110 and upward with respect to the supporting frame 110.

Suction cups 140 are attached respectively at the vicinities of the four corner portions of each of the rectangular base plates 132. In each base plate 132, the two suction cups 140 which are disposed on the shutter 162 side oppose positions of the printing plate 20 which are at a shutter 162 side, transverse direction end portion of the printing plate 20 and which are at the respective, longitudinal ends of the printing plate 20. On the other hand, the two suction cups 140 which are located at the reversing device 104 side oppose positions of the printing plate 20 which are slightly more inward than a reversing device 104 side, transverse direction end portion of the printing plate 20, and which are at the respective, longitudinal ends of the printing plate 20. All of the suction cups 112 and 140 are connected to the negative pressure supplying means 150 (see FIG. 11). The above-described positions of the printing plate 20 can be sucked by negative pressure being supplied by the negative pressure supplying means 150.

Air blow nozzles 148 are attached respectively to a side of each of the suction cups 140. The air blow nozzles 148 are connected to an unillustrated air supplying means. The angle of the air blow nozzles 148 is adjusted so that when the suction cups 140 are sucking the printing plate 20, the air supplied from the air supplying means is blown by the air blow nozzles 148 to the surface of the printing plate 20 which is opposite the surface being sucked.

The suction cups 140, which are connected to the unillustrated negative pressure supplying means, are disposed on the base plate 132 at positions which correspond to the end portions of the printing plate 20 in the longitudinal direction thereof. Air cylinders 142 are disposed on the base plate 132 in vicinities of the suction cups 140. A driving shaft 142A of the air cylinder 142 penetrates through the base plate 132 and projects downward. The driving shaft 142A is projected further downward than the end of the suction cup 140 due to the driving of the air cylinder 142.

As shown in FIG. 5, a plate detection sensor 146 is mounted to a central portion of the supporting frame 110 so as to oppose the surface of the printing plate 20. A plurality of electrode pins (unillustrated) project downward from the plate detection sensor 146. The plate detection sensor 146 detects a change in the charged state between the electrode pins due to the electrode pins contacting the surface of the printing plate 20, and thereby senses the existence of the printing plate 20.

The standby position of the sucking/raising device 102 is the position at which the sucking/raising device 102 is moved to the upper end of the frame 108. At this position, the air cylinder 134 of the lifting portion 130 accommodates the driving shaft 134A, and the suction cups 140 are at approximately the same height as the suction cups 112 provided on the supporting frame 110. Further, the end of the driving shaft 142A of the air cylinder 142 is positioned higher than the suction cup 140.

Figure 8A:
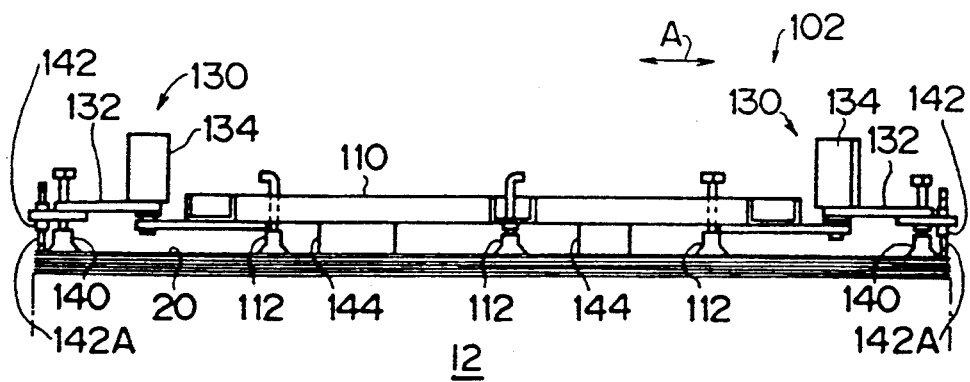

As shown in FIG. 8A, the sucking/raising device 102 is lowered by the driving of the rodless cylinder 116. The suction cups 112, 140 and the block 144 abut the uppermost printing plate 20, and the lowering of the supporting frame 110 stops. The rodless cylinder 116 lowers the driving block 126 further and then stops. In this state, when negative pressure is supplied to each of the suction cups 112, 140, the printing plate 20 is sucked.

Figure 8B:
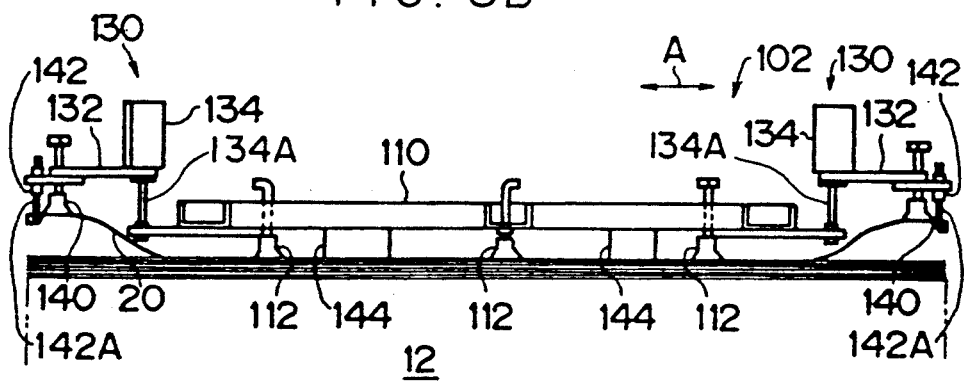
Figure 8C:
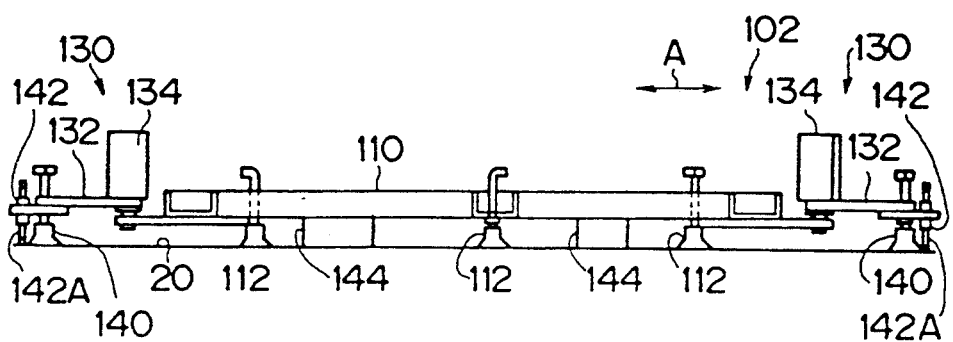

Next, as shown in FIG. 8B, when the air cylinders 134 of the lifting portions 130 are driven, the end portions of the printing plate 20 are lifted by the suction cups 140. Vicinities of the end portions of the printing plate 20 lifted by the suctions cups 140 are pushed downward by the driving of the air cylinders 142. In this way, the uppermost printing plate 20 being sucked by the suction cups 112, 140 is separated from the printing plate 20 adhering to its bottom surface, so that only the uppermost printing plate 20 is sucked. Accordingly, as shown in FIG. 8C, the printing plate 20 sucked by the suction cups 112, 140 is lifted upward by the driving of the rodless cylinder 116.

When the uppermost printing plate is separated from the printing plate 20 thereunder, it is preferable that air is supplied by air nozzles or the like from the end portions lifted by the suction cups 140. In this way, the uppermost printing plate 20 and the printing plate 20 adhering to the bottom surface of the uppermost printing plate 20 can be separated even more. Plate Supplying Portion: Reversing Device As shown in FIGS. 5 and 6, a frame 204, which supports the reversing device 104, is formed at an upper portion of the frame 108 by a pair of side plates 200, which extend towards the drawing portion 18 side, and suspended frame members 202. A rodless cylinder 206 is suspended between and attached to the frame members 202. The rodless cylinder 206 is provided such that the driving direction thereof runs along the side plates 200. The reversing device 104 is attached to driving portions 206A of the rodless cylinder 206. The rodless cylinder 206 is driven by an unillustrated air supplying means and moves the reversing device 104 along the side plates 200.

The reversing device 104 is formed by supporting members 208, which are suspended between the pair of side plates 200, and pairs of side plate members 210, which extend respectively from both end portions of the respective supporting members 208. An unillustrated guide, which supports the side plate member 210 and which guides the side plate member 210 when the rodless cylinder 206 is driven, is provided between the side plate member 210 and the side plate 200 of the frame 204.

A supporting shaft 212 is provided between the pair of side plate members 210. Rotating cylinders 214 are provided at the side plate members 210 on one side. The supporting shaft 212 is suspended between and is rotatably supported by the pair of side plate members 210 such that one end of the supporting shaft 212 is connected to the rotating cylinder 214. Each time the rotating cylinder 214 is driven once by an air supplying means 234 (see FIG. 11), the supporting shaft 212 is rotated 180 degrees in the direction of arrow C in FIG. 5 or in the direction opposite to arrow C.

An elongated hole 216, which is elongated in the axial direction toward one axial end of the supporting shaft 212, is provided in the supporting shaft 212. A plurality of through-holes 218 is provided between the position at which the elongated hole 216 is formed and the other axial end of the supporting shaft 212. The directions in which the elongated hole 216 and the through-holes 218 penetrate the supporting shaft 212 are parallel. Suction cup supporting members 220 are inserted in the elongated hole 216 and the through-holes 218, and are fixed to the supporting shaft 212. Suction cups 222, which correspond to the supporting means of the present invention, are attached respectively to the ends of the suction cup supporting members 220 so as to face in the same direction. The suction cups 222 are connected to a negative pressure supplying means 230 (see FIG. 11). The printing plate 20 can be sucked and supported by the negative pressure supplied from the negative pressure supplying means 230.

The suction cup supporting members 220 and the suction cups 222 are rotated in the direction of arrow C in FIG. 5 or in the direction opposite thereto along with the rotation of the supporting shaft 212. Further, when the printing plate 20 is sucked and supported by the suction cups 222 only, as will be explained later, the printing plate 20 is rotated with the suction cups 222 within a range of movement E (the border of the range of movement E is shown by the imaginary line in FIG. 6) so as to be reversed. The standby position of the reversing device 104 is the position at which the reversing device 104 is moved as far as possible, within its range of movement, toward the sucking/raising device 102. At this time, the suction cups 222 of the supporting shaft 212 face downward. Each of the suction cups 222 opposes a predetermined position of a rotating device 104 side, transverse direction end portion of the printing plate 20 between the longitudinal direction ends of the printing plate 20.

The printing plate 20 is held in a state in which one transverse end portion thereof is sucked by the suction cups 222 (the "one side held" state), and is moved by the driving of the rodless cylinder 206 to an end portion of the drawing portion 18 side (as is illustrated by the two-dot chain line in FIGS. 5 and 6). The printing plate 20 is rotated along with the supporting shaft 212 in the direction of arrow C due to the driving of the rotating cylinder 214. Accordingly, the photosensitive surface of the printing plate 20 supplied from the skid 38 to the drawing portion 18 faces upward.

Plate Supplying Portion: Horizontally Conveying Device

Figure 9:
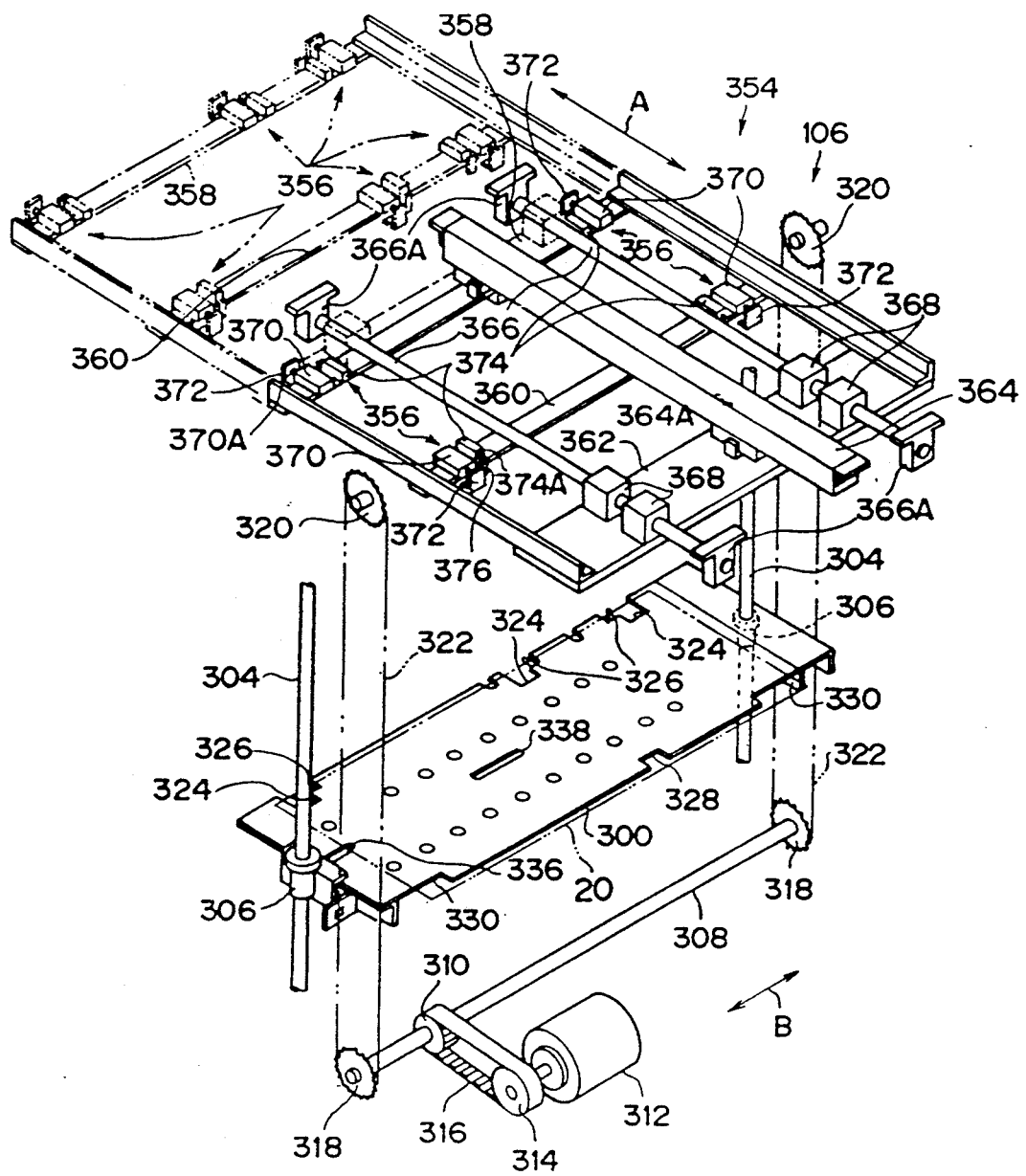
FIG. 9 is a perspective view illustrating a lift stand and a horizontally conveying device.
Figure 10:
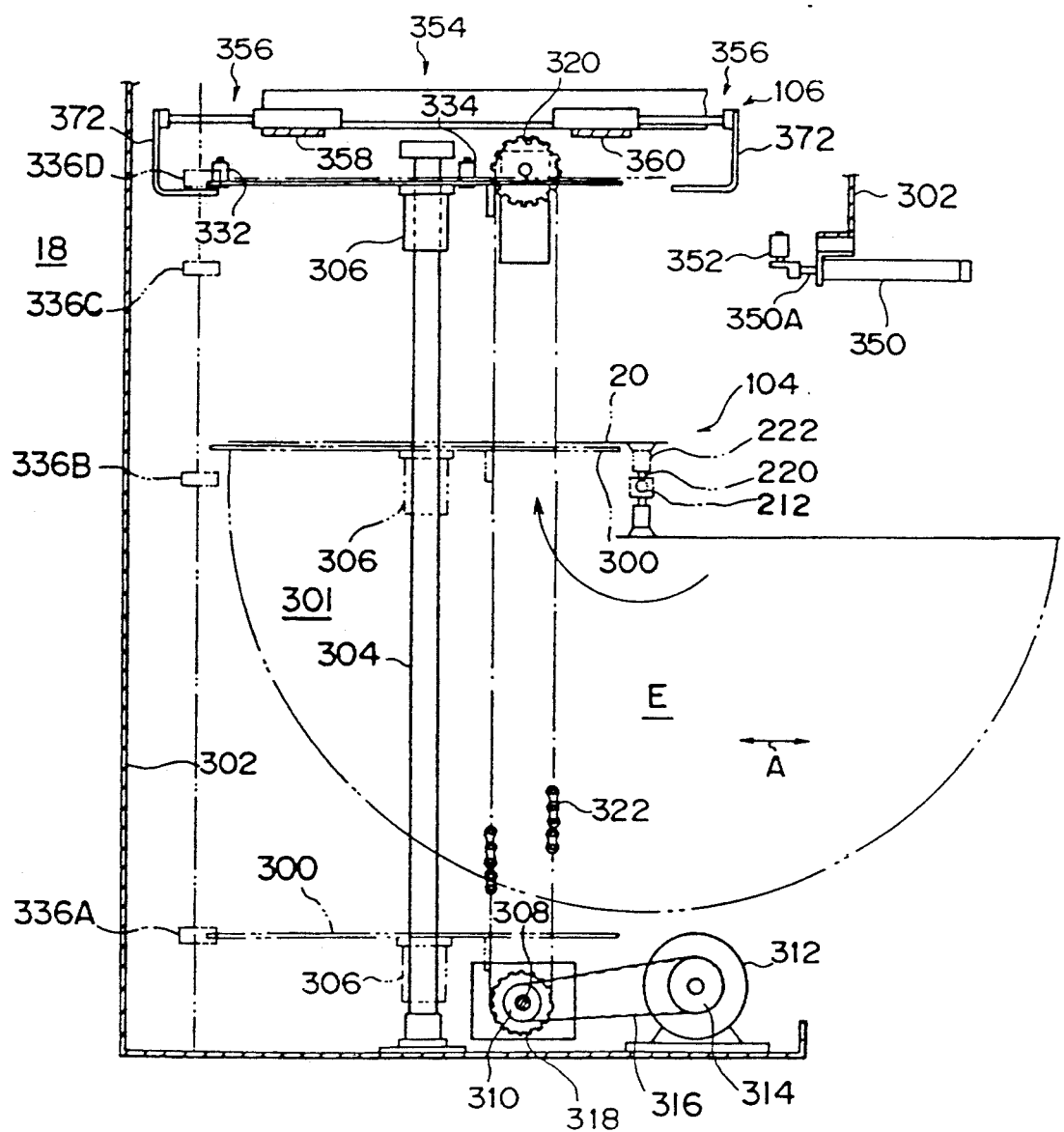
FIG. 10 is a front view illustrating the lift stand and the horizontally conveying device.

As illustrated in FIG. 10, the lift stand 300 is disposed beneath the printing plate 20, which has been reversed and which is supported by the reversing device 104, and opposes the printing plate 20. Further, as shown in FIG. 9, the horizontally conveying device 106 which moves between the plate supplying portion 12 and the drawing portion 18 is disposed above the reversed printing plate 20, i.e., above the lift stand 300 at the upper portion of the plate supplying portion 12.

The lift stand 300 is a substantially rectangular, flat plate. The longitudinal direction of the lift stand 300 runs along and is substantially parallel to the longitudinal direction of the printing plate 20. The lift stand 300 is supported by a frame 302 (shown in FIG. 10 only) so as to be able to move parallel in vertical directions.

Guide rods 304 are attached to the frame 302 respectively at both sides in the longitudinal direction of the lift stand 300. An intermediate portion of the guide rod 304 is inserted into a slide bearing 306, which is movable in vertical directions. The slide bearings 306 are attached to respective end portions of the lift stand 300 in the longitudinal direction thereof.

A shaft 308 is suspended at and rotatably supported by the frame 302 beneath the lift stand 300 in the longitudinal direction thereof. A pulley 310 is coaxially attached to an intermediate portion of the shaft 308. An endless belt 316 is trained around the pulley 310 and a pulley 314 which is attached to the rotary shaft of a motor 312.

Sprockets 318 are attached respectively to both end portions of the shaft 308 in vicinities of the respective guide rods 304. Sprockets 320, which correspond to the sprockets 318, are rotatably supported by the frame 302 in vicinities of the upper end portions of the respective guide rods 304. Chains 322, which are provided along the axial directions of the guide rods 304, are respectively trained around the sprockets 318 and the sprockets 320. The chains 322 are connected to respective longitudinal end portions of the lift stand 300. The shaft 308 and the chains 322 are rotated by the driving of the motor 312. Due to the rotation of the chains 322, the lift stand 300 moves parallel upward or downward along the guide rods 304.

Figure 12:
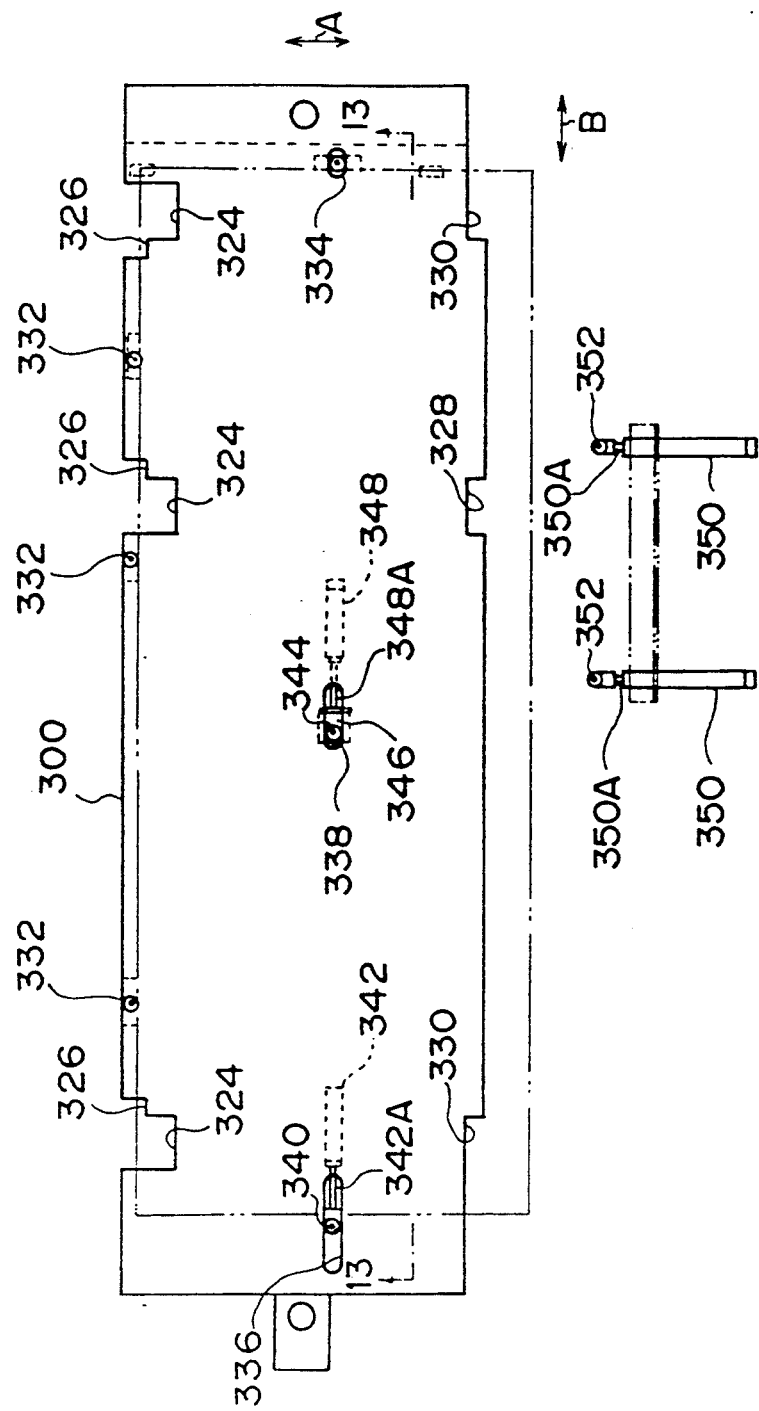
FIG. 12 is a plan view of main portions of the lift stand.

As illustrated in FIGS. 9 and 12, a plurality of sets of rectangular, deep notches 324 and shallow notches 326, which are connected together, is formed in one transverse end portion of the lift stand 300. The notches 324, 326 are formed at both end portions and an intermediate portion in the longitudinal direction of the lift stand 300. A notch 328 is formed in the other transverse direction end portion of the lift stand 300 at a position corresponding to the notch 324 of the longitudinally intermediate portion. Notches 330 are formed at both longitudinal end portions from positions which correspond to the notches 324 to the end portions of the lift stand 300. The notches 324, 326, 328, 330 are used for the insertion of claw portions when the printing plate 20 is transferred from the lift stand 300 to the horizontally conveying device 106 which will be described later.

Figure 13:
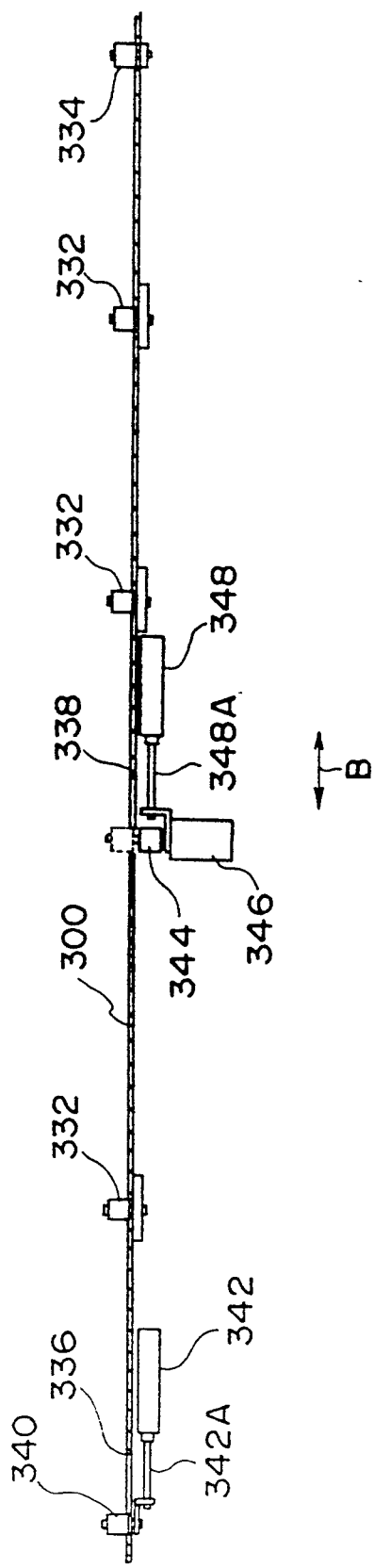
FIG. 13 is a sectional view of main portions taken along line 13—13 of FIG. 11.

As shown in FIGS. 12 and 13, rollers 332 are disposed in a straight line along the longitudinal direction of the lift stand 300 at an end portion on the lift stand 300 is disposed at an end portion of the lift stand 300 in the longitudinal direction thereof at an intermediate portion in the transverse direction. Further, an elongated hole 336 is formed at the other longitudinal end portion of the lift stand 300, and an elongated hole 338 is formed at an intermediate portion in the longitudinal direction of the lift stand 300. The elongated holes 336, 338 are both formed in a central portion of the lift stand 300 in the transverse direction thereof, and are both formed along the longitudinal direction of the lift stand 300. A roller 340 is inserted through the longitudinal end portion elongated hole 336 so as to protrude from the top surface of the lift stand 300. The roller 340 is connected to and supported by an end of a driving shaft 342A of an air cylinder 342 which is mounted to the bottom surface of the lift stand 300. By the driving of the air cylinder 342, the roller 340 is moved within the elongated hole 336 along the longitudinal direction thereof. Accordingly, a longitudinal end portion of the printing plate 20 loaded on the lift stand 300 is pushed towards the roller 334.

A roller 344 is disposed within the elongated hole 338 which is located in the central portion of the lift stand 300. The roller 344 appears above and sinks below the upper surface of the lift stand 300. The roller 344 is attached to an end of a driving shaft of an air cylinder 346 which is disposed at the bottom surface of the lift stand 300 so as to face upward. An end portion of a driving shaft 348A of an air cylinder 348, which is mounted to the bottom surface of the lift stand 300 along the longitudinal direction of the lift stand 300, is connected to the air cylinder 346. As a result, the roller 344 can appear above and sink below the upper surface of the lift stand 300 by the driving of the air cylinder 346, and is moved within the elongated hole 338 along the longitudinal direction thereof by the driving of the air cylinder 348.

A plurality of sensors 336A, 336B, 336C, 336D are disposed at respective, predetermined heights in vicinities of the range of movement of the lift stand 300 which is raised and lowered. The sensors 336A, 336B, 336C, 336D detect whether or not the lift stand 300 is positioned at the positions at which the sensors are respectively disposed. A structure may be provided in which each sensor comprises, for example, a light-emitting element and a light-receiving element pair. With this type of structure, when the lift stand 300 reaches a position corresponding to the height at which the sensor is located, the signal output from the light-receiving element changes due to the optical path of the light-emitting element being intercepted. Alternatively, a switch or the like could be provided in which contacts switch due to contact with the lift stand 300.

The standby position of the lift stand 300 is the lowest position of the range of movement of the lift stand 300 is under the range of movement E over which the printing plate 20 moves when rotated. The sensor 336A is disposed at a height corresponding to this standby position, and is on when the lift stand 300 is a the standby position. The printing plate receiving position of the lift stand 300 is a position at which the printing plate 20 is substantially horizontal and at which an end portion of the printing plate 20 on the outer circumference side during the rotation thereof is loaded on the lift stand 300. The sensor 336B is provided at a height corresponding to this printing plate receiving position. The sensor 336B corresponds to the detecting means of the present invention, and is on when the lift stand 300 is raised to the printing plate receiving position.

The positioning position of the lift stand 300 is a position at which the lift stand 300 opposes air cylinders 350. The sensor 336C is provided at a height corresponding to the positioning position, and is on when the lift stand 300 is raised to the positioning position. The printing plate transfer position is the highest position of the range of movement of the lift stand 300 and corresponds to the horizontally conveying device 106. The sensor 336D is provided at a height corresponding to the printing plate transfer position, and is on when the lift stand 300 is raised to this position. The sensors 336A, 336B, 336C, 336D are connected to a control circuit 1052 of a control portion 1050 (see FIG. 11), so that the results of the detection of the sensors 336A, 336B, 336C, 336D are output to the control circuit 1052.

As shown in FIG. 10, a pair of the air cylinders 350 is attached to a vicinity of the position at which the printing plate 20 is loaded on the raised lift stand 300. Respective driving shafts 350A of the air cylinders 350 face toward the interior of the lift stand 300 in the transverse direction thereof. The printing plate 20 loaded on the lift stand 300 is pushed toward the rollers 332 by rollers 352 provided respectively on the ends of the driving shafts 350A.

The aforementioned structures are used to position the printing plate with respect to the lift stand 300. By positioning the printing plate 20 with respect to the lift stand 300, the printing plate 20 is temporarily positioned with respect to the drawing portion 18. Namely, the printing plate 20 is positioned with respect to the lift stand 300 by a longitudinal end portion of the printing plate 20 loaded on the lift stand 300 abutting the roller 334 due to the roller 340 of the air cylinder 342, and a transverse end portion of the printing plate 20 abutting the rollers 332 due to the rollers 352 of the pair of air cylinders 350. The roller 340 of the air cylinder 342 is used for longitudinal direction positioning of the printing plate 20 of a size of two newspaper pages. The roller 344 of the air cylinders 346, 348 is used to position a printing plate of a size of one newspaper page. The roller 344 is usually positioned beneath the upper surface of the lift stand 300.

The position at which the sensor 336A is disposed is the standby position of the lift plate 300. The position at which the lift plate 300 opposes the reversing device 104 and at which the sensor 336B is disposed is the printing plate receiving position. The position at which the lift plate 300 opposes the pair of air cylinders 350 and at which the sensor 336D is disposed is the positioning position. The position at which the lift plate 300 corresponds to the horizontally conveying device 106 and at which the sensor 336D is disposed is the printing plate transfer position. These positions are detected by the respective sensors 336A, 336B, 336C, 336D.

Horizontally Conveying Device

As illustrated in FIG. 9, the horizontally conveying device 106 is substantially rectangular and is structured by a moving frame 354 and a plurality of pairs of chucks 356 which are provided on the moving frame 354. Support bars 358, 360, which are suspended along the longitudinal direction of the printing plate 20, are provided as a pair at an end portion of the moving frame 354 on the drawing portion 18 side and at an intermediate portion of the moving frame 354, respectively. A wide supporting plate 362 is provided at the end portion opposite the drawing portion 18 side.

A driving shaft 364A of a rodless cylinder 364, both end portions of which are fixed to a frame of the plate supplying portion 12, is connected to a longitudinally intermediate portion of the supporting plate 362 of the moving frame 354. Further, guide rods 366 are provided respectively at both sides of the rodless cylinder 364 along the axial direction thereof. Both end portions of the respective guide rods 366 are supported to the frame of the plate supplying portion 12 by brackets 366A. An intermediate portion of each of the guide rods 366 is inserted through two slide bearings 368. The slide bearings 368 are mounted to the supporting plate 362 of the moving frame 354 so that the moving frame 354 is supported by the guide rods 366.

The moving frame 354 is supported in a state in which one side thereof is held by the supporting plate 362 provided on the end portion of the moving frame 354 on the side opposite the drawing portion 18 side. The moving frame 354 is moved parallel by the driving of the rodless cylinder 364 so that the pair of support bars 358, 360 can be inserted into the drawing portion 18. (The movement of the moving frame 354 is indicated by the two-dot chain line in FIG. 9).

Each of the chucks 356 provided on the moving frame 354 is formed by an air cylinder 370 and a claw portion 372, which is attached to an end of a driving shaft 374A of the air cylinder 370, as well as an air cylinder 374 and a pin 376, which is attached to an end of a driving shaft 374A of the air cylinder 374. The chucks 356 are mounted in pairs to the supporting bars 358, 360 so as to correspond to both end portions and the intermediate portion of the printing plate 20 in the longitudinal direction thereof.

Figure 14:
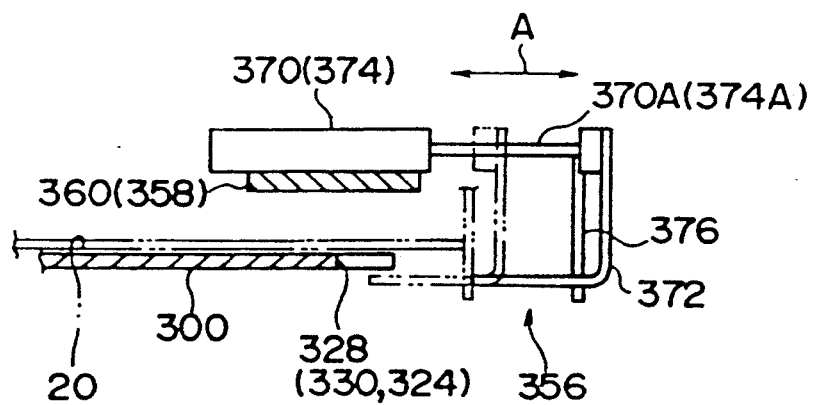
FIG. 14 is a sectional view of main portions illustrating a chuck of the horizontally conveying device.

As shown in FIG. 14, the air cylinders 370, 374 of the chuck 356 are mounted such that the respective drive shafts 370A, 374A face toward the outer side of the printing plate 20 in the transverse direction thereof and such that the pin 376 faces downward. The claw portion 372 is formed as a substantial L-shape. The intermediate portion of the claw portion 372 faces downward, and the end portion thereof faces toward the inner side of the printing plate 20 in the transverse direction thereof. Accordingly, by the driving of the air cylinders 370, 374, the claw portions 372 which oppose each other and the pins 376 are moved in directions of moving apart or in directions of approaching each other.

The space between the ends of the claw portions 372 which oppose each other is longer than the dimension of the printing plate 20 in the transverse direction thereof when the claw portions 372 are moved apart from each other. When the claw portions 372 are closest together, the space therebetween is shorter than the dimension of the printing plate 20 in the transverse direction thereof. In this way, when the claw portions 372 are closest together, the transverse end portions of the printing plate 20 are loaded on and supported by the end portions of the claw portions 372. The distance between the opposing pins 376 when they are moved apart from each other is longer than the transverse direction dimension of the printing plate 20. When the pins 376 are closest together, the distance therebetween is approximately the same as the dimension of the printing plate 20 in the transverse direction thereof.

At the upper standby position of the lift stand 300, the claw portions 372 and the pins 376 of the horizontally moving device 106 are moved apart from each other. The claw portions 372 correspond respectively to the notches 324, 328, 330 of the lift stand 300. The pins 376 correspond to the notches 326. The claw portions 372 and the pins 376 are positioned at outer sides of the notches 324, 326, 328, 330 due to the raising of the lift stand 300. The claw portions 372 are inserted into the notches 324, 328, 330 by the driving of the air cylinders 370. By the driving of the air cylinders 374, the pins 376 are moved so as to be adjacent to the end portions of the printing plate 20 in the transverse direction thereof. In this state, when the lift stand 300 is moved downward, the printing plate 20 separates from the upper surface of the lift stand 300, and is supported by the claw portions 372 so as to be transferred to the moving frame 354.

A shutter 400 (see FIG. 2) is provided between the plate supplying portion 12 and the drawing portion 18. The shutter 400 is usually closed so that both the interior of the plate supplying portion 12 and the interior of the drawing portion 18 are shaded. When the shutter 400 is opened, the interior of the plate supplying portion 12 and the interior of the drawing portion 18 are communicated with each other. In this state, the printing plate 20 is supported by the moving frame 354, is inserted into the drawing portion 18, and is lowered onto a surface plate which will be described later. Namely, when the air cylinders 370 are driven, the claw portions 372, which support the lower surface of the printing plate 20 at both transverse end portions thereof, are moved in directions of moving apart from each other. Therefore, the claw portions 372 separate from the printing plate 20, and the printing plate 20 is dropped. At this time, the pins 376 hold down the end portions of the printing plate 20 in the transverse direction thereof so that the printing plate 20 does not catch on the claw portions 372 and move therewith.

The moving frame 354 is provided with, for example, a magnetic sensor which opposes the surface of the printing plate 20 so as to detect the printing plate 20 supported by the claw portions 372.

Drawing Portion

Figure 15:
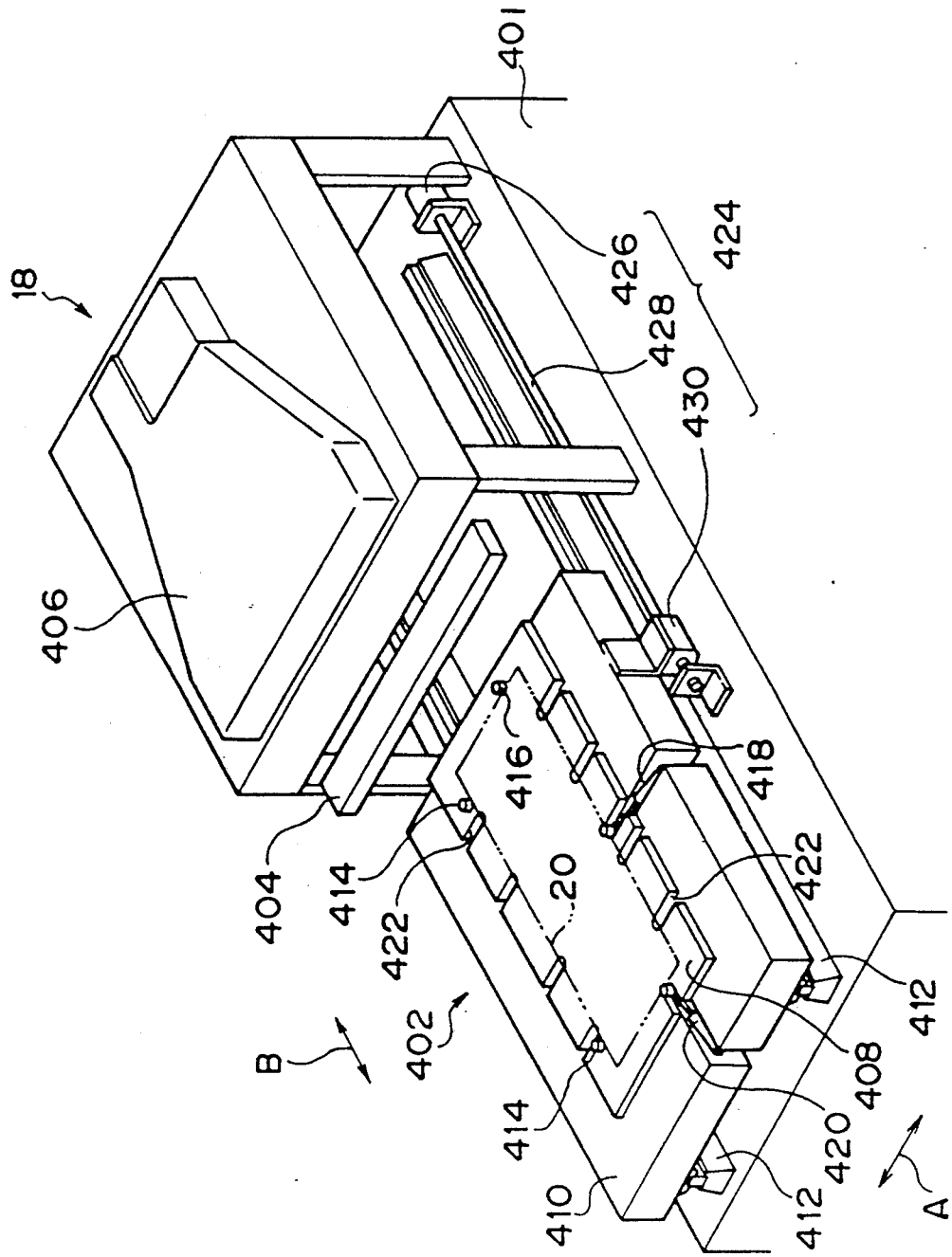
FIG. 15 is a perspective view of main portions of a drawing device.

FIG. 15 outlines the drawing portion 18. The drawing portion 18 is formed of a plate stand 402 on which the printing plate 20 is loaded, a charging device 404 which charges the printing plate 20, and a drawing device 406 which forms an electrostatic latent image on the photosensitive surface of the charged printing plate 20. The plate stand 402, the charging device 404, and the drawing device 406 are all disposed on a frame stand 401 and are shaded by and accommodated within an unillustrated casing.

The plate stand 402 is shaped as a rectangular, flat plate. The plate stand 402 is equipped with a surface plate 408, which is located on the top surface of the plate stand 402 and on which the printing plate 20 is loaded, and a moving stand 410. The surface plate 408 is fixed to and supported by the moving stand 410. The moving stand 410 is guided by a pair of rails 412 on the frame stand 401, and is movable in the direction of the drawing device 406 and in the direction opposite thereto.

The plate stand 402 is equipped with a positioning device, which positions the printing plate 20 loaded on the surface plate 408 with respect to the surface plate 408, and a suction device, which sucks and holds the printing plate 20 positioned on the surface plate 408. The positioning device includes a plurality of pins 414, 416 which can appear above and sink below the surface plate 408, a pusher 418 which corresponds to the pins 414, and a pusher 420 which corresponds to the pin 416.

The pusher 418 pushes the transverse end portion of the printing plate 20 toward the pins 414 so as to effect transverse direction positioning of the surface plate 20. The pusher 420 pushes the longitudinal end portion of the printing plate 20 toward the pin 416 so as to effect positioning of the surface plate 20 in the longitudinal direction thereof.

Further, an unillustrated pin, which is used to effect positioning of a printing plate of a size of one newspaper page, is disposed in a substantially central portion of the surface plate 408, and is able to appear above and sink beneath the surface plate 408. Positioning of a printing plate of a size of one newspaper page is thereby possible.

A plurality of unillustrated grooves is formed in the top surface of the surface plate 408. When negative pressure is supplied to these grooves by an unillustrated negative pressure supplying means, the printing plate 20 positioned on the surface plate 408 is sucked and held.

A plurality of notches 422 is formed in the surface plate 408 so as to extend to vicinities of the transverse direction end portions of the printing plate 20. When the printing plate 20 is discharged from the top of the surface plate 408, claw portions of a discharging device are inserted into the notches 422.

A moving device 424, which moves the plate stand 402 along the pair of rails 412, is disposed on the frame stand 401. The moving device 424 includes a feed screw 428 and a nut 430. The driving shaft of a motor 426 is connected to one end of the feed screw 428. The feed screw 428 is disposed so as to be parallel to the rails 412 and is rotatably supported by the frame stand 401. The nut 430 is screwed with the drive screw and is connected to the plate stand 402. Accordingly, the feed screw 428, which is rotated by the driving of the motor 426, moves the nut 430 and the plate stand 402.

The printing plate 20, which is positioned on and held at the surface plate 408, passes underneath the charging device 404 and is sent to the drawing device 406 by the moving device 424. At this time, the printing plate 20 is charged plus by corona discharge from the charging device 404. The printing plate 20, which is moved under the drawing device 406, is scanned and exposed in accordance with an image by, for example, a semiconductor laser having a wavelength of 780 nm, so that an electrostatic latent image is formed on the photosensitive surface. The printing plate 20, on which an electrostatic latent image has been formed, is returned by the moving device 424 to its original position, i.e., the position at which the printing plate 20 is originally positioned on top of the surface plate 408.

Removing Device

Figure 16:
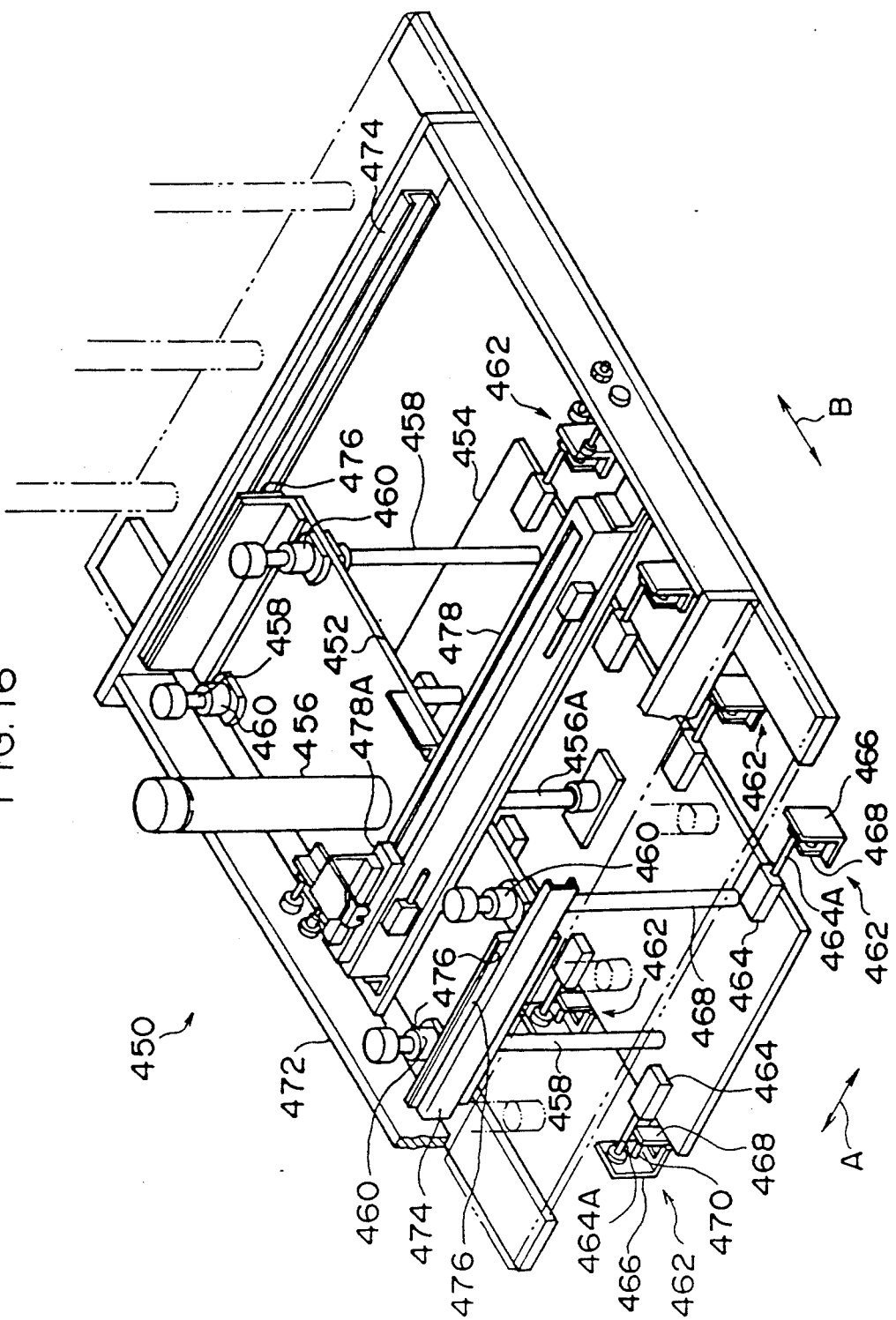
FIG. 16 is a perspective view illustrating a removing device.
Figure 17:
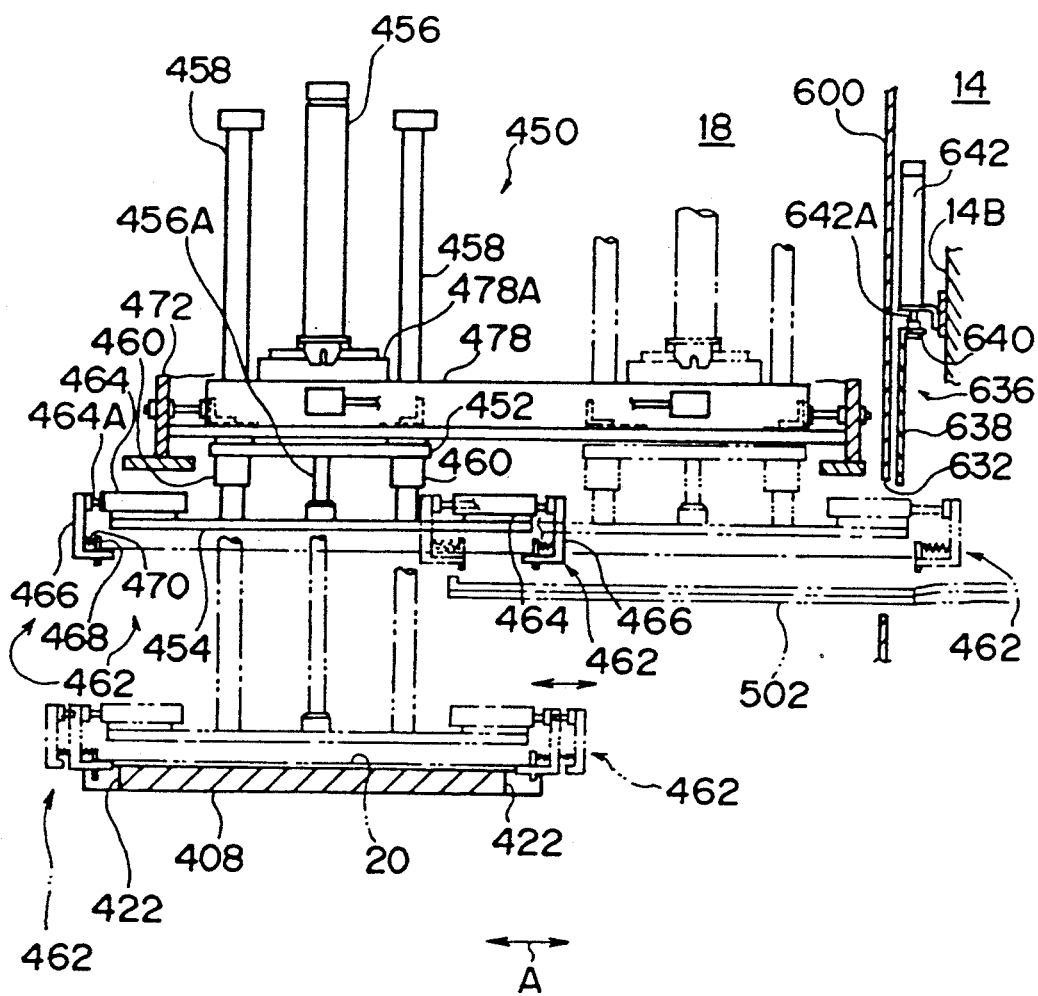
FIG. 17 is a front view illustrating the removing device.

As illustrated in FIG. 17, the removing device 450 is disposed above the moving frame 354 (not shown in FIG. 17) which is above the surface plate 408 in the drawing portion 18 and which has been inserted from the plate supplying portion 12. As shown in FIG. 16, in the removing device 450, a base plate 454 is mounted beneath a moving base 452 which is shaped as a substantially rectangular, flat plate.

An air cylinder 456 is mounted to a central portion of the moving base 452. A driving shaft 456A of the air cylinder 456 penetrates through the moving base 452 and is connected to a central portion of the base plate 454. Guide rods 458 are respectively provided in vicinities of the four corners of the moving base 452. The axial directions of the guide rods 458 are parallel to the axial direction of the air cylinder 456. Intermediate portions of the guide rods 458 are inserted through respective slide bearings 460 mounted to the moving base 452. The lower ends of the guide rods 458 are connected to the base plate 454. Accordingly, by the driving of the air cylinder 456, the base plate 454 is moved parallel to the moving plate 452 in vertical directions.

The base plate 454 is formed as a substantially rectangular, flat plate. The longitudinal direction of the base plate 454 runs along the longitudinal direction of the printing plate 20. Chucks 462, which correspond to the notches 422 of the surface plate 408, are disposed at end portions of the base plate 454 in the transverse direction thereof. Each of the chucks 462 is formed by an air cylinder 464 and a claw portion 466 which is attached to the end of a driving shaft 464A of the air cylinder 464.

The air cylinders 464 of the chucks 462 are mounted to the top surface of the base plate 454 at both transverse end portions thereof. The driving shafts 464A protrude outwardly in the transverse direction of the base plate 454. The claw portions 466 are substantially L-shaped. Intermediate portions of the claw portions 466 face downward, and end portions thereof face inwardly in the transverse direction of the base plate 454. A pushing plate 468 and a compression coil spring 470 are mounted to the interior of the substantial L-shape of the claw portion 466. The pushing plate 468 is urged by the urging force of the compression coil spring 470 along the end portion of the claw portion 466 toward the interior of the base plate 454 in the transverse direction thereof.

The chucks 462, which are provided so as to oppose each other in the transverse direction of the base plate 454, are moved by the driving of the air cylinders 464 in directions in which the claw portions 466 move apart from each other or in directions in which the claw portions 466 are moved apart from each other, the length of the space between the ends of the claw portions 466 is longer than the transverse direction dimension of the printing plate 20. When opposing claw portions 466 are made to approach each other, the length of the distance between the ends of the claw portions 466 is smaller than the transverse direction dimension of the printing plate 20, and the printing plate 20 can be loaded on the top surfaces of the end portions of the claw portions 466. When the printing plate 20 is loaded on the claw portions 466, the pushing plates 468 abut end surfaces of the printing plate 20 in the transverse direction thereof. The transverse direction end surfaces of the printing plate 20 are pushed by the pushing plates 468 so that the printing plate 20 is held between the pushing plates 468.

Figure 18:
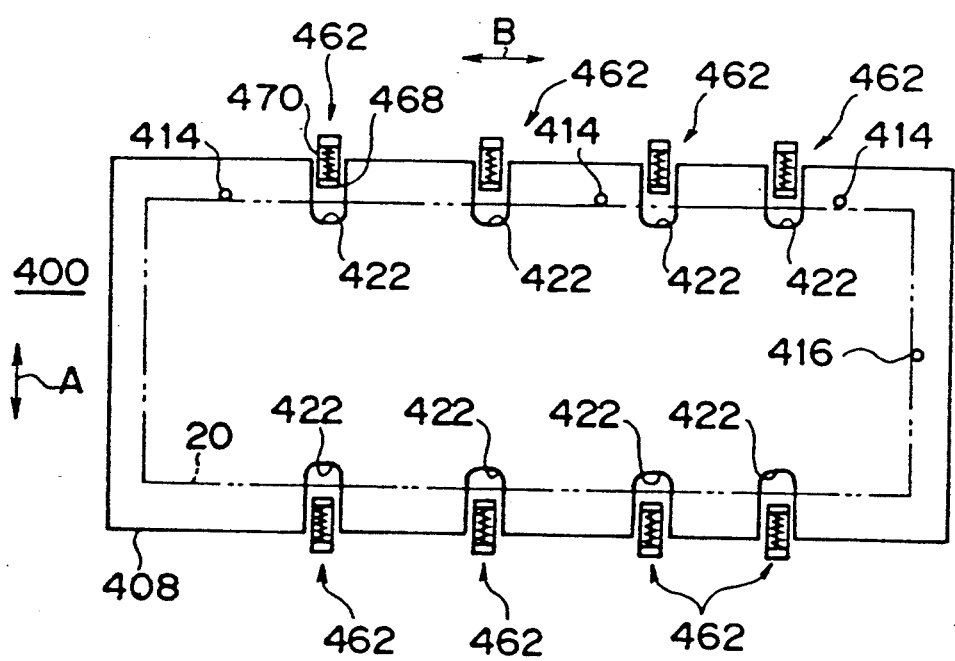
FIG. 18 is a schematic plan view illustrating a surface plate and positions of the chucks.

As shown in FIG. 18, the claw portions 466 of the chucks 462 are positioned in vicinities of the notches 422 of the surface plate 408 due to the lowering of the removing device 450. The claw portions 466 are inserted into the respective notches 422 by the driving of the air cylinders 464. The end portions of the claw portions 466 are disposed beneath the printing plate 20, and the pushing plates 468 are abutted against the transverse direction end surfaces of the printing plate 20. When the base plate 454 is raised from this state by the driving of the air cylinder 456, the printing plate 20 is raised up from the surface plate 408.

As illustrated in FIGS. 16 and 17, the moving base 452 of the removing device 450 is disposed within a frame 472 which is substantially rectangular and which is supported by an unillustrated frame of the drawing portion 18. A pair of guide rails 474 (see FIG. 16) are disposed on the frame 472 along the transverse direction of the printing plate 20. Guide blocks 476, which correspond to the guide rails 474, are provided on the moving base 452. The moving base 452 is supported by the guide blocks 476, which engage with the guide rails 474 so as to be movable.

A rodless cylinder 478 is disposed between the guide rails 474 so as to be parallel to the guide rails 474. Both end portions of the rodless cylinder 478 in the axial direction thereof are fixed to the frame 472. The moving base 452 is connected to a driving portion 478A of the rodless cylinder 478.

The moving base 452 is moved from above the surface plate 408 to the plate discharging portion 14 side by the driving of the rodless cylinder 478. As shown in FIG. 17, portions of the transverse direction end portions of the base plate 454 are inserted within the plate discharging portion 14 due to the movement of the moving base 452. Further, the air cylinders 464 of the chucks 462 of the moving frame 454 are driven so that the claw portions 466 are moved in directions of moving apart from each other. In this way, the printing plate 20 loaded on the claw portions 466 is dropped, and the printing plate 20 is transferred to a conveying stage 502 which will be described later. The standby position of the removing device 450 is the position above the surface plate 408 at which the air cylinder 456 accommodates the driving shaft 456A (the solid line shown in FIG. 17).

Plate Discharging Portion: Conveying Stage

Figure 19:
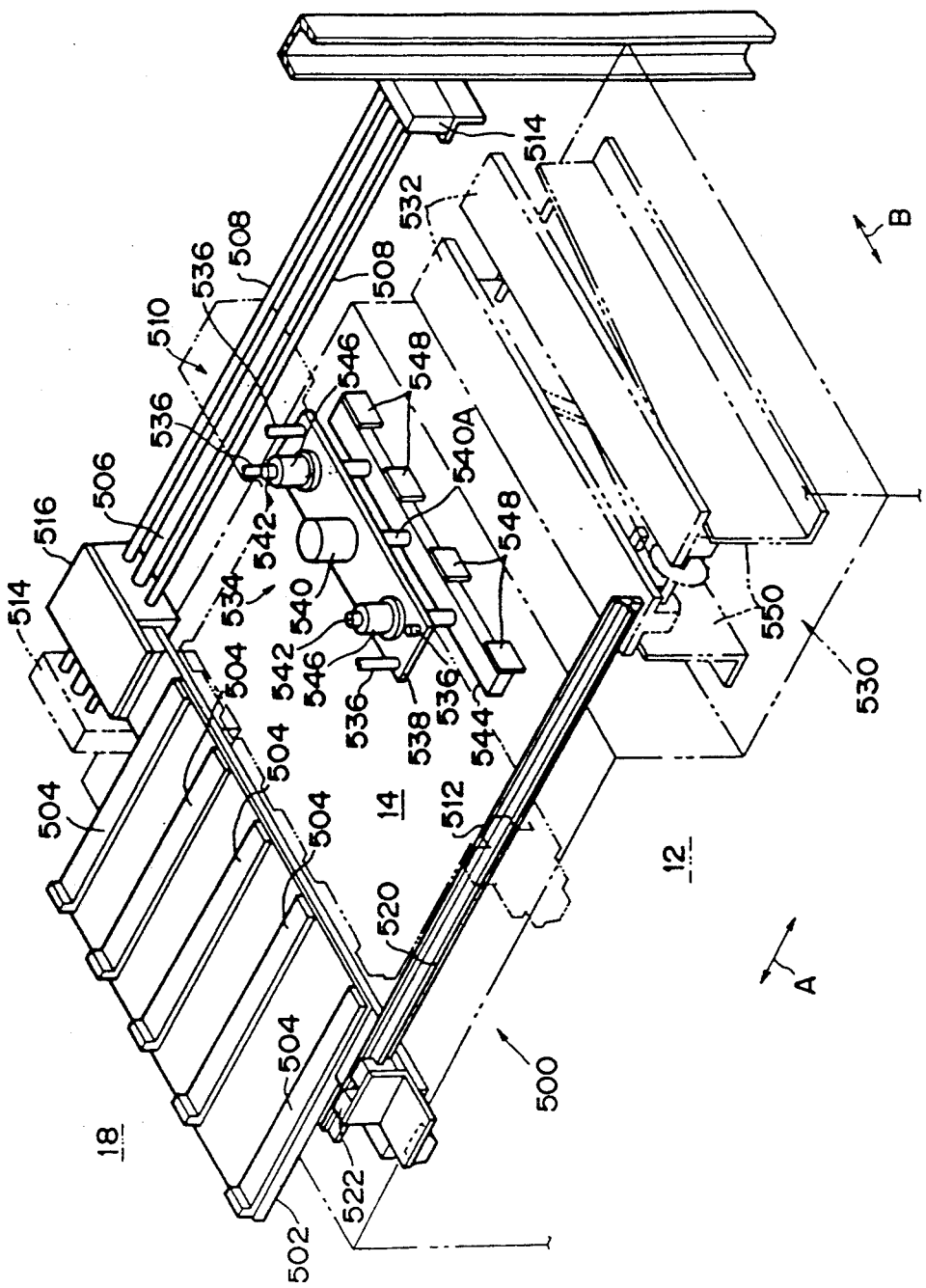
FIG. 19 is a perspective view illustrating a conveying stage.

As shown in FIG. 19, the plate discharging portion 14 is equipped with a conveying device 500 which receives the printing plate 20 from the removing device 450 of the drawing portion 18 and conveys the printing plate 20 within the plate discharging portion 14. A conveying stage 502 is provided in the conveying device 500. The conveying stage 502 is inserted from the interior of the plate discharging portion 14 into the drawing portion 18.

The conveying stage 502 is a substantially rectangular, flat plate. Elongated resin plates 504, which are substantially rectangular, are attached to the top surface of the conveying stage 502 along the transverse direction of the printing plate 20. End portions on the drawing portion 18 side of the resin plates 504 project upward. The removing device 450 is moved above the position at which the conveying stage 502 protrudes into the drawing portion 18. The printing plate 20 transferred from the removing device 450 is loaded onto the upper surface of the conveying stage 502 (the position of the conveying stage 502 shown in FIG. 17). When the printing plate 20 is loaded onto the conveying stage 502, the printing plate 20 is supported by the plurality of resin plates 504 so that the printing plate 20 does not directly contact the metal portions of the conveying stage 502.

The conveying device 500 is equipped with a driving mechanism which moves the conveying stage 502. This driving mechanism includes a driving portion 510, which is formed by a rodless cylinder 506 and a pair of guide rods 508, and a guide rail 512, which is parallel to the rodless cylinder 506 and the pair of guide rods 508. The rodless cylinder 506 and the pair of guide rods 508 are provided along the transverse direction of the printing plate 20 so as to oppose one longitudinal direction end of the printing plate 20.

Both end portions of the rodless cylinder 506 and the pair of guide rods 508 are mounted via brackets 514 to a frame of the plate supplying portion 12. A driving block 516 is provided at axially intermediate portions of the rodless cylinder 506 and the pair of guide rods 508. A slide bearing structure is formed in the moving block 516 so that the intermediate portions of the rodless cylinder 506 and the pair of guide rods 508 are movably inserted in the moving block 516. The moving block 516 is moved by the driving of the rodless cylinder 506.

Guide rails 512 are provided at side opposite the driving portion 510 in the longitudinal direction of the printing plate 20. The guide rails 512 run along the transverse direction of the printing plate 20, are provided parallel to the rodless cylinder 506, and are attached to the frame of the plate discharging portion 14 by an unillustrated spacer or the like. A convex portion 520 is formed in the guide rails 512 along the longitudinal direction thereof. A guide block 522 movably engages with the convex portion 520.

The moving block 516 and the guide block 522 are attached to end portions of the conveying stage 502 along the longitudinal direction of the printing plate 20 at the end portion of the conveying stage 502 opposite to the drawing portion 18 side. Accordingly, when the rodless cylinder 506 is driven, the conveying stage 502 is supported, guided and moved by the pair of guide rods 508 and the guide rails 512. The standby position of the conveying stage 502 is at an intermediate position of the plate discharging device 14 (the position illustrated by the two-dot chain line in FIG. 19).

Insertion Device

Figure 20:
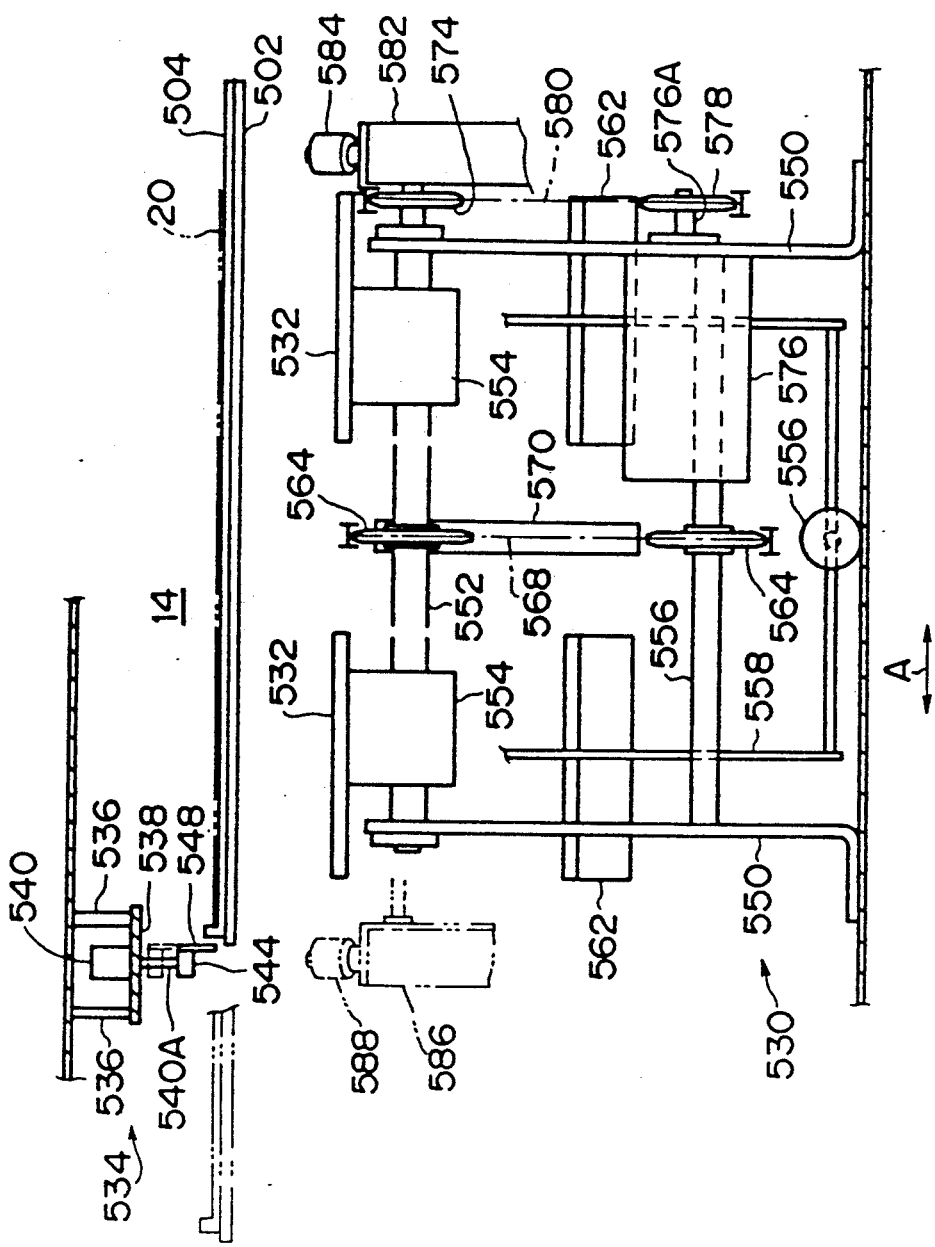
FIG. 20 is a front view illustrating an insertion stage.

As shown in FIGS. 19 and 20, insertion stages 532 of an insertion device 530 are provided beneath a position which is at the side opposite the drawing portion 18 and to which the conveying stage 502, on which the printing plate 20 is loaded, is moved. A moving/loading device 534 is provided above the conveying stage 502.

The moving/loading device 534 includes a supporting base 538, which is mounted to the frame of the plate discharging portion 14 by a plurality of stays 536, and an arm 544, which is provided beneath the supporting base 538. The supporting base 538 is formed as a substantially rectangular, elongated, flat plate. The supporting base 538 is provided at a drawing portion 18 side of the insertion stages 532. The longitudinal direction of the supporting base 538 corresponds to the longitudinal direction of the printing plate 20. The arm 544 is formed as an elongated, bar-shaped member, and is provided such that the longitudinal direction thereof runs along the longitudinal direction of the supporting base 538.

The supporting base 538 is equipped with an air cylinder 540 and a pair of guide rods 542. The air cylinder 540 is attached to the supporting base 538. A driving shaft 540A of the air cylinder 540 penetrates through the supporting base 538 and is connected to an intermediate portion of the arm 544. Intermediate portions of the pair of guide rods 542 are inserted through slide bearings 546 attached to the supporting base 538 such that respective ones of ends of the guide rods 542 are connected to the arm 544. A plurality of substantially rectangular pawls 548 are provided on the arm 544. At least the surfaces of the pawls 548 are formed of a nonconductive member (e.g., resin, ceramic, etc.). The pawls 548 are mounted along the longitudinal direction of the arm 544.

The arm 544 is lowered by the driving of the air cylinder 540 so that the pawls 548 are located above the conveying stage 502 between the resin plates 504 and so that the pawls 548 oppose the end portion on the drawing portion 18 side of the printing plate 20 loaded on the conveying stage 502. In this state, when the conveying stage 502 is moved to its standby position (the position illustrated by the two-dot chain line in FIG. 19), the pawls 548 prevent the printing plate 20 from moving. Therefore, the printing plate 20 is pushed off of the conveying stage 502. Accordingly, the printing plate 20 is loaded onto the insertion stages 532 positioned under the conveying stage 502. The insertion device 530 sends the printing plate 20 loaded on the insertion stages 532 towards the developing portion 22.

Figure 21:
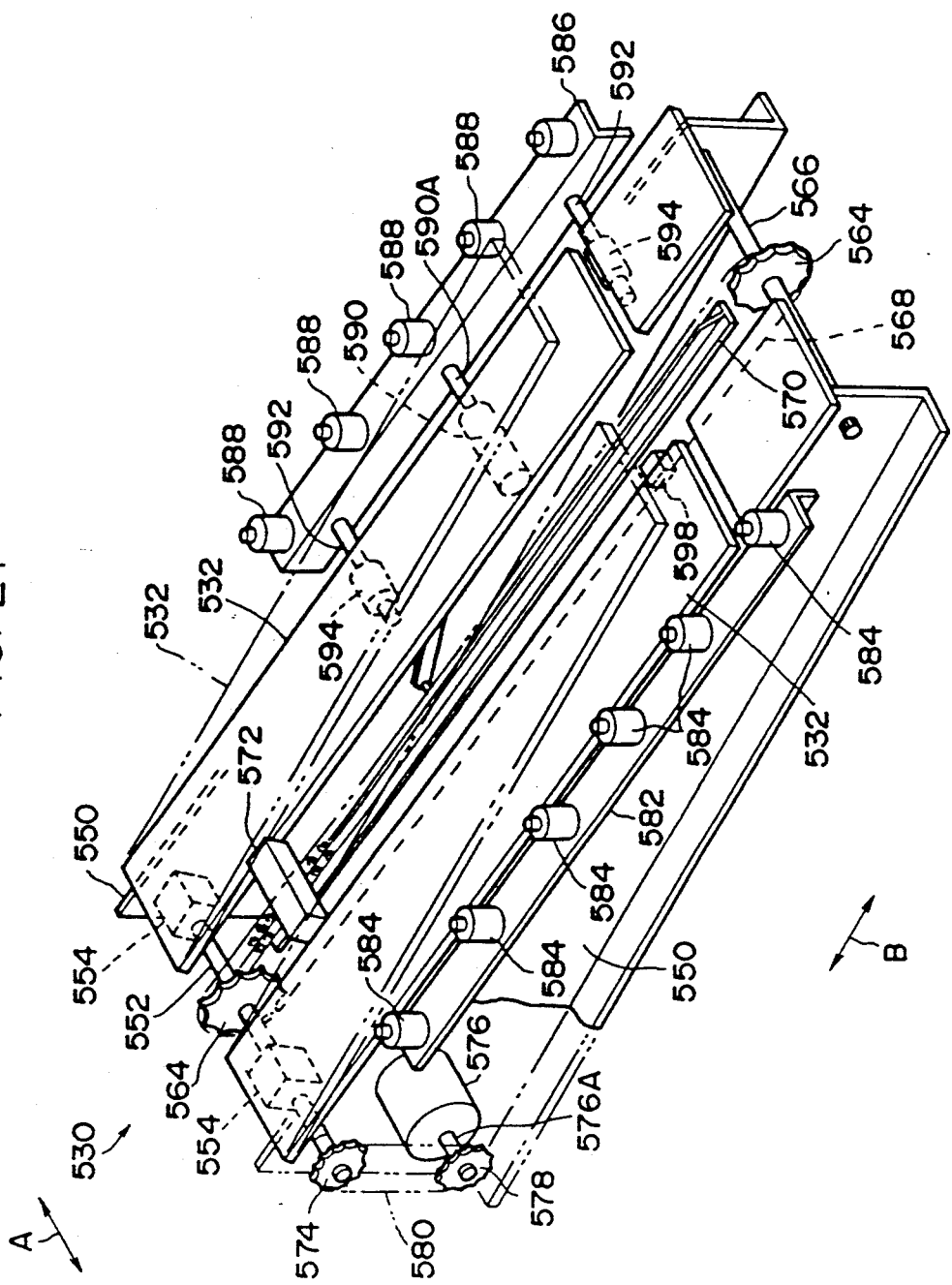
FIG. 21 is a perspective view illustrating the insertion stage.
Figure 23:
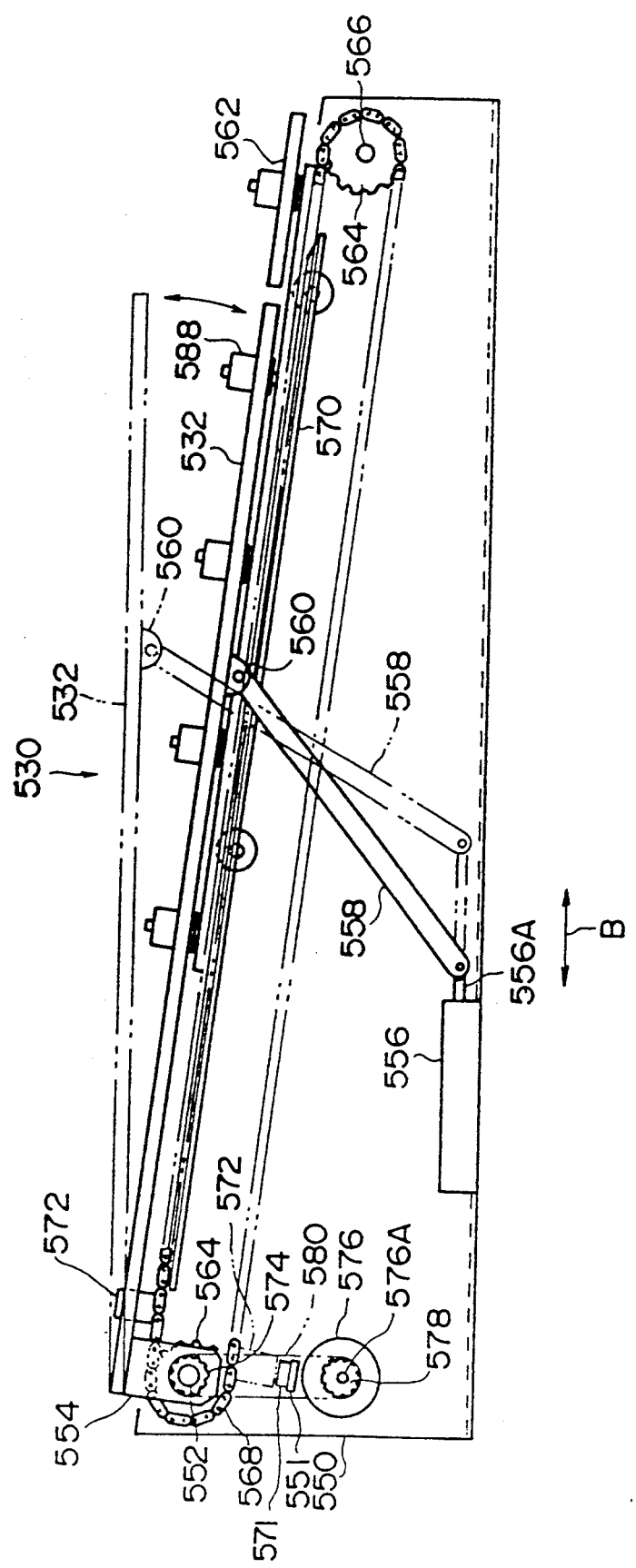
FIG. 23 is a side view illustrating the insertion stage.

As shown in FIGS. 20 and 23, the insertion device 530 is equipped with a pair of side plates 550 which are mounted to the unillustrated frame of the plate discharging portion 14. As illustrated in FIGS. 21 and 23, the pair of side plates 550 are parallel to each other, and are directed toward the developing portion 22. Namely, the pair of side plates 550 are provided along the longitudinal direction of the printing plate 20. The side plates 550 are trapezoidal shapes which are short at the developing portion 22 side and are tall at the side opposite the developing portion 22. Ones of sides of the side plates 550 are inclined towards the developing portion 22.

As shown in FIGS. 20 and 23, the insertion stages 532 are disposed above the pair of side plates 550. The insertion stages 532 are formed as a pair of parallel, elongated, flat plates which are made of resin and whose longitudinal directions are directed toward the developing portion 22. A shaft 552 is suspended between and rotatably supported by vicinities of the top portions of the side plates 550 on the side opposite the developing portion 22. The end portions of the insertion stages 532 on the side opposite the developing portion 22 are pivotably supported by the shaft 552 via brackets 554.

An air cylinder 556 (not shown in FIG. 21) is attached between the pair of side plates 550. A driving shaft 556A of the air cylinder 556 is directed toward the developing portion 22 side. A supporting arm 558 is provided at an end of the driving shaft 556A. The supporting arm 558 is substantially U-shaped, and an intermediate portion thereof is connected to the driving shaft 556A of the air cylinder 556 so as to be pivotable. The end portions of the supporting arm 558 are respectively connected via brackets 560 to the bottom surfaces of longitudinally intermediate portions of the respective insertion stages 532 so as to be pivotable. Accordingly, by the driving of the air cylinder 556, the insertion stages 532 are pivoted about the shaft 552 between a horizontal standby position and an insertion position at which the insertion stages 532 are inclined towards the developing portion 22.

Fixed guides 562 are provided along extensions of the inclined insertion stages 532 at the developing portion 22 side. The fixed guides 562 are provided as a pair so as to correspond to the respective insertion stages 532. The fixed guides 562 are formed as extensions of the inclined insertion stages 532 toward the developing portion 22 side. The angle of inclination of the insertion stages 532 and the fixed guides 562 with respect to the horizontal direction is the same as the angle of inclination of a transport path of a vicinity of an insertion opening of the developing portion 22.

A sprocket 564 is attached between the pair of insertion stages 532 at an intermediate portion of the shaft 552 which is suspended between the side plates 550. A shaft 566 is suspended between and rotatably supported by the pair of side plates 550 under the fixed guides 562. Another sprocket 564 is provided at an intermediate portion of the shaft 566 between the pair of fixed guides 562. A guide rail 570 having a convex cross-sectional configuration is disposed between the shaft 552 and the shaft 566.

A chain 568 is trained around the respective sprockets 564 of the shafts 552, 566. The chain 568 which moves on the upper side between the sprockets 564 is supported by the guide rail 570 and is guided toward the developing portion 22. Namely, the intermediate portion of the chain 568 in the transverse direction thereof is held taught so as to be inside of the convex portion of the guide rail 570. Pushing blocks 572 are disposed on the chain 568. The pushing blocks 572 are moved along with the rotation of the chain 568. The pushing blocks 572 are provided in two places (only one is shown in the drawings). When one of the pushing blocks 572 is moved between the insertion stages 532 towards the fixed guides 562, the other passes downward from a vicinity of the fixed guides 562 and is moved toward the shaft 552 side.

The pushing blocks 572 are detected by a microswitch 571 which is fixed above a stay 551 which is suspended between the side plates 550. Due to the detection of the pushing blocks 572, a motor 576 is stopped (see FIG. 23).

One of the ends of the shaft 552 projects from the side plate 550. A sprocket 574 is disposed on this end of the shaft 552. The motor 576 is provided on one of the side plates 550 beneath the shaft 552. An end of a driving shaft 576A of the motor 576 projects from the side plate 550. A sprocket 578 is attached to this end of the driving shaft 576A. A chain 580 is trained around the sprocket 578 and the sprocket 574 of the shaft 552. Accordingly, the moving blocks 572 are moved between the insertion stages 532 by the rotation of the motor 576.

Figure 22:
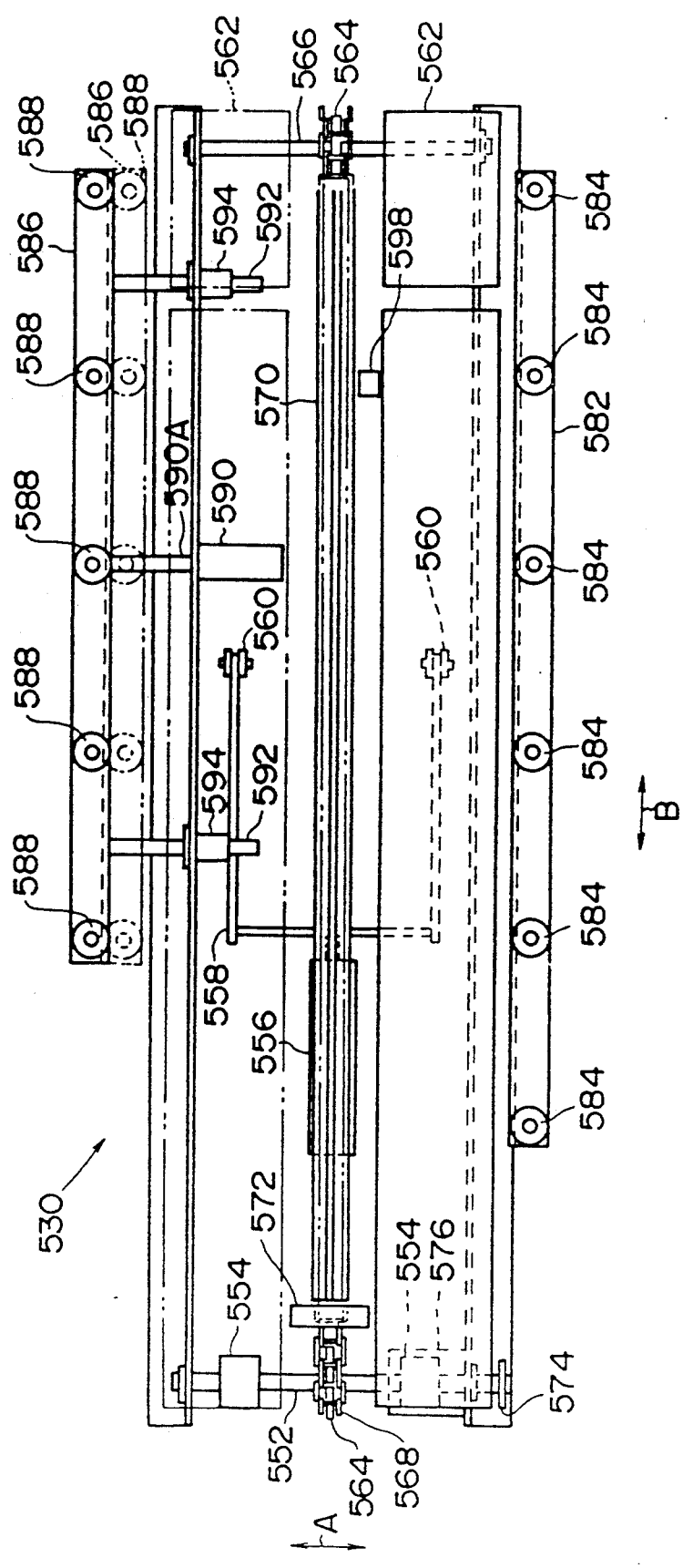
FIG. 22 is a plan view illustrating the insertion stage.

As shown in FIGS. 21 and 22, a bracket 582 is provided on the outer side of one of the side plates 550 of the pair of side plates 550. A plurality of rollers 588 is rotatably supported by the bracket 582 along the inclination of the side plate 550.

Further, a bracket 586 which opposes the bracket 582 is disposed on the outer side of the other side plate 550. A plurality of rollers 584 is rotatably supported by the bracket 586 along the inclination of the side plate 550. The bracket 586 is supported by an air cylinder 590, which is provided on the side plate 550, and by a pair of guide rods 592. An end portion, of a driving shaft 590A of the air cylinder 590, provided on the inner side of the side plate 550 penetrates through the side plate 550 and is connected to the bracket 586. Respective axial directions of the pair of guide rods 592 are parallel to the axial direction of the air cylinder 590. Intermediate portions of the guide rods 592 are inserted through slide bearings 594 mounted to the side plate 550 so as to be movably supported. Ends of the guide rods 592 are connected to the bracket 586.

Accordingly, by the driving of the air cylinder 590, the bracket 586 is moved parallel in directions in which the rollers 588 approach and move apart from the rollers 584 provided on the bracket 582. In this way, the transverse direction end portions of the printing plate 20 loaded on the inclined insertion stages 532 are pushed to abut the rollers 584 of the bracket 582 so that positioning is effected when the printing plate 20 is pushed to the developing portion 22. It is not necessary for the rollers 588 to push the printing plate 20 completely against the rollers 584. It suffices that, when the air cylinder 590 is operated, the rollers 588 are stopped at positions at which the bending and incorrect positioning of the printing plate 20 when the printing plate 20 is inserted into the developing portion 22 are not permitted.

Ceramic coating and the like are used on the outer circumferential surface of the rollers 584, 588 so that the transverse direction end portions of the printing plate 20 are not damaged and so that the printing plate 20 does not directly contact any conductive members. Further, the microswitch 571 is provided at the insertion stages 532 in a vicinity of the guide rail 570. When the printing plate 20 is loaded onto the insertion stages 532, the microswitch 571 is turned on by the printing plate 20 on the insertion stages 532. The microswitch 571 thereby functions to inform the operator that the printing plate 20 is located on the insertion stages 532 when the machine is turned on again after having been stopped due to trouble or the like.

Shutter

Figure 24:
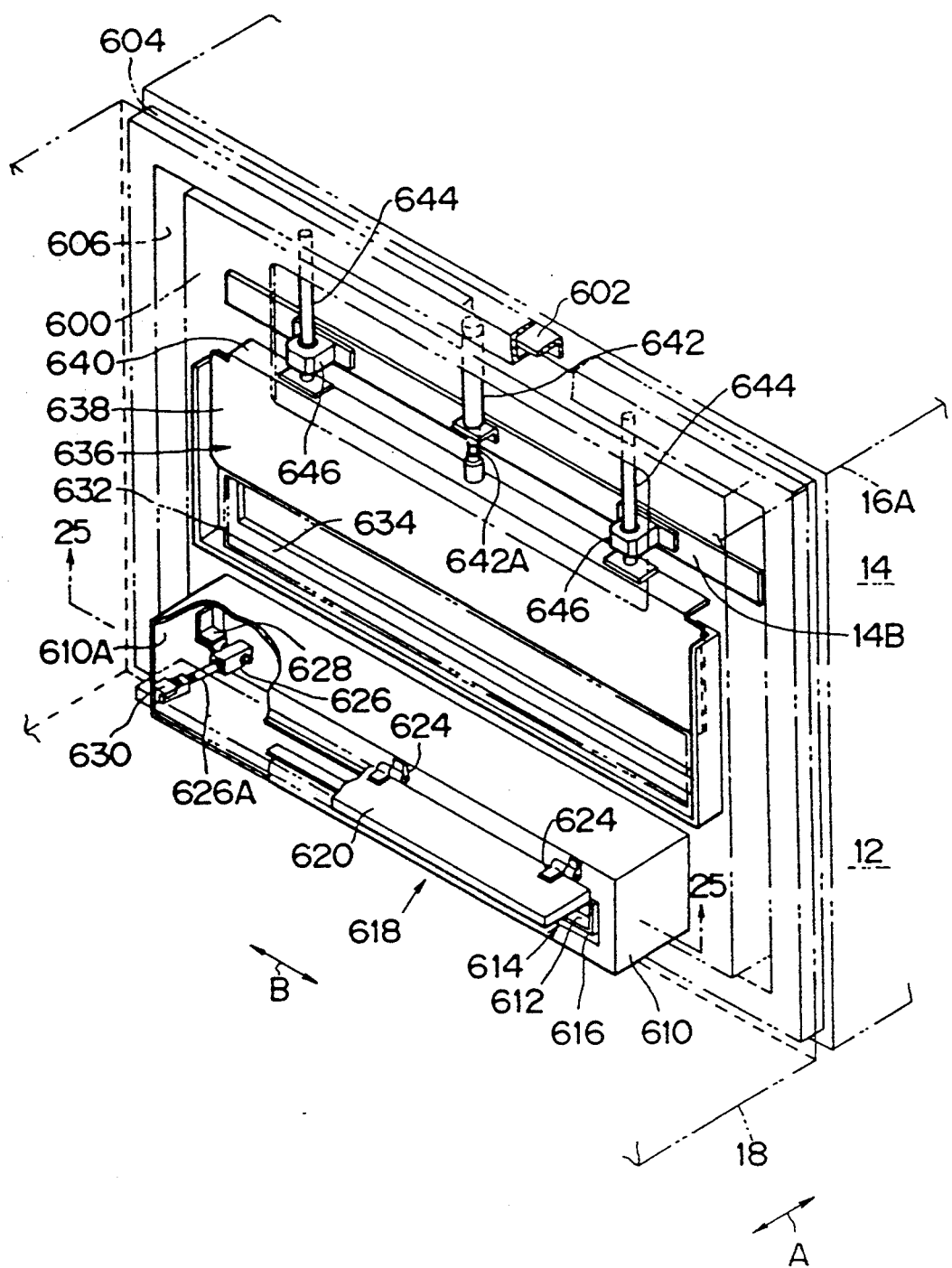
FIG. 24 is a perspective view of main portions of a connecting portion which connects the plate supplying portion and the drawing portion.

As shown in FIG. 24, a casing 16A of the plate supplying/discharging portion 16 is equipped with a connecting portion 600 which is formed so as to protrude in a substantially rectangular configuration towards the drawing portion 18 side. A rib 602 is provided at the periphery of the connecting portion 18 so as to encircle the connecting portion 18 and protrude towards the drawing portion 18.

A groove portion 604, which has a concave portion which opposes the rib 602 of the plate supplying/discharging portion 16, protrudes from a casing 18A of the drawing portion 18. The portion which connects the plate supplying/discharging portion 16 and the drawing portion 18 is shaded by the insertion of the rib 602 into the groove portion 604. A connecting opening 606, into which the connecting portion 600 of the plate supplying/discharging portion 16 is inserted, is formed in the casing 18A at the inner side of the groove portion 604. The connecting portion 600 of the plate supplying/discharging portion 16 is inserted into the connecting opening 606 of the drawing portion 18 and is connected.

Figure 25:
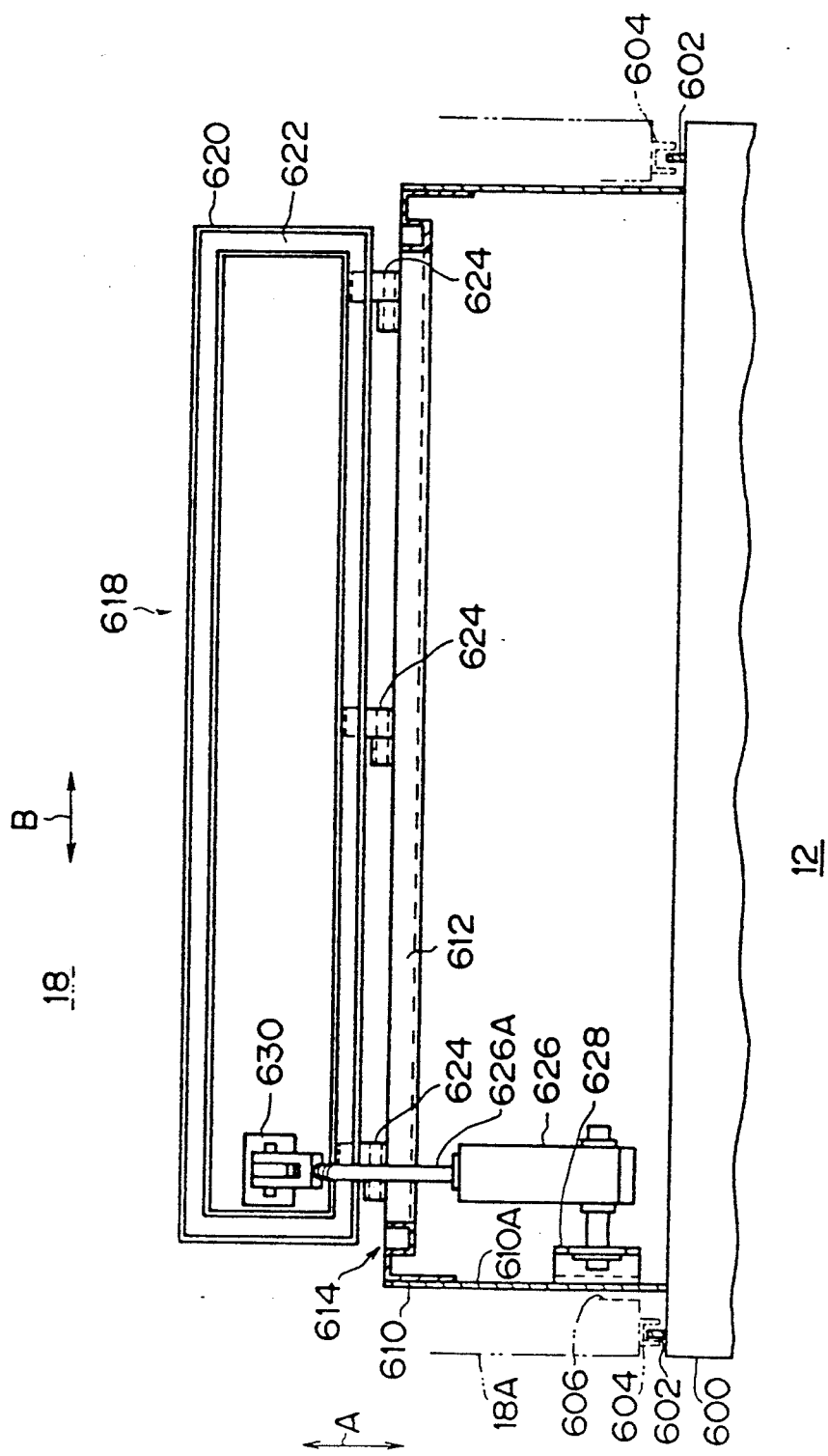
FIG. 25 is a sectional view of main portions taken along line 25—25 of FIG. 24.

As shown in FIG. 25, a protruding portion 610 is provided at the bottom portion of the connecting portion 600 of the plate supplying/discharging portion 16. The protruding portion 610 is formed as a rectangular box. The plate supplying portion 12 side of the protruding portion 610 is open so that the protruding portion 610 communicates with the interior of the plate supplying portion 12. Further, a plate supplying opening 612 which is rectangular is formed in the surface of the protruding portion 610 on the drawing portion 18 side. The interior of the drawing portion 18 and the interior of the plate supplying portion 12 are thereby communicated.

The plate supplying opening 612 is formed within a concave portion 614 formed in the protruding portion 610. A rib 616 is formed on the outer peripheral edge portion of the plate supplying opening 612 so as to protrude toward the outside (toward the drawing portion 18 side).

The plate supplying opening 612 is opened and closed by a shutter 618. A lid 620 and a groove portion 622 are provided at the shutter 618. The lid 620 is a flat plate which is shaped so as to cover the concave portion 614 of the protruding portion 610. The groove portion 622, which is disposed at the peripheral portion of the inner surface of the lid 620, includes a concave portion into which the rib 616 of the plate supplying opening 612 is inserted. The lid 620 is connected to the protruding portion 610 above the concave portion 614 in a vicinity of the insertion opening 612 in a plurality of places by hinges 624. The lid 620 pivots about the hinges 624. When the rib 616 is inserted into the groove portion 622, the plate supplying opening 612 is closed. In this state, the plate supplying portion 12 and the drawing portion 18 are shaded.

An air cylinder 626 is disposed at an inner wall 610A of the protruding portion 610. The rear end side of the air cylinder 626 is rotatably supported to the inner wall 610A by a bracket 628. The end of a driving shaft 626A of the air cylinder 626 is swingably supported by a bracket 630 provided on an inner side of the lid 620. Accordingly, the lid 620 is swung by the driving of the air cylinder 626 so that the shutter 618 opens and closes the plate supplying opening 612. When the plate supplying opening 612 is open, the lid 620 is substantially horizontal, and the moving frame 354 of the horizontally conveying device 106 can be inserted through the plate supply opening 612.

As shown in FIG. 24, the drawing portion 18 and the plate discharging portion 14 are communicated by a plate discharge opening 632. The plate discharge opening 632 is provided substantially horizontally above the protruding portion 610 of the connecting portion 600 and is an open, elongated rectangle. A shutter guide 634 is provided at the inner surface of a vicinity of the plate discharge opening 632 from the lower side of a periphery of the plate discharge opening 632 upwardly along the periphery of the plate discharge opening 632.

A lid 638, which is shaped as a substantially rectangular, flat plate and which forms the shutter 636, is inserted in the shutter guide 634 so as to be slidable in vertical directions. As shown in FIG. 17, a flange 640, which is bent towards the plate discharging portion 14, is provided at an upper end portion of the lid 638. A pair of guide rods 644 and an air cylinder 642, which is interposed between the guide rods 644, are disposed above the flange 640. The air cylinder 642 is provided such that the axial direction thereof is the vertical direction, and is attached to the frame 14B of the plate discharging portion 14. The end of a driving shaft 642A of the air cylinder 642 is connected to the flange 640 of the lid 638. Intermediate portions of the guide rods 644 are inserted through slide bearings 646 attached to the frame 14B. The guide rods 644 are parallel to the axial direction of the air cylinder 642.

Accordingly, the lid 638 is moved by the driving of the air cylinder 642 so that the shutter 636 opens and closes the plate discharge opening 632. When the plate discharge opening 632 is closed by the shutter 636, the lid 638 and the shutter guide 634 overlap, and the space between the plate discharging portion 14 and the drawing portion 18 is shaded. Further, when the plate discharging opening 632 is open, the removing device 450 can be inserted therethrough from the drawing portion 18 side, and the conveying stage 502 can be inserted therethrough from the plate discharging portion 14 side.

The control portion 1050 is accommodated in an upper portion of the plate supplying/discharging portion 16. As shown in FIG. 11, the control portion 1050 is formed by a negative pressure control portion 1054, an air control portion 1056, and an electric control portion 1058 being connected to the control circuit 1052. The negative pressure control portion 1054 controls the operation of each of the suction cups of the negative pressure supplying means 150, 230 and the like. The air control portion 1056 controls the moving and the like of each member of the air supplying means 190, 232, 234 and the like. The electric control portion 1058 controls the operation of the electric driving means of the motor 312 and the like. The operations of the plate supplying portion 12 and the plate discharging portion 14 are controlled by the control portion 1050.

The developing/fixing portion 22 includes the developing processing portion 24 and the fixing processing portion 26. In the developing processing portion 24, toner is applied to the photosensitive surface of the printing plate 20. The toner other than that applied so as to correspond to the electrostatic latent image formed on the photosensitive surface, i.e., the unnecessary toner, is squeezed out of the printing plate 20. In the fixing processing portion 26, the toner adhering to the image portions is heated by a fixing lamp and then cooled. In the developing processing portion 24, the toner is applied to the printing plate 20 and an image is formed thereon in accordance with the electrostatic image on the photosensitive surface. In the fixing processing portion 26, by heating the toner particles adhering to the photosensitive surface, the toner particles are fixed as an image on the photosensitive surface.

In the present embodiment, a reversal developing method is used as the developing method in the developing/fixing portion 24. For example, toner having plus charges is applied to the photosensitive surface of the printing plate 20 on which the non-image portions are charged plus in the drawing portion 18. Further, in the developing/fixing portion 24, when toner particles are applied to the photosensitive surface of the printing plate 20, they are applied so as to flow on the surface of the printing plate 20. As described above, by inclining the insertion stages 532 of the plate discharging portion 14, toner is applied as the printing plate 20 is conveyed in a state in which it is inclined uniformly at a predetermined angle. Therefore, the toner particles flow evenly on the surface of the printing plate 20, and the toner is applied uniformly to the photosensitive surface.

The eluting portion 28 is disposed downstream of the developing/fixing portion 22. In the eluting portion 28, an alkali solution is applied to the printing plate 20 on which a toner image is formed, and etching processing is effected. In this way, the non-image portions of the printing plate 20, i.e., portions of the OPC layer other than those to which the toner has fixed, are eluted. Thereafter, the alkali solution applied to the surface of the printing plate 20 and the eluted OPC layer are washed off, and a gum solution is applied to protect the surface of the plate. After the gum solution is applied, the printing plate 20 is dried in the drying portion 30.

The dried printing plate 20 is sent to a preliminary registering portion 32. In the preliminary registering portion 32, the position of the printing plate 20 is corrected so that the central portion in the longitudinal direction of the printing plate 20 sent from the eluting portion 28 corresponds to the center in the transverse direction of the transport path of the punching portion 34 downstream. The printing plate 20 is then sent to the punching portion 34.

The transverse direction of the printing plate 20 is positioned in a substantially central portion of the punching portion 34, and then the printing plate 20 is stopped. Then, the longitudinal direction of the printing plate 20 is positioned. Notches are formed in one longitudinal direction end portion of the printing plate 20, and circular holes or circular holes and notches are formed in the other longitudinal direction end portion. Two positioning pins are provided for transverse direction positioning, and one positioning pin is provided for longitudinal direction positioning. These pins have the same positional relationship as that of the pins provided at the surface plate 408 of the drawing portion 18. Accordingly, the punching process can be carried out with excellent precision with respect to the drawn design. The notches and circular holes are used for positioning so that the plate can be bent precisely at the plate bending portion. The notches are used for positioning when the printing plate 20 is loaded at the rotary cylinder of a rotary press.

The printing plate 20, in which the notches and circular holes have been punched at the punching portion 34, is sent to the plate bending portion 36. At the plate bending portion 36, pins are inserted into the circular holes and into the notches at another end so as to position the printing plate 20. Bending processing for loading the printing plate 20 at the rotary cylinder of the rotary press is carried out. After the printing plate 20 has been subjected to the plate bending process, the printing plate 20 is discharged from the plate bending portion 36 and is stored. The positioning method does not necessarily require inserting pins into the circular holes and the notches; a method in which the printing plate 20 is positioned by abutting on positioning pins, as in the punching portion, may be used. In this case, positioning can be effected precisely by disposing the positioning pins in the same positional relationship as the positioning pins in the punching portion.

Next, the operation of the present embodiment will be described in accordance with the flowcharts in FIGS. 26 through 32.

Figure 26:
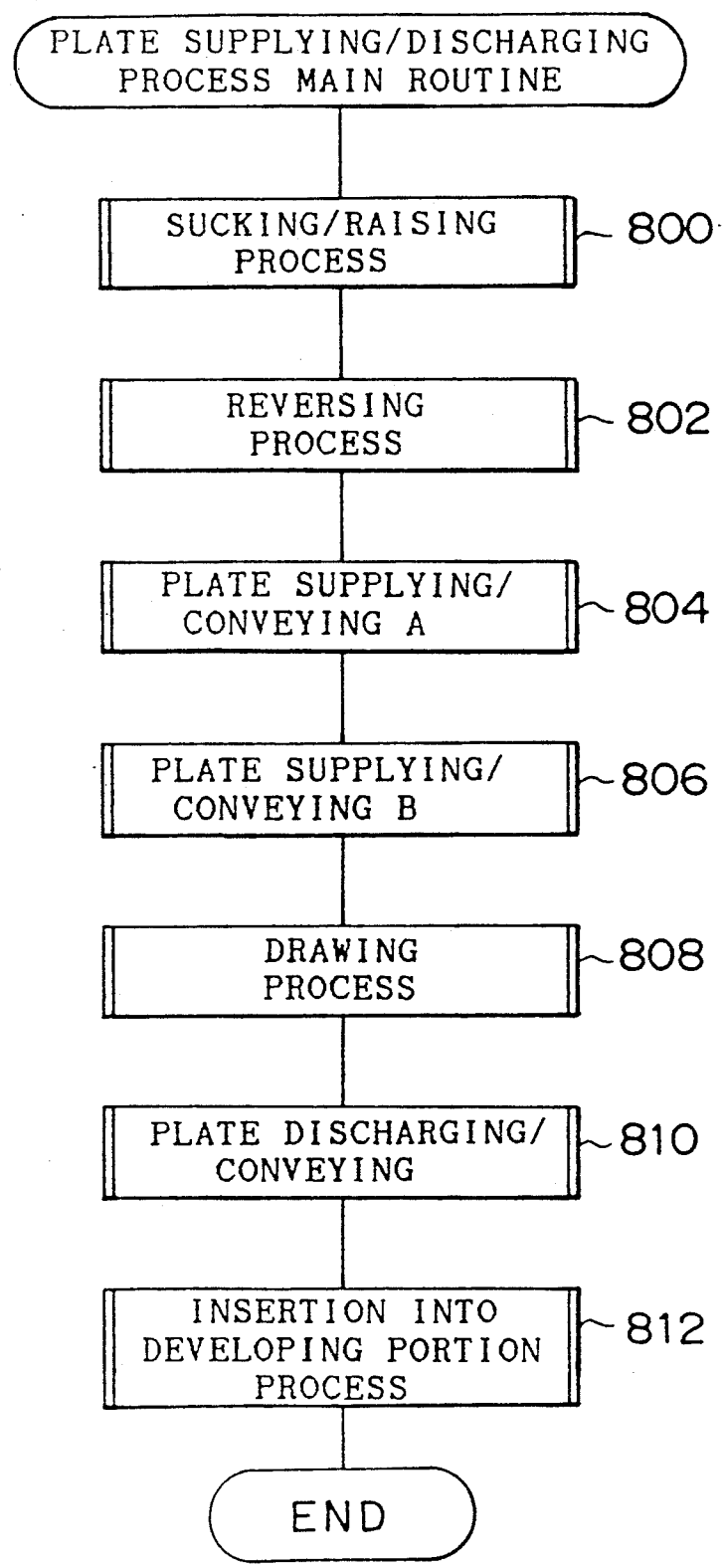
FIG. 26 is a flowchart illustrating operation of the plate supplying portion.

FIG. 26 illustrates the main routine of a flowchart showing the operation of the plate supplying/discharging portion 16 relating to the present embodiment. In step 800 of the main routine, the printing plate 20 is removed from the skid 38 by the sucking/raising device 102 of the plate supplying portion 12. The supporting frame 110 of the sucking/raising device 102 is at its standby position above the skid 38.

Figure 27:
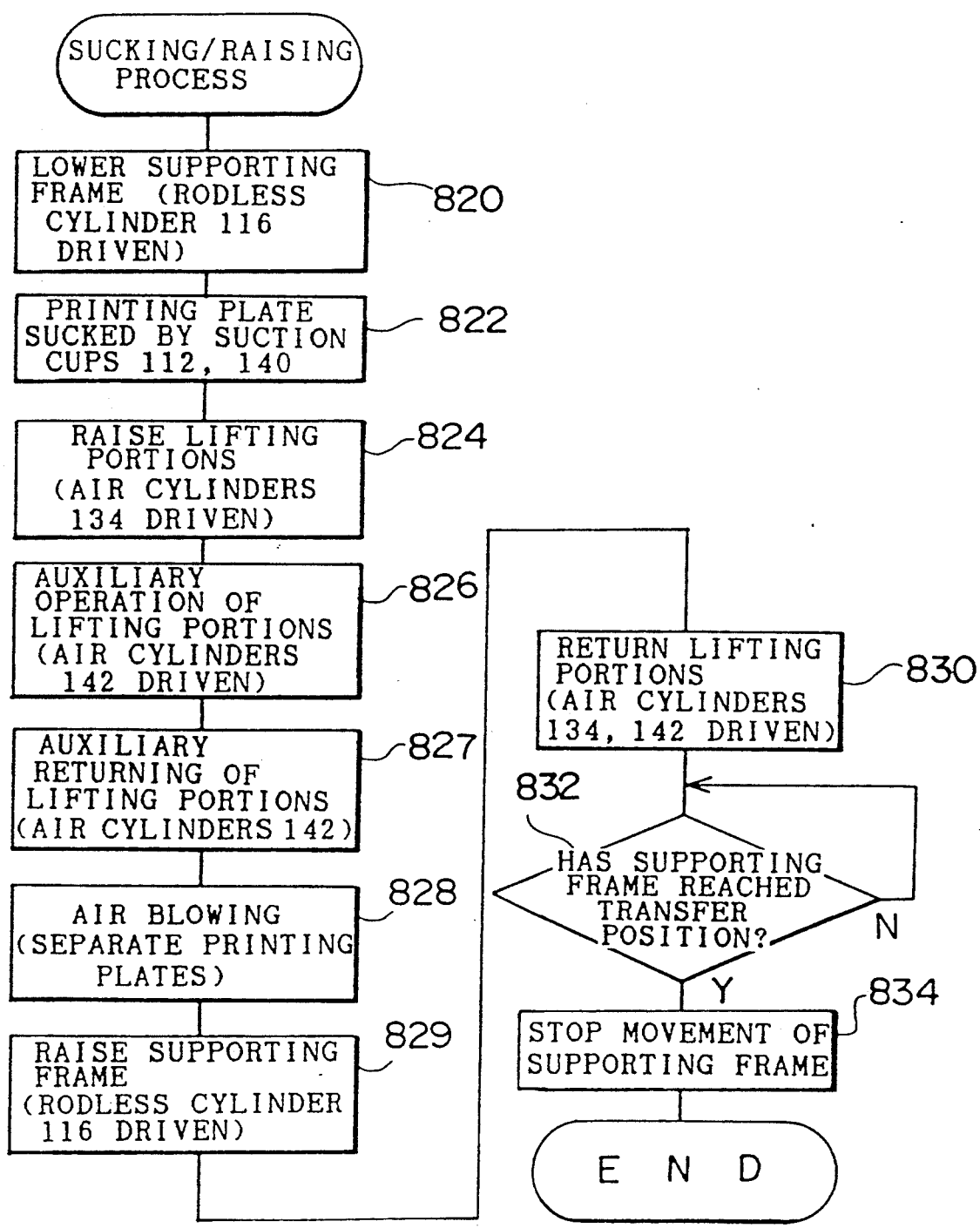
FIG. 27 is a flowchart illustrating operation of the sucking/raising device.

FIG. 27 illustrates a sucking/raising process routine. In step 820, in the sucking/raising device 102, the rodless cylinder 116 is driven, and the supporting frame 110 is lowered. This lowering is effected until the plate detecting sensor 146 abuts on the topmost printing plate 20 on the skid 38. When the lowering of the supporting frame 110 is stopped, the suction cups 112, 140 and the blocks 144 of the supporting frame 110 contact the topmost printing plate 20. In step 822, the negative pressure supplying means 150 is operated, and the upper surface of the printing plate 20 is sucked by the suction cups 112, 140. Because the photosensitive surface of the printing plate 20 faces downward, the suction cups 112, 140 suck the back surface, i.e., the surface opposite the photosensitive surface, of the printing plate 20. The order in which steps 820 and 822 are executed may be reversed.

In step 824, the air cylinders 134 of the lifting portions 130 are driven. The suction cups 140 in the vicinities of the four corners of the printing plate 20 suck and lift up the printing plate 20. In step 826, the air cylinders 142 are driven, and the end portions of the printing plate 20 lifted by the suction cups 140 are pressed downward. In step 827, the air cylinders 142 are returned to their standard position. Thereafter, in step 828, air is blown by the air blow nozzles 148 between the topmost printing plate 20 and the printing plate 20 thereunder. In this way, the topmost printing plate 20 and the printing plate 20 adhering to the bottom surface of the topmost printing plate 20 are separated. In step 829, the rodless cylinder 116 is driven and the supporting frame 110 is raised. In step 830, the driving shafts 134A of the air cylinders 134 of the lifting portions 130 are accommodated within the respective main bodies of the air cylinders 134. Air may be blown between the topmost printing plate 20 and the printing plate 20 thereunder when the frame 110 is raised as well.

In step 832, a determination is made as to whether the supporting frame 110 has been raised to the printing plate transfer position (the standby position) at which the printing plate 20 is transferred to the reversing device 104. If the answer to the determination in step 832 is "Yes", in step 834, the driving of the rodless cylinders 116 is stopped. In this way, the printing plate 20 supported by the supporting frame 110 reaches the printing plate transfer position at which the printing plate 20 is transferred to the reversing device 104.

Figure 28:
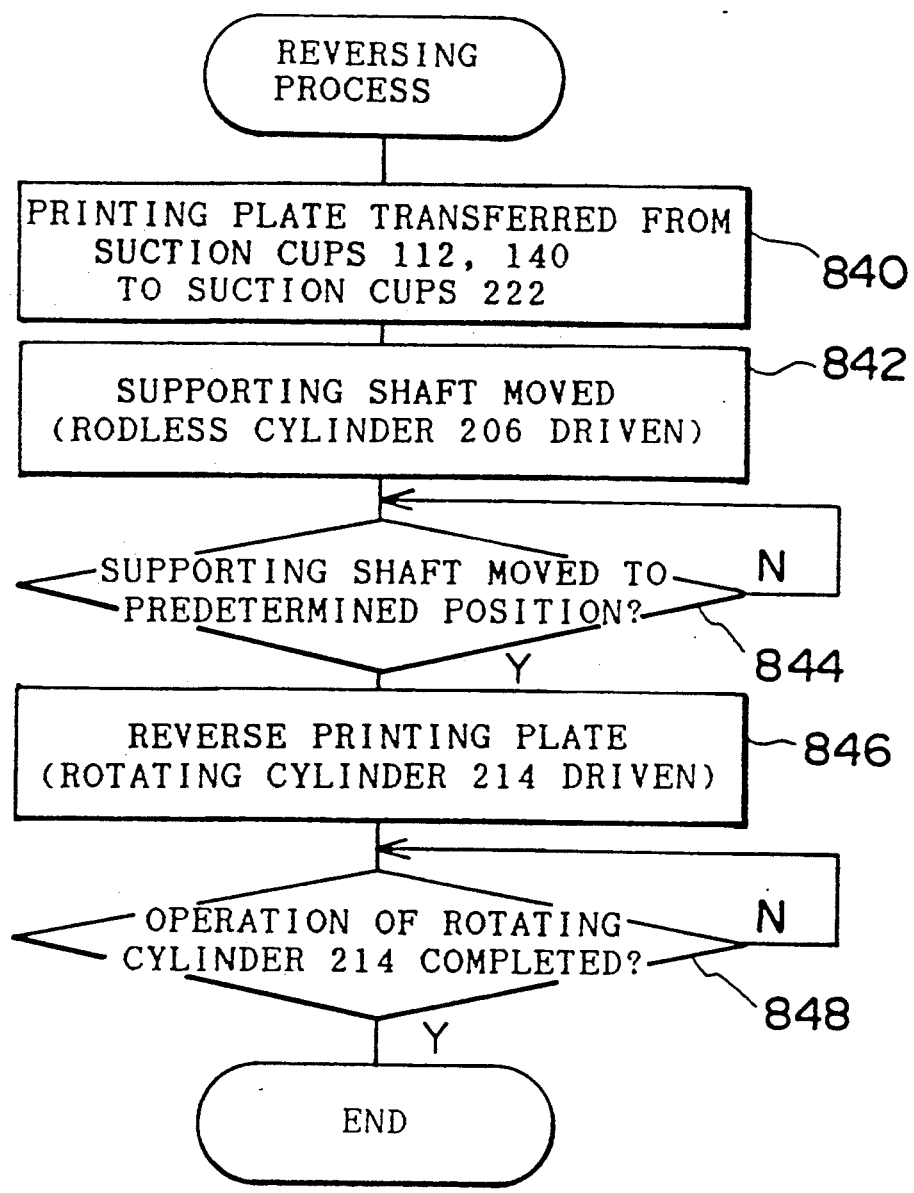
FIG. 28 is a flowchart illustrating operation of a reversing device.

Step 802 of the main routine is the reversing process which will described in detail in accordance with the flowchart in FIG. 28. In the reversing process, the printing plate 20 sucked by the sucking/raising device 102 is reversed by the reversing device 104 and is loaded onto the lift stand 300. At this time, the lift stand 300 is moved to its standby position.

In step 840, the negative pressure supplying means 230 is operated. The transverse direction end portions of the printing plate 20, which is sucked and held by the suction cups 112, 140 of the sucking/raising device 102, are sucked by the suction cups 222. The back surface, i.e., the surface opposite the photosensitive surface, of the printing plate 20 faces upward. Therefore, the back surface of the printing plate 20 is sucked by the respective suction cups of the sucking/raising device 102 and the reversing device 104. Accordingly, traces of the suction cups and the like are not left on the photosensitive surface of the printing plate 20. Thereafter, the operation of the negative pressure supplying means 150 is stopped, and the sucking of the printing plate 20 by the suction cups 112, 140 is released. Accordingly, the reversing device 104 holds the printing plate 20 on one side by the suction cups 222.

In step 842, the air supplying means 190 is operated, and the rodless cylinder 206 is driven. The supporting shaft 212 is moved toward the lift stand 300 side. In this way, the supporting shaft 212 moves to the end portion of the lift stand 300 side. At this time, the lift stand 300 is positioned at its standby position, i.e., at the lowest position of its range of movement. In step 844, when a determination is made that the supporting shaft 212 has moved to the receiving position at which the printing plate 20 is transferred to the lift stand 300, in step 846, the air supplying means 234 is operated. The rotating cylinder 214 is driven, and the supporting shaft 212 and the suction cups 222 are rotated in the direction of arrow C. In this way, the printing plate 20, which is held in a state in which one end thereof is being sucked by the suction cups 222 and in which the photosensitive surface thereof faces downward, is rotated around the supporting shaft 212 disposed at a vicinity of the one sucked end of the printing plate 20. The photosensitive surface is thereby reversed so as to face upward.

In step 848, a determination is made as to whether the rotation of the supporting shaft 212 and the suction cups 222 is completed. If the answer to the determination in step 848 is "Yes", the reversing process is completed and the routine ends.

Figure 29:
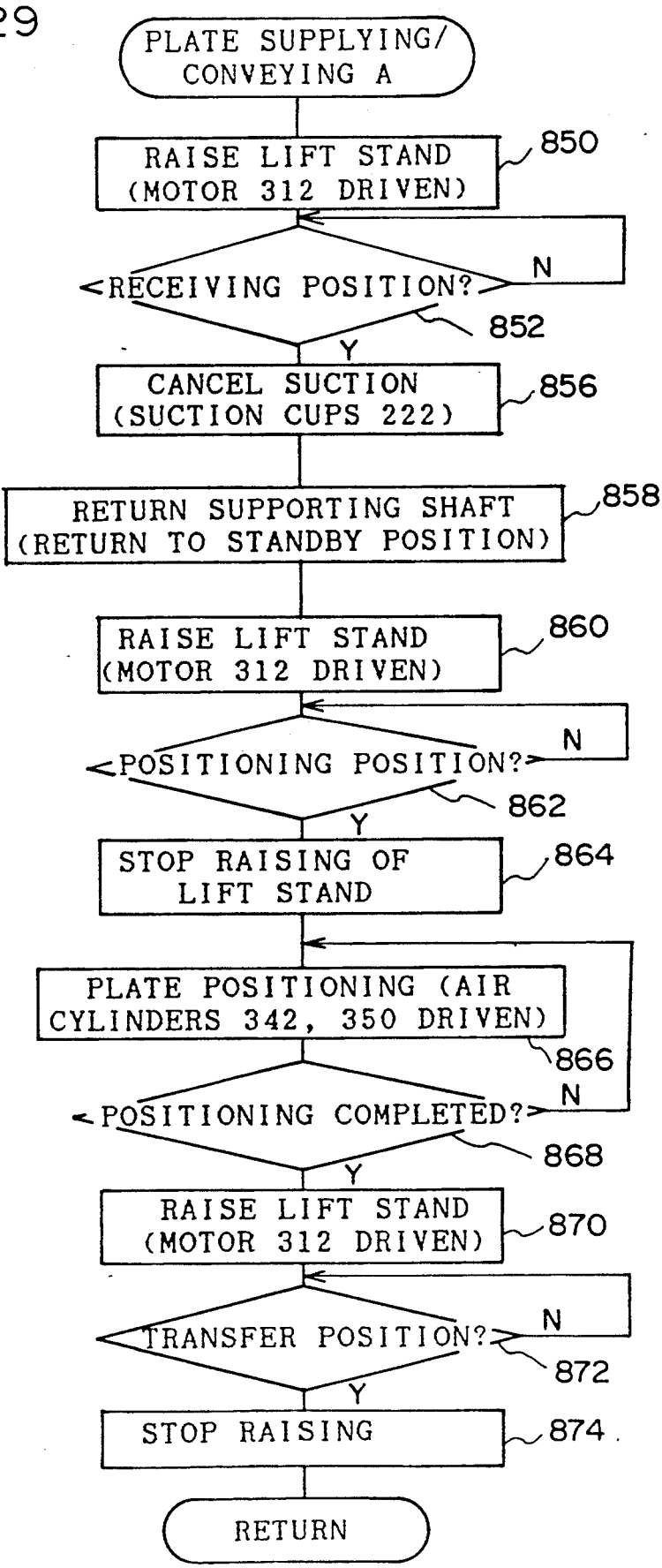
FIG. 29 is a flowchart illustrating operation of the lifting stand.

Step 804 of the main routine is the plate supplying-/conveying routine A which is described in detail in the flowchart in FIG. 29. In step 850, the motor 312 is driven, and the lift stand 300 is raised. Thereafter, the other end of the printing plate 20, which is now positioned so that the photosensitive surface thereof faces substantially upward, contacts the upper surface of the lift stand 300. As the lift stand 300 is raised, the portion of the printing plate 20 from the other end to the intermediate portion is loaded onto and supported by the lift stand 300.

In step 852, the signal output from the sensor 336B is monitored, and a determination is made as to whether the lift stand 300 has been raised to the printing plate receiving position. If the answer to the determination in step 852 is "Yes", in step 856, the operation of the negative pressure supplying means 230 is stopped, and the supply of negative pressure to the suction cups 222 is canceled. The printing plate 20 is thereby transferred to the lift stand 300. At this time, the photosensitive surface of the printing plate 20 faces upward, and the portion of the printing plate 20 from the end portion at the side opposite the side sucked by the suction cups 222 to a vicinity of the intermediate portion is loaded onto the lift stand 300. Because the printing plate 20 is substantially horizontal, even if the sucking by the suction cups 222 is canceled, there will be no great shock to the printing plate 20. The printing plate 20 is loaded onto the lift stand 300 at a substantially uniform position, and the reversing process of the printing plate 20 is thereby completed.

The lift stand 300, which has received the reversed printing plate 20, continuously moves upward without stopping. When the determination made in step 852 as to whether the lift stand 300 has been raised to the printing plate receiving position is positive, it suffices that the lift stand 300 is stopped once, and thereafter, the suction of the printing plate 20 by the suction cups 222 is canceled.

In subsequent step 858, the return of the supporting shaft 212 is indicated. In accordance with this indication, the rodless cylinder 206 is driven, and the reversing device 104 is returned to its standby position at the sucking/raising device 102 side. Further, the rotating cylinder 214 is driven, and the supporting shaft 212 is rotated 180 degrees in the direction opposite to the direction of arrow C in FIG. 5 so that the ends of the suction cups 222 face downward. In step 860, the motor 312 is driven again, and the lift stand 300 is raised. In this way, the supporting shaft 212 is returned, and from step 860 on, the conveying of the printing plate 20 by the lift stand 300 is effected.

Namely, in step 862, the signal output from the sensor 336C is monitored, and a determination is made as to whether the lift stand 300 has been raised to the positioning position. If the answer to the determination in step 862 is "Yes", in step 864, the driving of the motor 312 is stopped once. In step 866, the air cylinders 350 are driven, and the printing plate 20 is pushed along the transverse direction thereof by the rollers 352 and abuts the roller 332 provided on the lift stand 300. Further, the air cylinder 342 provided on the lift stand 300 is driven, and the printing plate 20 is pushed along the longitudinal direction thereof by the roller 340 toward the roller 334. In this way, the printing plate 20 is positioned at a predetermined position on the lift stand 300.

In step 868, a determination is made as to whether the positioning of the printing plate 20 has been completed. The completion of the positioning is verified by a plate detecting sensor, e.g., a magnetic sensor, provided on the lift stand 300. When the positioning of the printing plate 20 with respect to the lift stand 300 has been completed (i.e., when the answer to the determination in step 868 is "Yes"), in step 870, the motor 312 is driven, and the lift stand 300 is raised. In step 872, a signal output from the sensor 336D is monitored, and a determination is made as to whether the lift stand 300 has been raised to the printing plate transfer position. When the lift stand 300 is raised to the printing plate transfer position at which the lift stand 300 opposes the moving frame 354 of the horizontally conveying device 106, the determination in step 872 is positive. In step 874, the moving of the lift stand 300 is stopped, and the process is completed.

Because the surface of the printing plate 20 opposite the photosensitive surface faces upward, the sucking-/raising device 102 and the reversing device 104 can suck the surface opposite the photosensitive surface of the printing plate 20. As a result, traces of the suction cups and the like do not remain on the photosensitive surface of the printing plate 20.

In step 806 of the main routine, the printing plate 20 is transferred from the lift stand 300 to the horizontally conveying device 106 which then conveys the printing plate onto the surface plate 408 of the drawing portion 18. At the upper standby position of the lift stand 300, the claw portions 372 and the pins 376 of the chucks 356 are open.

Figure 30:
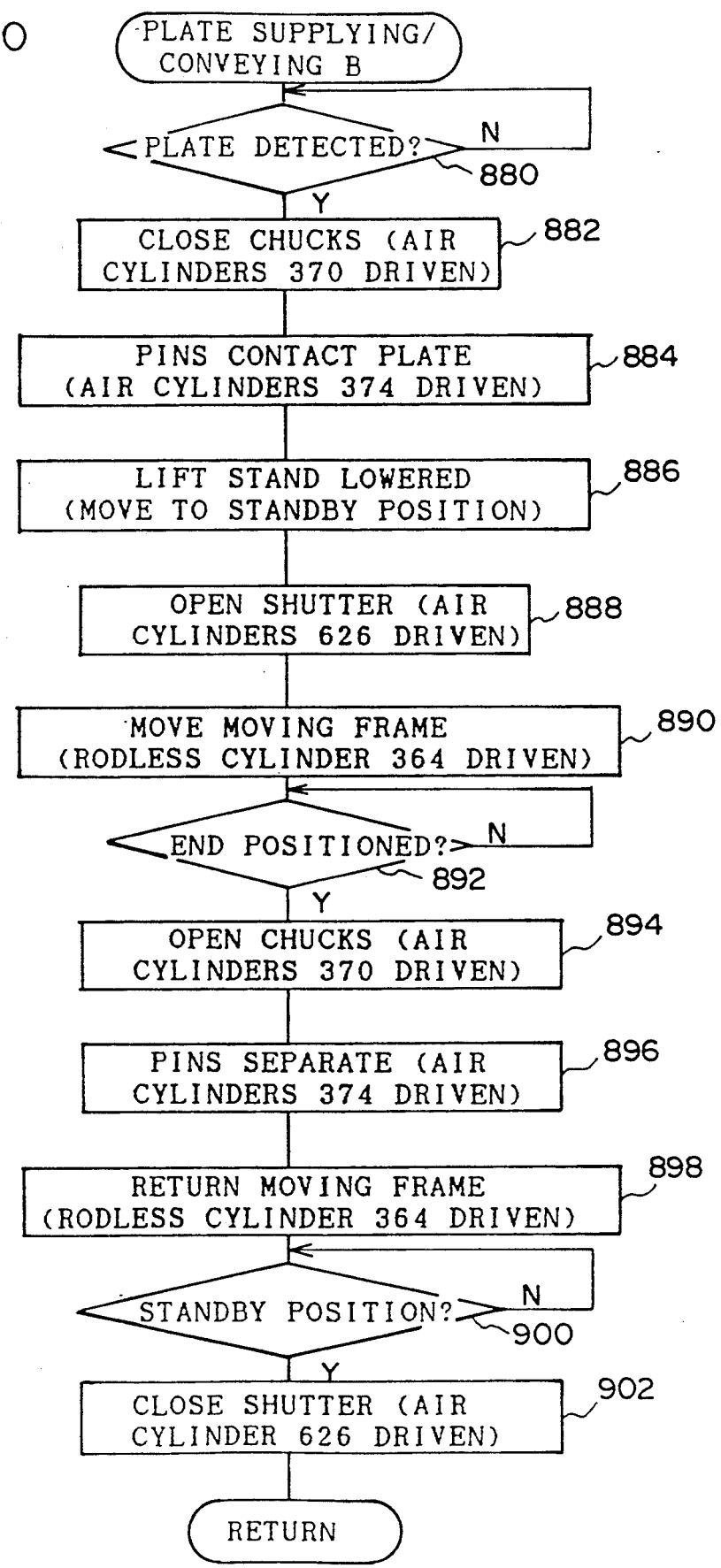
FIG. 30 is a flowchart illustrating operation of the horizontally conveying device.

As shown in FIG. 30, when it is determined in step 880 that the printing plate 20 opposes the moving frame 354 of the horizontally conveying device 106, in step 882, the air cylinders 370 are driven. The end portions of the claw portions 372 of the chucks 356 are inserted under the printing plate 20. Further, in step 884, the air cylinders 374 are driven, and the pins 376 are made to oppose the transverse direction end portions of the printing plate 20.

Thereafter, in step 886, the motor 312 is driven, and the lift stand 300 is lowered to its lower standby position. In this way, the bottom surface of the printing plate 20 loaded on the lift stand 300 is supported by the claw portions 372 of the chucks 356. The printing plate 20 is thereby transferred from the lift stand 300 to the moving frame 354 of the horizontally conveying device 106.

In subsequent step 888, the air cylinder 626 is driven, and the shutter 618 between the plate supplying portion 12 and the drawing portion 18 is opened. The plate supplying portion 12 and the drawing portion 18, which had been shaded by the shutter 618, are now communicated. In this way, the moving plate 354 can be inserted from the plate supplying portion 12 into the drawing portion 18.

When the shutter 618 is opened, the rodless cylinder 364 is driven, and the moving frame 354 holding the printing plate 20 is inserted into the drawing portion 18 (step 890). When the moving of the moving frame 354 onto the surface plate 408 of the drawing portion 18 is detected (step 892), the air cylinders 370 are driven, and the chucks 356 open (step 894). In this way, the printing plate 20 is dropped onto the surface plate 408, and the surface plate 408 is moved. At this time, because the pins 376 contact the transverse direction end portions of the printing plate 20, the printing plate 20 can be loaded onto the surface plate 408 at a predetermined position without the printing plate 20 being pulled by the moving of the claw portions 372.

When the printing plate 20 is moved onto the surface plate 408, the air cylinders 374 are driven, and the pins 376 move in directions of moving apart from each other (step 896). The rodless cylinder 364 is driven, and the moving frame 354 is returned to its standby position above the lift stand 300 of the plate supplying portion 12 (step 898).

When the return of the moving frame 354 to the standby position has been verified (step 900), the air cylinder 626 is driven, and the shutter 618 is closed (step 902). Accordingly, the plate supplying portion 12 and the drawing portion 18 are shaded.

Because the printing plate 20 is loaded on the surface plate 408 with the photosensitive surface facing upward, the lift stand 300 and horizontally conveying device 106 support the printing plate 20 at the bottom surface thereof. Further, the positioning of the printing plate 20 with respect to the lift stand 300 is effected by the pushing of the side surfaces of the printing plate 20. Accordingly, nothing contacts the photosensitive surface of the printing plate 20, and the photosensitive surface of the printing plate 20 can be held uniformly.

The positioning of the printing plate 20 with respect to the lift stand 300 is temporary positioning when the printing plate 20 is loaded on the surface plate 408. As a result, the printing plate 20 is sucked and conveyed by the suction cups 112, 140 of the sucking/raising device 102 and the suction cups 222 of the reversing device 104. Further, although the printing plate 20 is reversed at the reversing device 104, the printing plate 20 can be loaded on the surface plate 408 without error.

In step 808 of the main routine, drawing processing is effected by the drawing device 406 for the printing plate 20 loaded on the surface plate 408, and an electrostatic latent image is formed on the printing plate 20. The printing plate 20 on which the electrostatic latent image is formed is removed from the drawing portion 18 (step 810).

Figure 31:
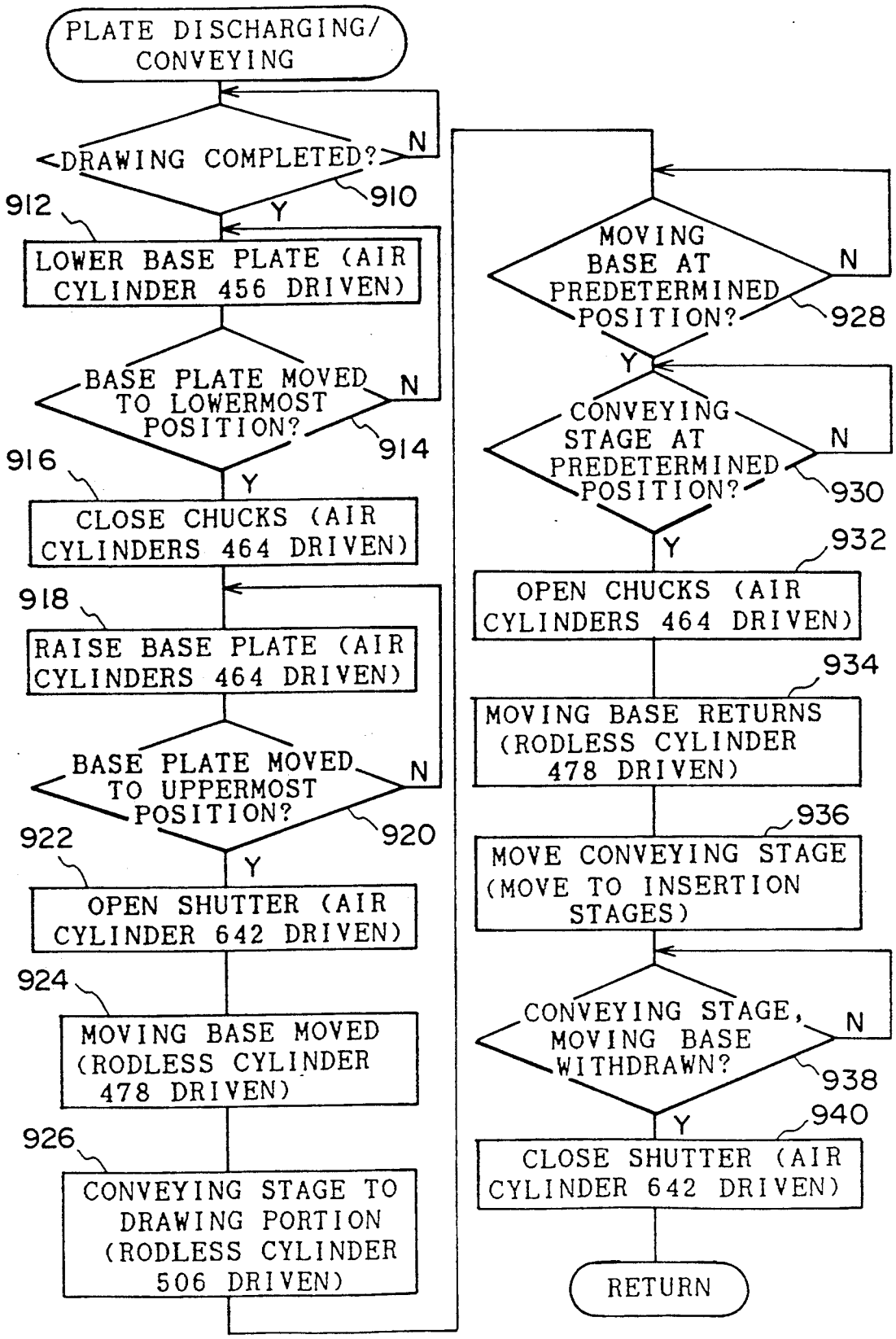
FIG. 31 is a flowchart illustrating operation of the removing device and a plate discharging device.

As shown in FIG. 31, when it is determined in step 910 that the drawing processing has been completed and the surface plate 408 has returned to a predetermined position, the routine proceeds to step 912 where the air cylinder 456 is driven and the base plate 454 is lowered. At this time, the claw portions 466 of the chucks 462 of the base plate 454 are moved apart from each other. When it is determined that the base plate 454 has been lowered to its lowest position (step 914), the air cylinders 464 of the chucks 462 are driven, and the claw portions 466 are closed (step 916).

When the base plate 454 is lowered to its lowest position, the ends of the claw portions 466 oppose the notches 422. By the driving of the air cylinders 464, the ends of the claw portions 466 are inserted under the printing plate 20 on the surface plate 408.

In step 918, the air cylinders 464 are driven, and the base plate 454 is raised. The printing plate 20 is lifted from the surface plate 408. When it is determined in step 920 that the base plate 454 has moved to its uppermost position, the air cylinder 642 of the shutter 636 is driven, and the shutter 636 is opened (step 922). In this way, the drawing portion 18 and the plate discharging portion 14, which had been shaded by the shutter 636, are now communicated.

In step 924, the moving base 452 supporting the base plate 454 moves toward the plate discharging portion 14, and a portion of the base plate 454 is inserted into the plate discharge opening 632. Further, the conveying stage 502 provided in the plate discharging portion 14 is inserted into the plate discharge opening 632 by the driving of the rodless cylinder 506 (step 926). In steps 928 and 930, determinations are made as to whether the moving base 452 and the conveying stage 502, respectively, have moved to predetermined positions. In this way, the conveying stage 502 is positioned below the base plate 454.

In step 932, the chucks 462 of the base plate 454 open. The printing plate 20 supported by the claw portions 466 of the chucks 462 of the base plate 454 is thereby dropped on the conveying stage 502. Thereafter, the moving base 452 returns to its standby position above the surface plate 408 (step 934). The conveying stage 502 is moved above the insertion stages 532 by the driving of the rodless cylinder 506 (step 936).

When it is verified that the base plate 454 and the conveying stage 502 have been moved to predetermined positions (step 938), the air cylinder 642 is driven, and the shutter 632 is closed (step 940). The drawing portion 18 and the plate discharging portion 14 are shaded.

In step 812 of the main routine, the printing plate 20 removed from the drawing portion 18 is sent to the developing portion 22 by the insertion device 530.

Figure 32:
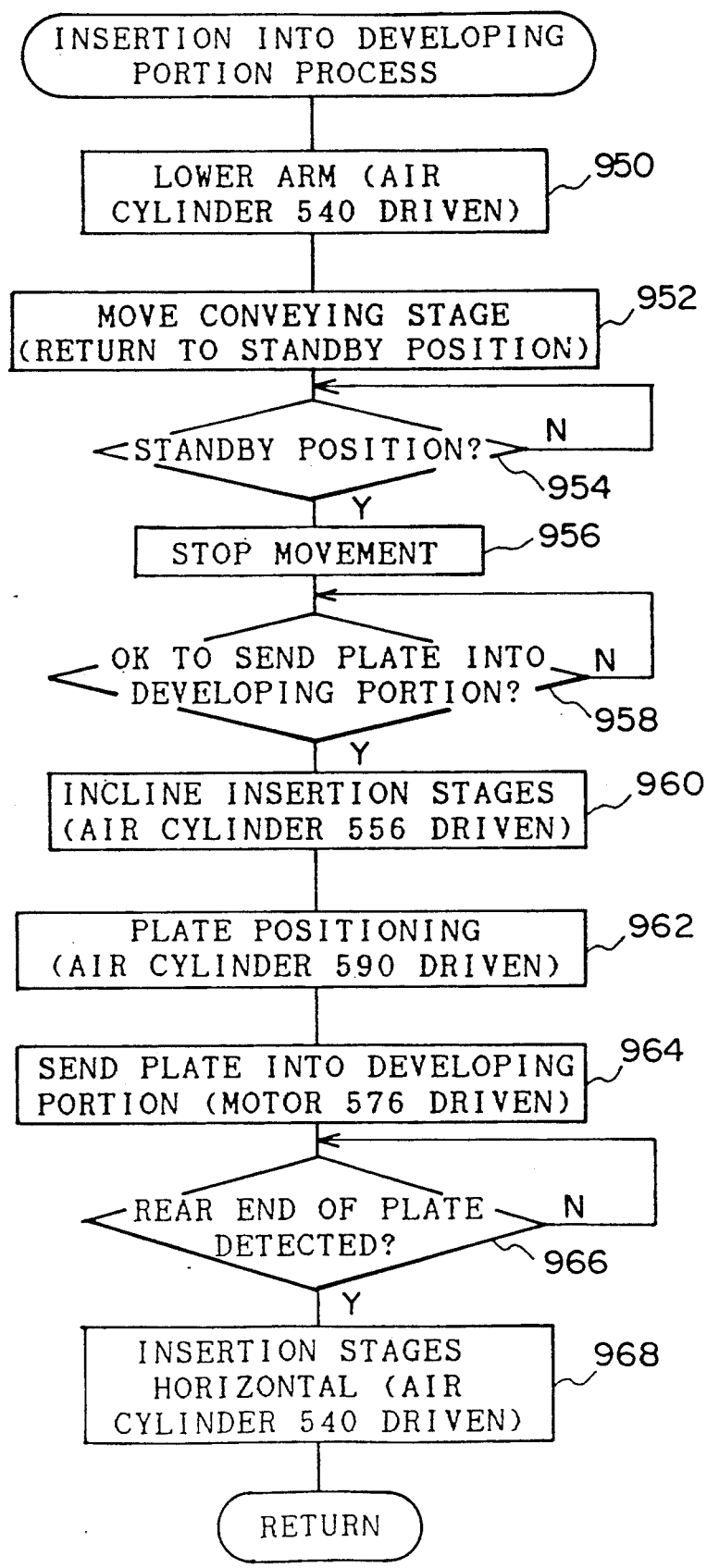
FIG. 32 is a flowchart illustrating operation of an insertion device.

As shown in FIG. 32, in step 950, in the plate discharging portion 14, the air cylinder 540 is driven, and the arm 544 on which the pawls 548 are provided is lowered. In this way, the pawls 548 oppose the transverse direction end portions of the printing plate loaded on the conveying stage 502. In step 952, the rodless cylinder 506 is driven, and the conveying stage 502 is moved toward the drawing portion 18 side of the insertion stages 532. The conveying stage 502 is returned to the standby position (steps 954, 956).

When the conveying stage 502 is moved, the pawls 548 abut the end portions of the printing plate 20. Therefore, the printing plate 20 is prevented from moving with the conveying stage 502. The printing plate 20 is pushed off of the conveying stage 502 and is dropped and loaded on the insertion stages 532 positioned below the conveying stage 502.

In step 958, a determination is made as to whether the printing plate 20 may be sent into the developing portion 22. The process stands by until the printing plate 20 can be sent into the developing portion 22.

When the printing plate 20 can be sent into the developing portion 22, in step 960, the air cylinder 556 is driven, and the insertion stages 532 are inclined. The angle of inclination of the insertion stages 532 is the same as the insertion angle of the transport path in the vicinity of the insertion opening of the developing portion 22. Thereafter, the air cylinder 590 is driven, and the rollers 588 are moved parallel so as to face the opposing rollers 584 (step 962). Accordingly, a transverse end portion of the printing plate 20 loaded on the inclined insertion stages 532 is pushed by the rollers 588 towards the rollers 584, and the printing plate 20 abuts the rollers 584. The printing plate 20 is thereby positioned to enter the developing portion 22.

When the printing plate 20 is positioned, in step 964 the motor 576 is driven. By the driving of the motor 576, the pushing blocks 572 provided on the chain 568 move and push a longitudinal end portion of the printing plate 20 towards the developing portion 22. Due to this movement, the printing plate 20 is guided by the insertion stages 532 which are inclined at predetermined angles and by the fixed guides 562, and is sent into the developing portion 22. At this time, the transverse sides of the printing plate 20 are guided by the rollers 584, 588.

In step 966, when the microswitch 571 detects the pushing block 976, the air cylinder 540 is driven, and the insertion stages 532 are returned to their horizontal standby position (step 968). The sending of the printing plate 20 into the developing portion 22 is thereby completed.

These operations are repeated in the plate supplying-/discharging portion 16 so that the printing plates 20 are continuously supplied to the drawing portion 18. The printing plates 20 on which electrostatic latent images are formed by the drawing device 406 are removed and sent to the developing portion 22.

In the developing processing portion 24, a toner image which corresponds to the electrostatic latent image is formed on the printing plate 20 sent into the developing portion 22. In the fixing processing portion 26, toner particles are heated and are fixed to the surface of the printing plate 20. Thereafter, the surface of the printing plate 20 is protected. In the punching portion 32 and the plate bending portion 34, notches and circular holes are formed and the plate is bent for loading at the rotary press. The printing plate 20 is then stored.

Either the surface opposite the photosensitive surface or the transverse direction end surfaces of the printing plate 20, which has been charged and on which an electrostatic latent image has been formed in the drawing device 18, are supported as the printing plate 20 is conveyed. Further, conductive members formed of metal or the like do not directly contact the printing plate 20. As a result, the charges of the printing plate 20 are not discharged, and a predetermined toner image can be formed in the developing portions 22 without traces of contact due to conveying being formed on the photosensitive surface of the printing plate 20.

Further, when the printing plate 20 is sent into the developing portion 22, the insertion stages 532 are inclined along the transport path in the vicinity of the insertion opening of the developing portion 22. Therefore, the printing plate 20 sent into the developing portion 22 is not bent unreasonably, and the toner particles can be applied evenly to the photosensitive surface of the printing plate 20.

The drawing portion 18 and the plate supplying/discharging portion 16 are shaded by the shutters 618, 636. When the printing plate 20 is being supplied or removed, the shutters 618, 636 are opened and then closed. As a result, when the plate supplying/discharging portion 16 is being serviced or the like, light does not enter into the drawing portion 18 unnecessarily.

In the present embodiment, the sensor 336B is disposed in a vicinity of the printing plate receiving position. By directly detecting the lift stand 300, it can be determined whether the lift stand 300 has reached the printing plate receiving position. However, a structure may be used in which the amount of time necessary for the lift stand 300 to move from the standby position to the printing plate receiving position is measured in advance. By determining whether the time which has elapsed from the start of the raising of the lift stand 300 has reached the predetermined time, it can be determined whether the lift stand 300 has reached the printing plate receiving position.

What is claimed is:

1. A photosensitive lithographic printing plate supplying apparatus, comprising:

first suction means, disposed above photosensitive lithographic printing plates which are stacked with photosensitive surfaces thereof facing downward, for sucking an upper surface of a photosensitive lithographic printing plate which said first suction means opposes and raising said photosensitive lithographic printing plate;

second suction means for sucking the upper surface of said photosensitive lithographic printing plate raised by said first suction means, so as to support said photosensitive lithographic printing plate at one end thereof, and for receiving said photosensitive lithographic printing plate from said first suction means while holding said photosensitive lithographic printing plate raised; and reversing means for rotating said held photosensitive lithographic printing plate so that said photosensitive surface thereof faces upward, wherein said reversing means rotates said second suction means so as to rotate said photosensitive lithographic printing plate.

2. A photosensitive lithographic printing plate supplying apparatus according to claim 1, further comprising separating means for separating another photosensitive lithographic printing plate adhering to a bottom surface of said photosensitive lithographic printing plate sucked by said first suction means.

3. A photosensitive lithographic printing plate supplying apparatus according to claim 2, wherein said separating means includes a means for bending down the end portions of said photosensitive lithographic printing plate by raising some of said first suction means which are positioned in the vicinity of an end portion of said photosensitive lithographic printing plate.

4. A photosensitive lithographic printing plate supplying apparatus according to claim 3, wherein said separating means includes an air blowing means for blowing air to rear surfaces of the vicinities of end portions of said photosensitive lithographic printing plate lifted by said lifting means.

5. A photosensitive lithographic printing plate supplying apparatus according to claim 1, wherein an organic, photoconductive, photosensitive layer is formed on said photosensitive surface of said photosensitive lithographic printing plate.

6. A photosensitive lithographic printing plate supplying apparatus according to claim 1, further comprising:
a lift stand, operative for up and down movement in a substantially vertical plane, on which said photosensitive lithographic printing plate which has been rotated by said reversing means such that said photosensitive surface of said photosensitive lithographic printing plate faces upward is loaded;
a supporting means which is provided out of a locus of said photosensitive lithographic printing plate when lifted by said lift stand and which is movable under said photosensitive lithographic printing plate after said photosensitive printing plate is lifted above for engaging end portions of said photosensitive printing plate, such that said photosensitive lithographic printing plate is horizontally supported, due to relative movement between said supporting means and said lift stand when said supporting means is positioned under said photosensitive lithographic printing plate;
operating means for moving said supporting means under said photosensitive lithographic printing plate; and
moving means for moving said supporting means horizontally while said photosensitive lithographic printing plate is supported by said supporting means.

7. A photosensitive lithographic printing plate supplying apparatus according to claim 6, wherein said supporting means includes claw portions protruding horizontally, ends of said claw portions being movable under said photosensitive lithographic printing plate by operation of said operating means and supporting said photosensitive lithographic printing plate.

8. A photosensitive lithographic printing plate supplying apparatus according to claim 7, wherein said supporting means includes a regulating member abuttable on an end surface of said photosensitive lithographic printing plate, said regulating member regulating movement of said photosensitive lithographic printing plate supported by said claw portions.

9. A photosensitive lithographic printing plate supplying apparatus according to claim 1, wherein said photosensitive lithographic printing plate is formed by a photoconductive, photosensitive layer and a conductive supporting base.

10. A printing plate conveying device comprising:
a lift stand, operative for up and down movement in a substantially vertical plane, on which a photosensitive lithographic printing plate is loaded such that a photosensitive surface thereof faces upward;
a supporting means which is provided out of a locus of said photosensitive lithographic printing plate when lifted by said lift stand and which is movable under said photosensitive lithographic printing plate which is lifted by said lift stand, said supporting means engaging end portions of said photosensitive printing plate, such that said photosensitive lithographic printing plate is horizontally supported, due to relative movement between said supporting means and said lift stand when said supporting means is positioned under said photosensitive lithographic printing plate;
operating means for moving said supporting means under said photosensitive lithographic printing plate; and
moving means for moving said supporting means horizontally while said photosensitive lithographic printing plate is supported by said supporting means, in order to send said photosensitive lithographic printing plate to an exposure portion.

11. A printing plate conveying device according to claim 10, wherein said supporting means includes claw portions protruding horizontally, ends of said claw portions being moved under said photosensitive lithographic printing plate by operation of said operating means and supporting said photosensitive lithographic printing plate.

12. A printing plate conveying device according to claim 11, wherein said supporting means includes a regulating member abuttable on an end surface of said photosensitive lithographic printing plate, said regulating member regulating movement of said photosensitive lithographic printing plate supported by said claw portions.

13. A printing plate conveying device according to claim 10, wherein said photosensitive lithographic printing plate is formed by a photoconductive, photosensitive layer and a conductive supporting body.

14. A printing plate conveying device comprising:
a lift stand on which a photosensitive lithographic printing plate is loaded such that a photosensitive surface thereof faces upward;
a supporting means which is provided out of a locus of said photosensitive lithographic printing plate when lifted by said lift stand and which is movable under said photosensitive lithographic printing plate which is lifted by said lift stand, said supporting means engaging end portions of said photosensitive printing plate, such that said photosensitive lithographic printing plate is horizontally supported, due to relative movement between said supporting means and said lift stand when said supporting means is positioned under said photosensitive lithographic printing plate;
operating means for moving said supporting means under said photosensitive lithographic printing plate; and moving means for moving said supporting means horizontally while said photosensitive lithographic printing plate is supported by said supporting means, in order to send said photosensitive lithographic printing plate to an exposure portion, wherein said supporting means includes claw portions protruding horizontally, ends of said claw portions being moved under said photosensitive lithographic printing plate by operation of said operating means and supporting said photosensitive lithographic printing plate.

15. A photosensitive lithographic printing plate reversing device comprising:

supporting means for supporting one side end of a photosensitive lithographic printing plate whose photosensitive surface faces downward;

rotating means for rotating said supporting means and said photosensitive lithographic printing plate, one side end of which is supported by said supporting means, around a vicinity of said one side end;

a lift stand able to be raised and lowered so as to pass through a range of movement of said photosensitive lithographic printing plate when said supporting means and said photosensitive lithographic printing plate are rotated around the vicinity of said one side end;

driving means for raising and lowering said lift stand;

detecting means for detecting whether said lift stand has reached a predetermined height; and control means for controlling said rotating means to rotate and reverse said photosensitive lithographic printing plate so that said photosensitive surface of said photosensitive lithographic printing plate faces upward, and for controlling said driving means to raise said lift stand from a position beneath said range of movement and controlling said supporting means to cancel the supporting of said photosensitive lithographic printing plate by said supporting means when said detecting means detects that said lift stand has reached a predetermined height.

16. A photosensitive lithographic printing plate reversing device according to claim 15, wherein said detecting means is a sensor which is disposed in a vicinity of a position corresponding to said predetermined height in a range of movement of said lift stand and which detects the existence of said lift stand at the position corresponding to said predetermined height.

17. A photosensitive lithographic printing plate reversing device according to claim 15, wherein said supporting means includes suction means for sucking an upper surface of said photosensitive lithographic printing plate and for supporting said photosensitive lithographic printing plate.

18. A photosensitive lithographic printing plate supplying apparatus, comprising:

first suction means, disposed above photosensitive lithographic printing plates which are stacked with photosensitive surfaces thereof facing downward, for sucking an upper surface of a photosensitive lithographic printing plate which said first suction means opposes and raising said photosensitive lithographic printing plate;

second suction means for sucking the upper surface of said photosensitive lithographic printing plate raised by said first suction means, so as to support said photosensitive lithographic printing plate at one end thereof, and for receiving said photosensitive lithographic printing plate from said first suction means while holding said photosensitive lithographic printing plate raised;

reversing means for rotating said held photosensitive lithographic printing plate so that said photosensitive surface thereof faces upward;

a lift stand on which said photosensitive lithographic printing plate which has been rotated by said reversing means such that said photosensitive surface of said photosensitive lithographic printing plate faces upward is loaded;

a supporting means which is provided out of a locus of said photosensitive lithographic printing plate when lifted by said lift stand and which is movable under said photosensitive lithographic printing plate after said photosensitive printing plate is lifted above for engaging end portions of said photosensitive printing plate, such that said photosensitive lithographic printing plate is horizontally supported, due to relative movement between said supporting means and said lift stand when said supporting means is positioned under said photosensitive lithographic printing plate;

operating means for moving said supporting means under said photosensitive lithographic printing plate; and moving means for moving said supporting means horizontally while said photosensitive lithographic printing plate is supported by said supporting means, wherein said supporting means includes claw portions protruding horizontally, ends of said claw portions being movable under said photosensitive lithographic printing plate by operation of said operating means and supporting said photosensitive lithographic printing plate.

* * * * *